US010276817B2

(12) United States Patent
Forrest et al.

(10) Patent No.: US 10,276,817 B2
(45) Date of Patent: Apr. 30, 2019

(54) STABLE ORGANIC PHOTOSENSITIVE DEVICES WITH EXCITON-BLOCKING CHARGE CARRIER FILTERS UTILIZING HIGH GLASS TRANSITION TEMPERATURE MATERIALS

(71) Applicants: The Regents of the University of Michigan, Ann Arbor, MI (US); University of Southern California, Los Angeles, CA (US)

(72) Inventors: Stephen R. Forrest, Ann Arbor, MI (US); Quinn Burlingame, Ann Arbor, MI (US); Xin Xiao, Ann Arbor, MI (US); Kevin Bergemann, Ann Arbor, MI (US); Anurag Panda, Ann Arbor, MI (US); Jeramy D. Zimmerman, Golden, CO (US); Brian E. Lassiter, San Francisco, CA (US); Mark E. Thompson, Anaheim, CA (US); Andrew N. Bartynski, Los Angeles, CA (US); Cong Trinh, San Jose, CA (US)

(73) Assignees: University of Southern California, Los Angeles, CA (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/803,643

(22) Filed: Jul. 20, 2015

(65) Prior Publication Data

US 2016/0020418 A1 Jan. 21, 2016

Related U.S. Application Data

(63) Continuation-in-part of application No. PCT/US2014/062351, filed on Oct. 27, 2014, and a
(Continued)

(51) Int. Cl.
*H01L 51/42* (2006.01)
*H01L 51/44* (2006.01)
*H01L 51/00* (2006.01)

(52) U.S. Cl.
CPC ...... *H01L 51/4273* (2013.01); *H01L 51/4246* (2013.01); *H01L 51/006* (2013.01);
(Continued)

(58) Field of Classification Search
CPC ... H01L 51/424; H01L 51/44; H01L 51/0072; H01L 51/0058; H01L 51/0046;
(Continued)

(56) References Cited

U.S. PATENT DOCUMENTS 6,451,415 B1 9/2002 Forrest et al.
7,825,587 B2 11/2010 Xia
(Continued)

FOREIGN PATENT DOCUMENTS

JP 2002094085 3/2002
JP 2010021566 1/2010
(Continued)

OTHER PUBLICATIONS

Lin, Chi-Feng et al., "High Photoelectric Conversion Efficiency of Metal Phthalocyanine/Fullerene Heterojunction Photovaltic Device," *International Journal of Molecular Sciences*, 2011, 12, ISSN 1422-0067, www.mdpi.com/journal/ijms, pp. 476-505.
(Continued)

*Primary Examiner* — Caridad Everhart
(74) *Attorney, Agent, or Firm* — Finnegan, Henderson, Farabow, Garrett & Dunner, LLP

(57) ABSTRACT

Disclosed herein are stable organic photosensitive devices including at least one exciton-blocking charge carrier filter. The filters comprise a mixture of at least one wide energy gap material having a sufficiently high glass transition
(Continued)

temperature, e.g., higher than the temperature or temperature range at which the device typically operates, higher than a highest operating temperature of the device, higher than a threshold temperature value, etc. and at least one electron or hole conducting material. As described herein, the novel filters simultaneously block excitons and conduct the desired charge carrier (electrons or holes).

33 Claims, 40 Drawing Sheets

Related U.S. Application Data continuation-in-part of application No. PCT/US2014/033981, filed on Apr. 14, 2014.

(60) Provisional application No. 61/895,837, filed on Oct. 25, 2013, provisional application No. 61/924,577, filed on Jan. 7, 2014, provisional application No. 61/811,570, filed on Apr. 12, 2013, provisional application No. 61/871,452, filed on Aug. 29, 2013, provisional application No. 61/912,051, filed on Dec. 5, 2013, provisional application No. 62/026,301, filed on Jul. 18, 2014.

(52) U.S. Cl.
CPC ...... *H01L 51/0046* (2013.01); *H01L 51/0058* (2013.01); *H01L 51/0059* (2013.01); *H01L 51/0072* (2013.01); *H01L 51/0081* (2013.01); *H01L 2251/308* (2013.01); *Y02E 10/549* (2013.01)

(58) Field of Classification Search
CPC ............. H01L 51/0059; H01L 51/0078; H01L 2251/308; Y02E 10/549
USPC ......................................................... 257/102
See application file for complete search history.

(56) References Cited

U.S. PATENT DOCUMENTS

| | | | |
|---|---|---|---|
| 2003/0038287 A1* | 2/2003 | Suzuki ................ H01L 51/0011 257/40 |
| 2004/0027061 A1* | 2/2004 | Seo ..................... H01L 51/5096 313/504 |
| 2005/0110007 A1 | 5/2005 | Forrest et al. |
| 2005/0255334 A1 | 11/2005 | Kang et al. |
| 2006/0027801 A1 | 2/2006 | Forrest et al. |
| 2006/0027802 A1 | 2/2006 | Forrest et al. |
| 2006/0027834 A1 | 2/2006 | Forrest et al. |
| 2006/0138453 A1 | 6/2006 | Thompson et al. |
| 2006/0226770 A1 | 10/2006 | Lee et al. |
| 2007/0182321 A1* | 8/2007 | Kinoshita .............. C09K 11/06 313/506 |
| 2008/0054794 A1* | 3/2008 | Hatanaka ............... C09K 11/06 313/504 |
| 2008/0203406 A1* | 8/2008 | He ..................... H01L 51/0062 257/94 |
| 2008/0223445 A1* | 9/2008 | Marks et al. |
| 2009/0266418 A1* | 10/2009 | Hu ......................... B82Y 10/00 136/260 |
| 2009/0267060 A1 | 10/2009 | Forrest et al. |
| 2010/0224252 A1* | 9/2010 | Scharber .............. C08G 61/123 136/263 |
| 2010/0283039 A1* | 11/2010 | Meng ..................... B82Y 10/00 257/40 |
| 2011/0012091 A1 | 1/2011 | Forrest et al. |
| 2011/0259425 A1 | 10/2011 | Matsuura et al. |
| 2012/0098079 A1 | 4/2012 | Suzuki |
| 2012/0126213 A1* | 5/2012 | Gresser ............... H01L 51/0067 257/40 |
| 2012/0235125 A1 | 9/2012 | Forrest et al. |
| 2014/0001455 A1* | 1/2014 | Holmes ............... H01L 51/4246 257/40 |
| 2014/0306213 A1* | 10/2014 | Sato .................... H01L 51/5275 257/40 |
| 2016/0133879 A1* | 5/2016 | Wehlus ............ G02F 1/133365 257/40 |

FOREIGN PATENT DOCUMENTS

| | | |
|---|---|---|
| WO | WO 2002/101838 | 12/2002 |
| WO | WO 2010/134432 | 11/2010 |
| WO | WO 2011/136800 | 11/2011 |
| WO | WO 2012/161773 | 11/2012 |
| WO | WO 2014/169270 A2 | 10/2014 |
| WO | WO 2015/061772 A1 | 10/2014 |

OTHER PUBLICATIONS

Kim et al., "Organic-Organic Semiconductor Interfaces for Molecular Electronic Devices," Optoelectronic Devices and Properties, p. 18, Apr. 19, 2011.
International Search Report & Written Opinion, PCT/US2014/033981, dated Oct. 10, 2014.
Bertho, et al., "Effect of Temperature on the Morphological and Photovoltaic Stability of Bulk Heterojunction Polymer: Fullerene Solar Cells", Solar Energy Materials & Solar Cells 92 (2008) 753-760.
International Search Report, PCT/US2015/041114, dated Jun. 28, 2016.
Jan Meiss et al, "Highly efficient semitransparent tandem organic solar cells with complimentary absorber materials", Applied Physics Letters, vol. 99, No. 4, Jan. 1, 2011, p. 043301, XP055161384, ISSN: 003-6951, DOI: 10.1063/1.3610551.
Andrew N. Bartynski et al, "A fullerene-based organic exciton blocking layer with High electron conductivity", Nano Letters, vol. 13, No. 7, Jun. 10, 2013, pp. 3315-3320, XP055161506, ISSN: 1530-694, DOI 10.1021/nl401531t.
International Search Report, PCT/US2014/062351, dated Jan. 20, 2015.
Djurovich et al., *Measurement of the Lowest Unoccupied Molecular Orbital Energies of Molecular Organic Semiconductors*, Organic Electronics, vol. 10, No. 3, pp. 515-520 (May 1, 2009).
Uhrich et al., Origin of open circuit voltage in planar and bulk heterojunction organic thin-film photovoltaics depending on doped transport layers, J. App. Phys., vol. 104, No. 4, pp. 43107-1 to 43107-6 (2008).

* cited by examiner

Device A

| 140 | Electrode |
|---|---|
| 130 | Donor/Acceptor |
| 120 | Donor/Acceptor |
| 115 | Exciton-blocking electron/hole filter |
| 110 | Electrode |

(b)

Device B

| 140 | Electrode |
|---|---|
| 135 | Exciton-blocking electron/hole filter |
| 130 | Donor/Acceptor |
| 120 | Donor/Acceptor |
| 115 | Exciton-blocking electron/hole filter |
| 110 | Electrode |

Figure 3
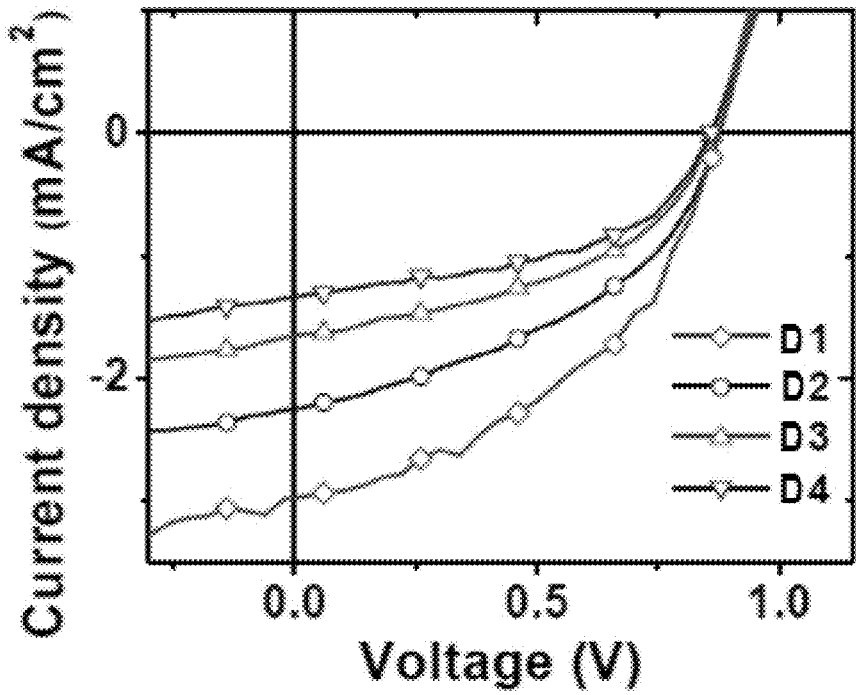
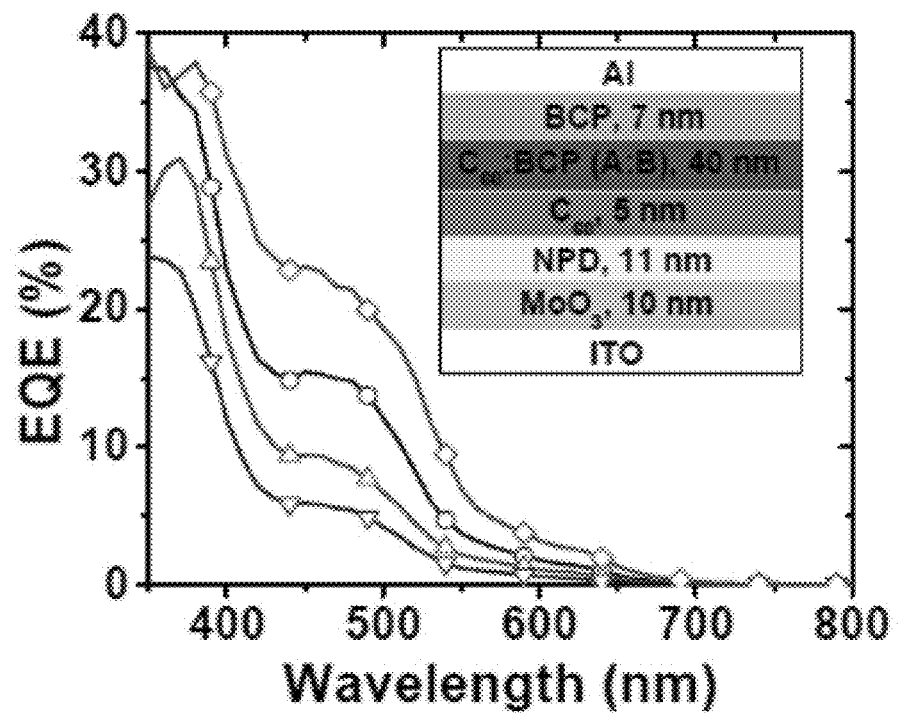

Figure 4
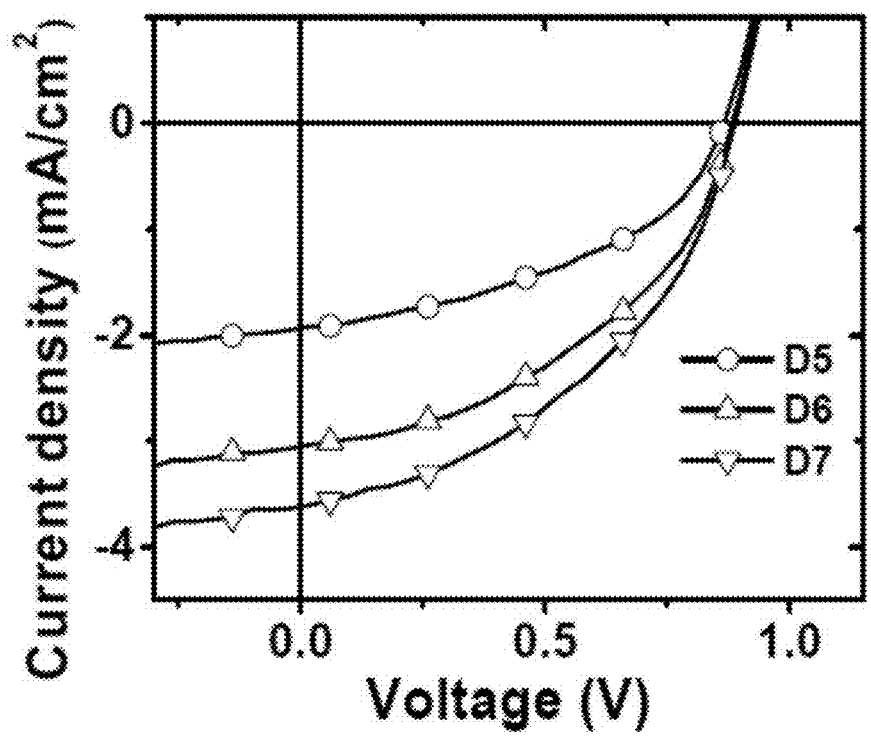
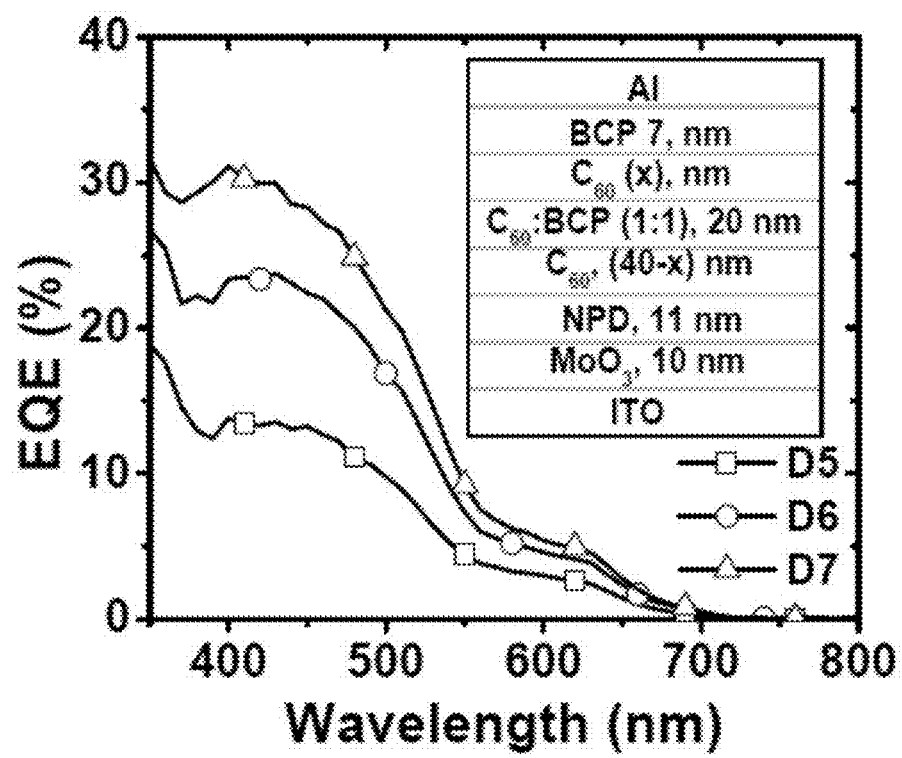

Figure 5
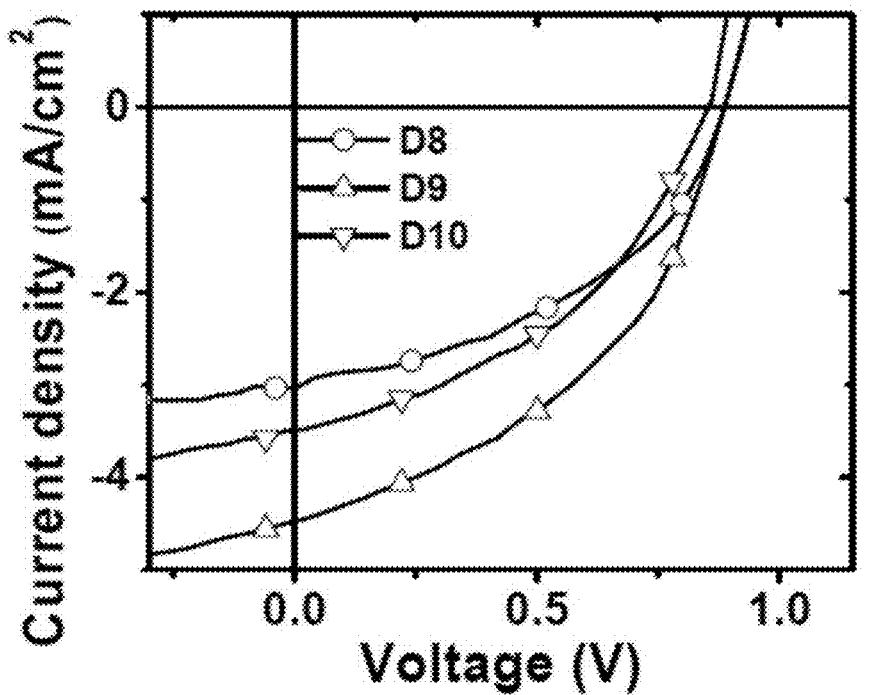
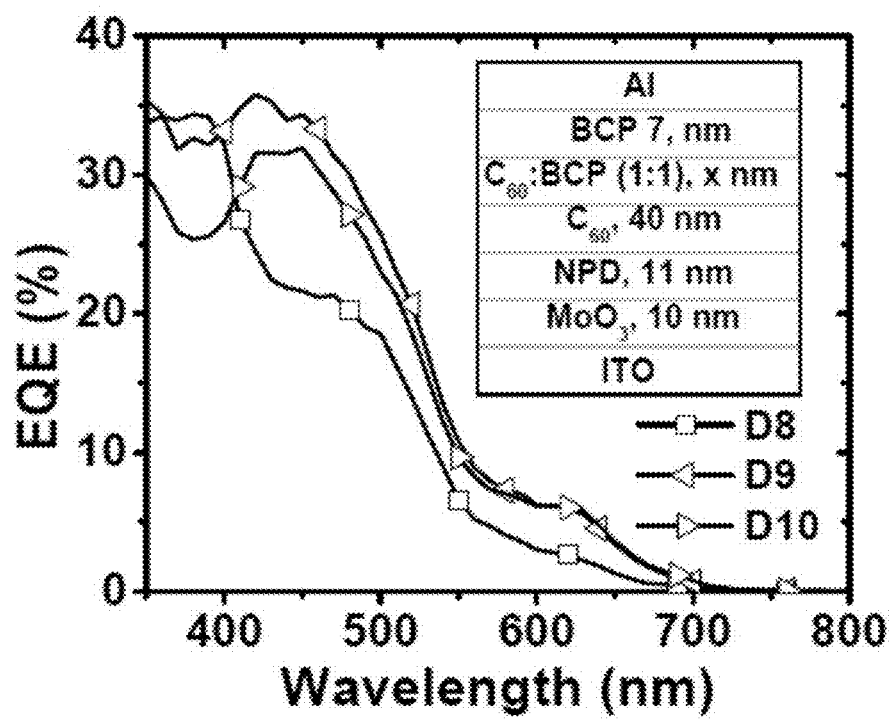

Figure 10
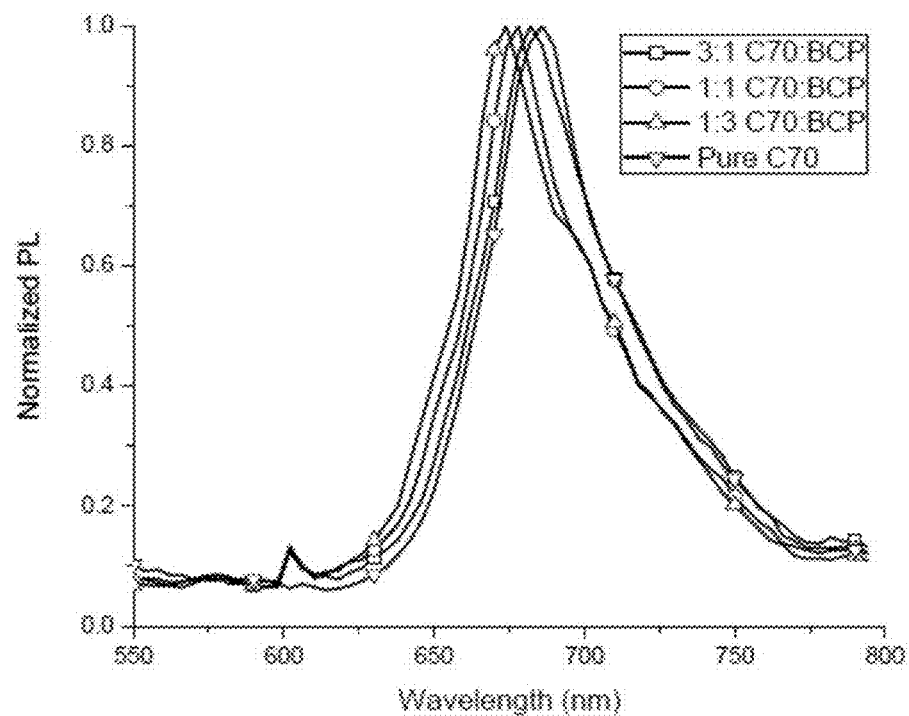
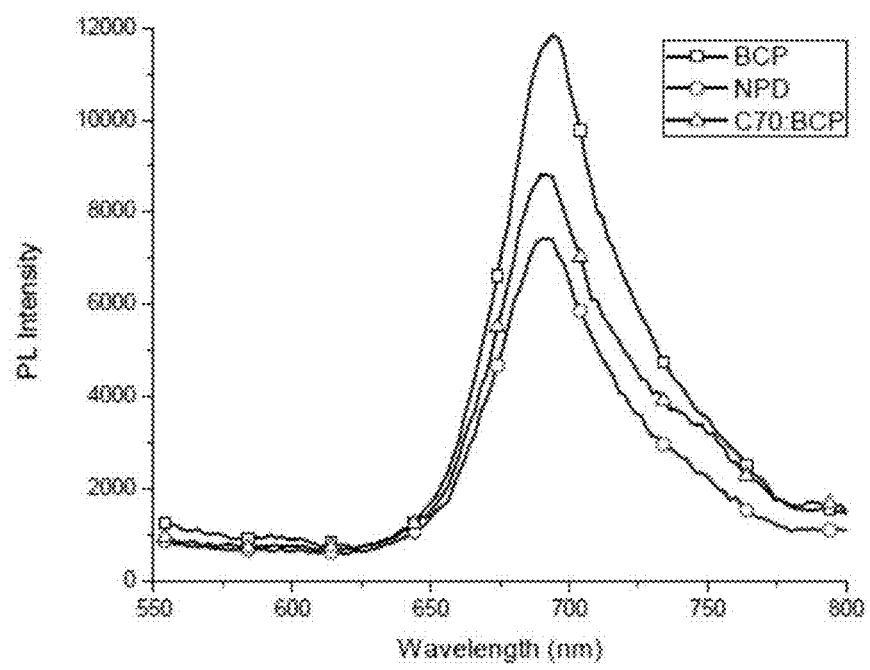

Figure 11
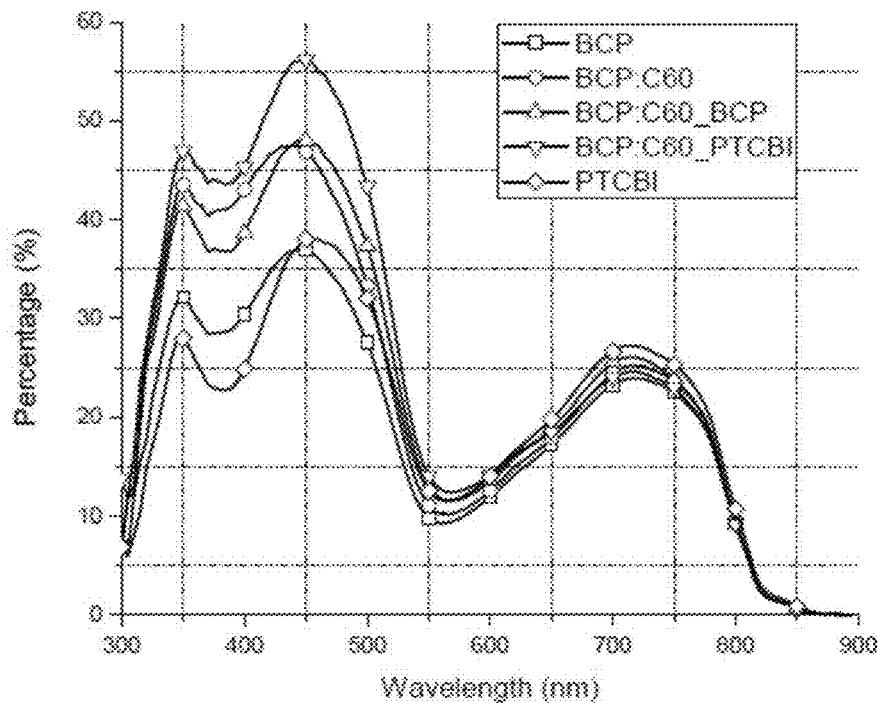
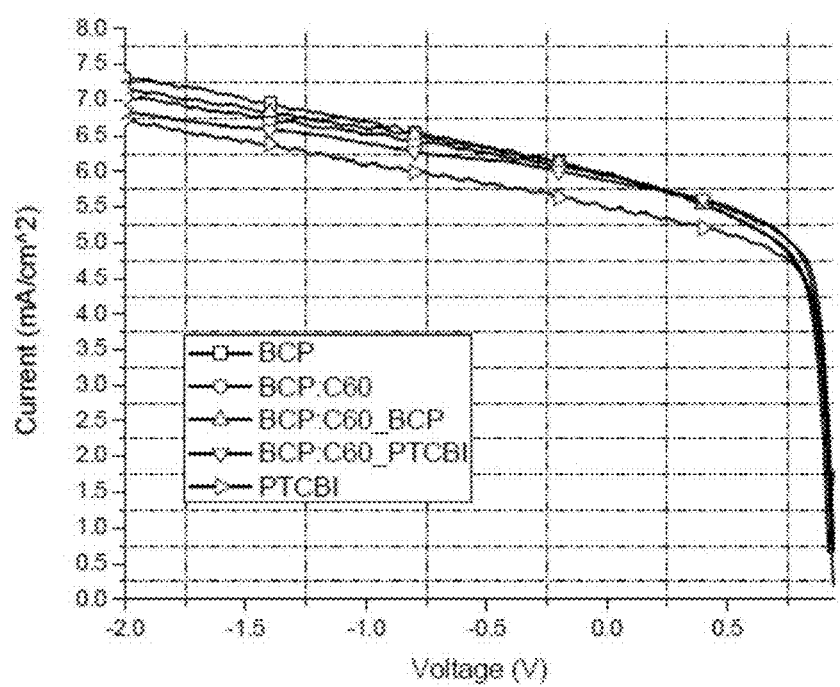

Figure 12
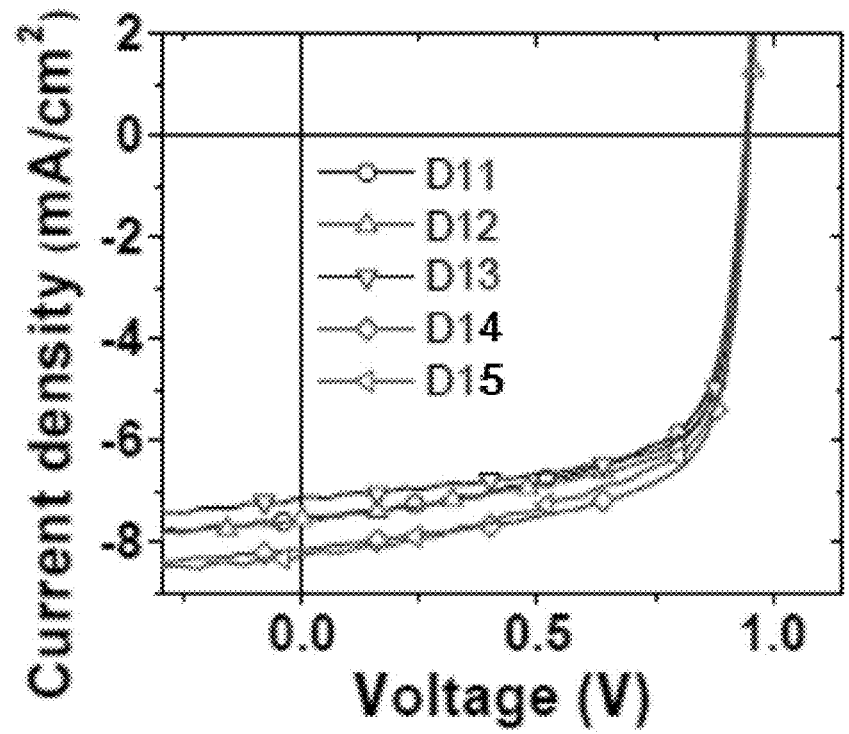
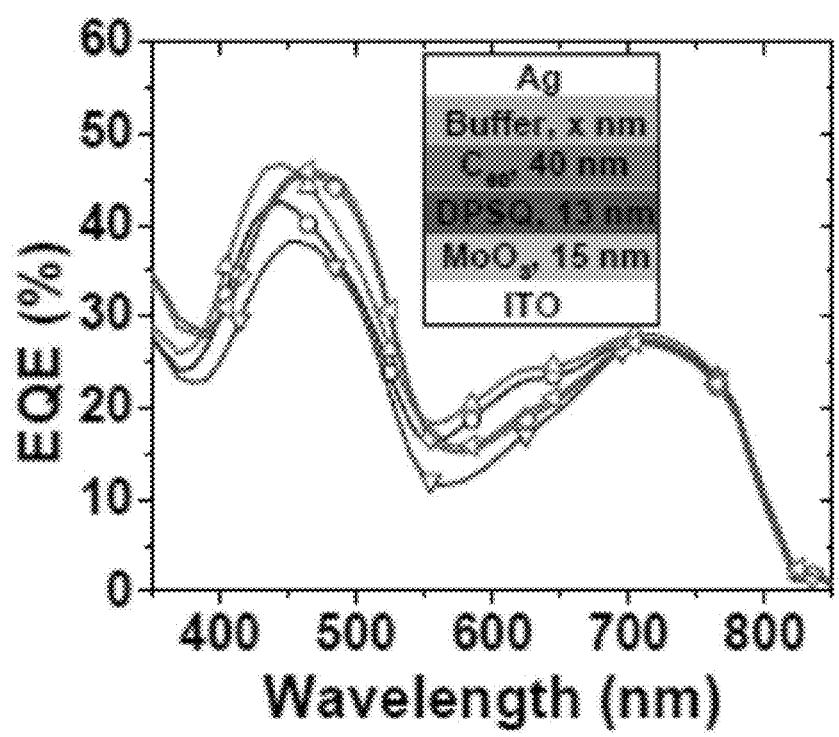

Figure 13
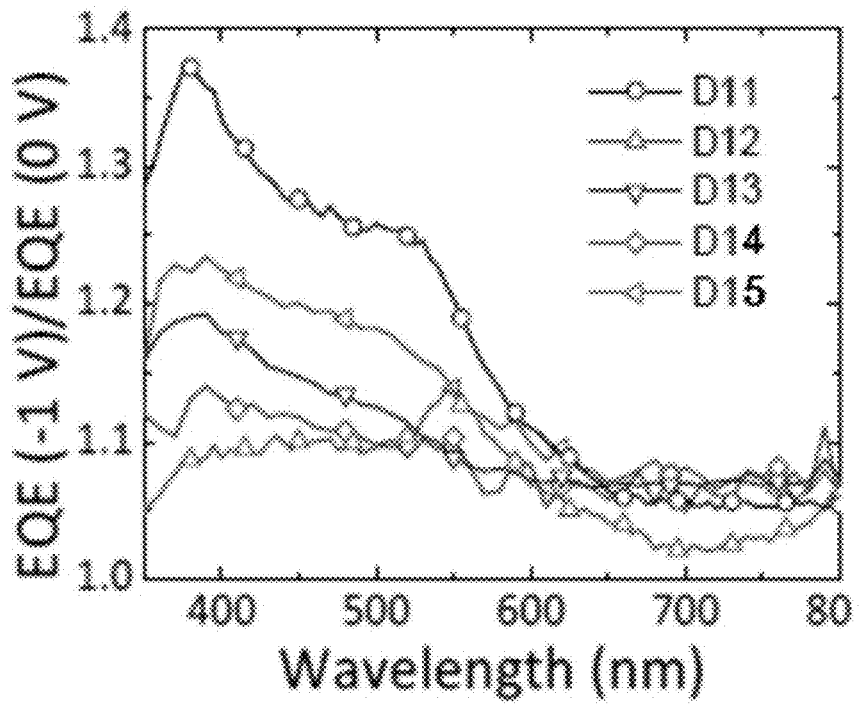
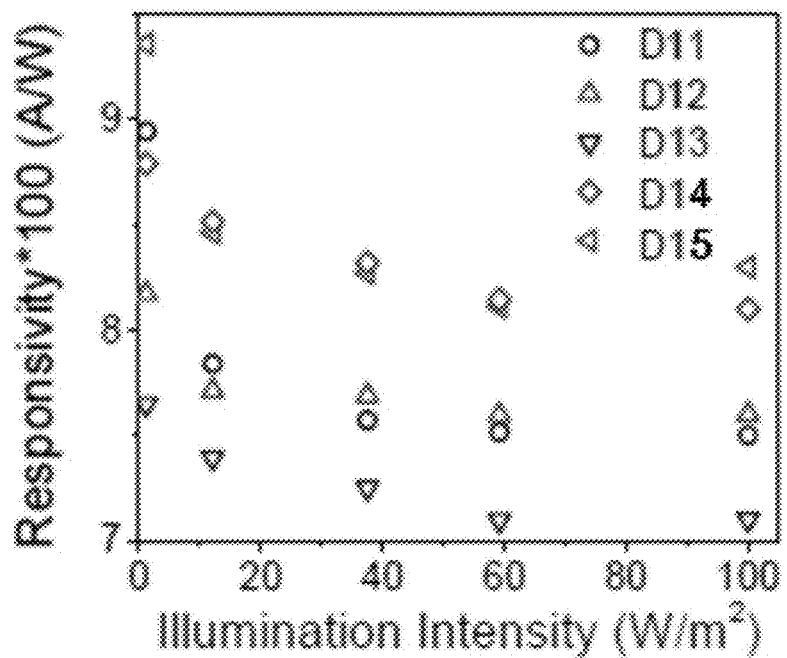

Figure 14
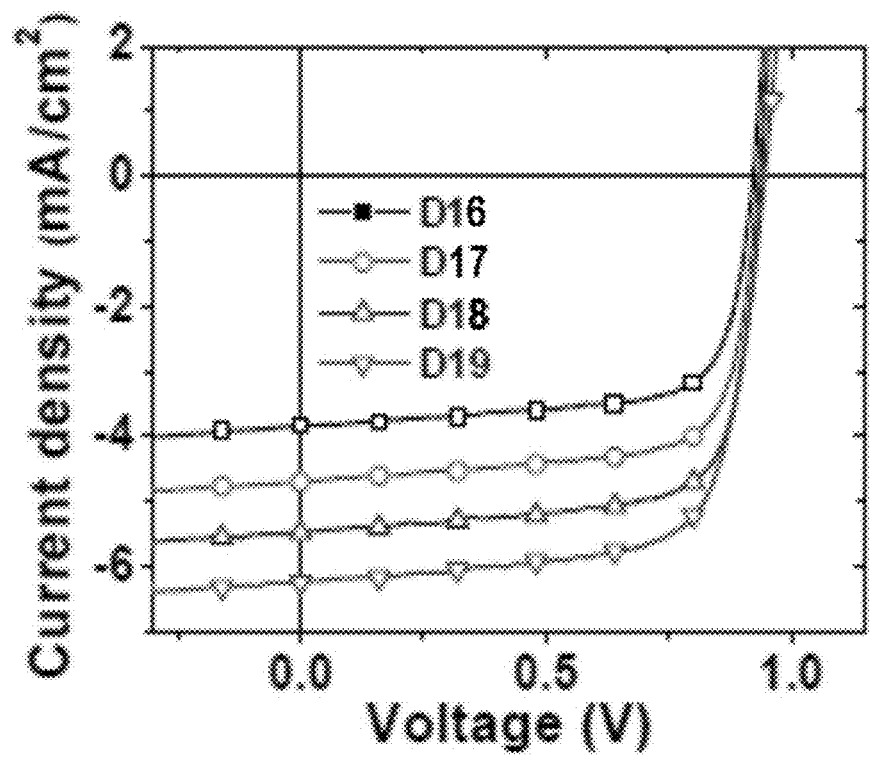
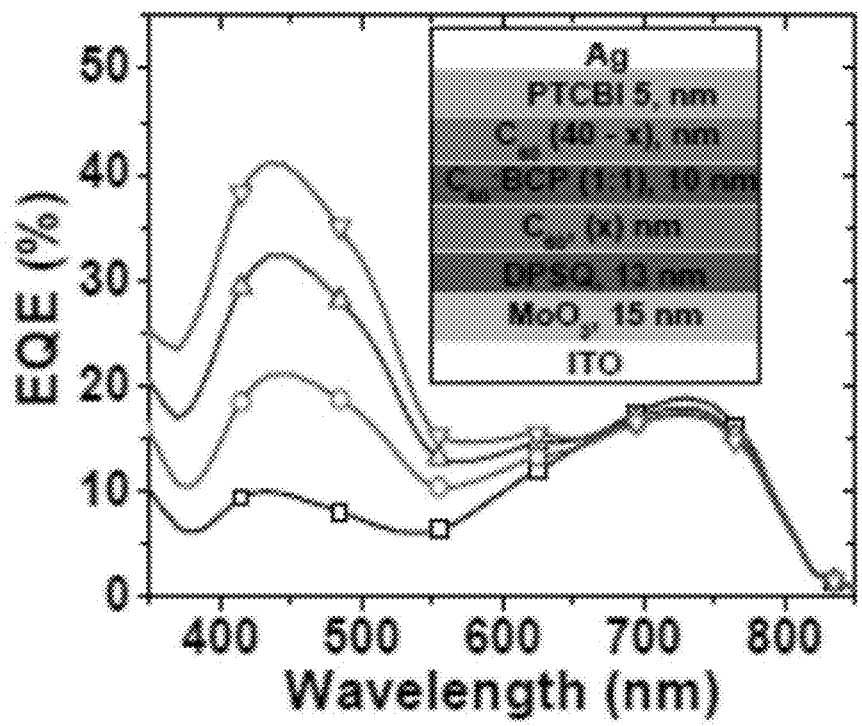

Figure 15
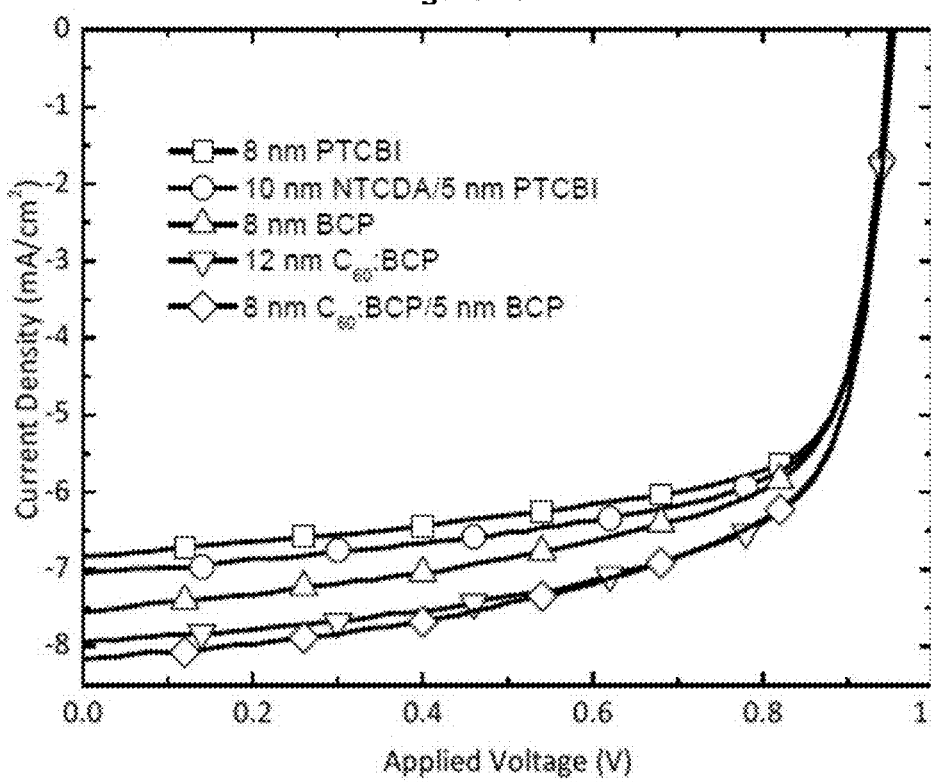
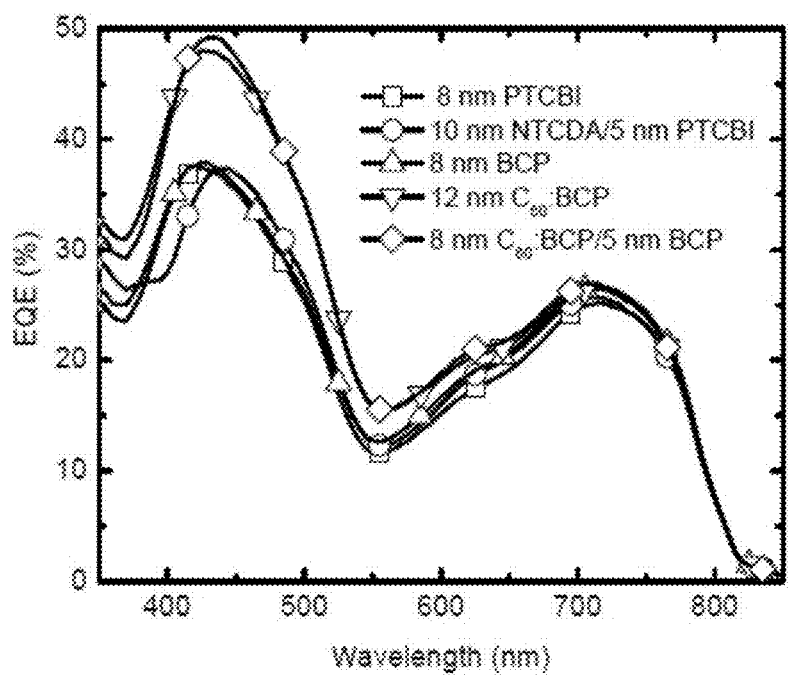

Figure 16
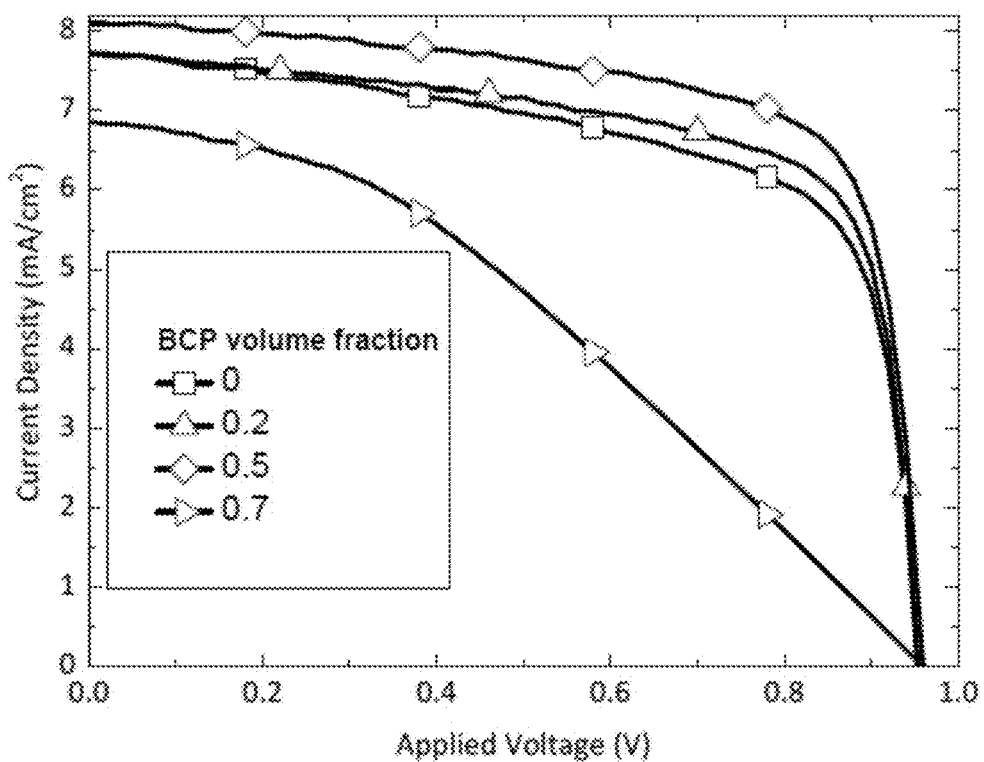
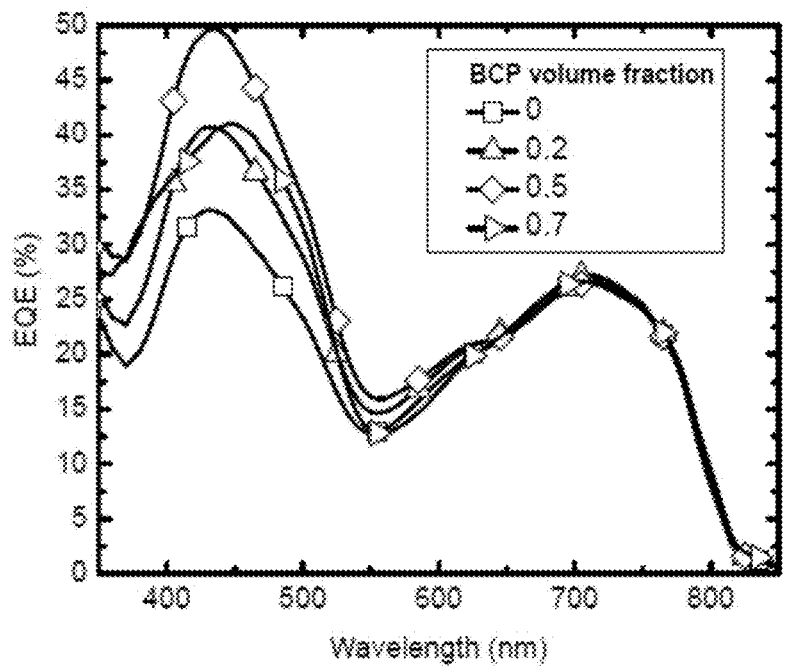

| Device: | $J_{SC}$ (mA/cm²) | $V_{oc}$ (V) | FF (%) | PCE* (%) |
|---|---|---|---|---|
| BPhen (5 nm) | 12.6 | 0.90 | 56 | 6.4 |
| BPhen:C₇₀ (1:1, 10 nm) | 12.4 | 0.90 | 57 | 6.3 |
| BPhen: C₇₀ (1:1, 10 nm) + BPhen (5 nm) | 12.2 | 0.90 | 61 | 6.7 |
| BPhen: C₇₀ (1:1, 10 nm) + PTCBI (5 nm) | 12.2 | 0.90 | 60 | 6.6 |

| Devices | Responsivity ($10^{-2}$ A/W) | $V_{oc}$ (V) | FF (%) | PCE* (%) |
|---|---|---|---|---|
| BCP (7 nm) | 9.1 | 0.87 | 61 | 4.9 |
| BCP:C$_{70}$ (1:1, 10 nm) + BCP (7 nm) | 9.9 | 0.88 | 68 | 6.0 |
| BCP:C$_{70}$ (1:1, 20 nm) + BCP (7 nm) | 9.9 | 0.89 | 67 | 6.0 |

Figure 28
(a)
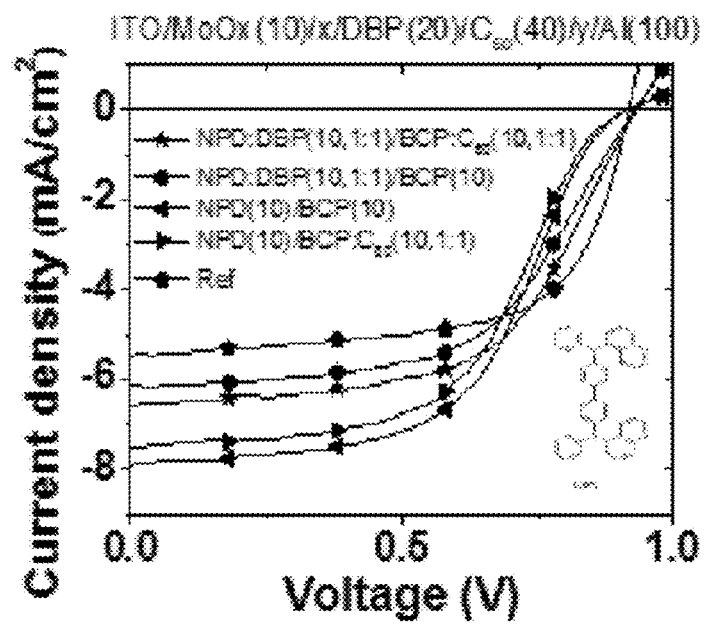
(b)
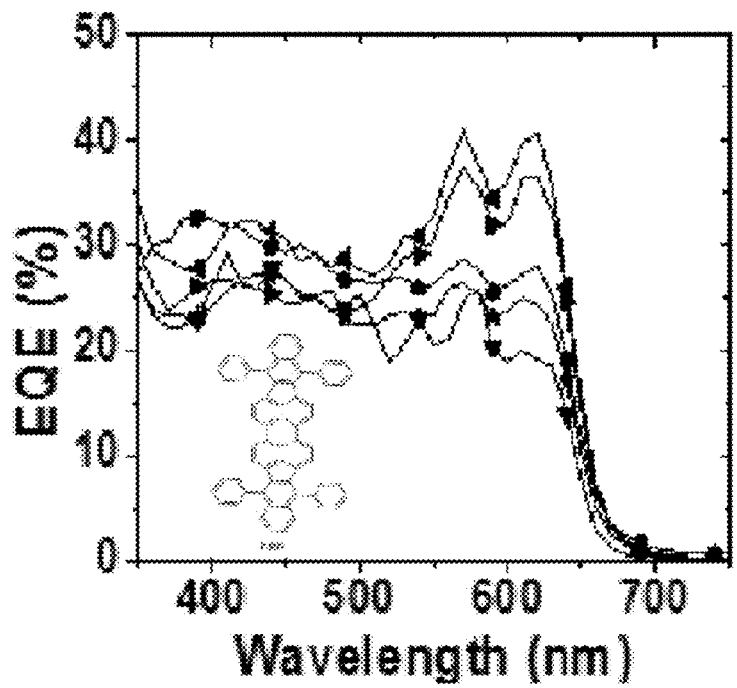

Device A

| 140 | Electrode |
|---|---|
| 150 | Photoactive Region |
| 115 | Exciton-blocking electron/hole filter |
| 160 | Photoactive Region |
| 110 | Electrode |

(b)

Device B

| 140 | Electrode |
|---|---|
| 150 | Photoactive Region |
| 115 | Exciton-blocking electron/hole filter |
| 135 | Exciton-blocking electron/hole filter |
| 160 | Photoactive Region |
| 110 | Electrode |

BAlq

TBPi

Alq₃

BP4mPy

3TPYMB

3TPYMB:$C_{60}$ Buffered OPV

3TPYMB:C$_{60}$

3TPYMB:C$_{60}$

3TPYMB:C$_{60}$

3TPYMB:C$_{60}$

STABLE ORGANIC PHOTOSENSITIVE DEVICES WITH EXCITON-BLOCKING CHARGE CARRIER FILTERS UTILIZING HIGH GLASS TRANSITION TEMPERATURE MATERIALS

CROSS-REFERENCE TO RELATED APPLICATIONS

This application claims the benefit of priority to and is a continuation-in-part of PCT Application No. PCT/US2014/062351, filed Oct. 27, 2014, which claims the benefit of priority to U.S. Provisional Application Nos. 61/895,837, filed Oct. 25, 2013, and 61/924,577, filed Jan. 7, 2014, and which is a continuation-in-part of PCT Application No. PCT/US2014/033981, filed Apr. 14, 2014, which claims the benefit of priority to U.S. Provisional Application Nos. 61/811,570, filed Apr. 12, 2013, 61/871,452, filed Aug. 29, 2013, and 61/912,051, filed Dec. 5, 2013, all of which are incorporated herein by reference in their entirety. This application also claims the benefit of priority to U.S. Provisional Application No. 62/026,301, filed Jul. 18, 2014, which is incorporated herein by reference in its entirety.

STATEMENT REGARDING FEDERALLY SPONSORED RESEARCH

This invention was made with U.S. Government support under Contract Nos. DE-SC0000957, DE-SC0001013, and DE-EE0005310 awarded by the U.S. Department of Energy, and under FA9550-10-1-0339 awarded by the Air Force Office of Scientific Research. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan, University of Southern California, and NanoFlex Power Corporation. The agreement was in effect on and before the date the subject matter of the present disclosure was prepared, and was made as a result of activities undertaken within the scope of the agreement.

The present invention generally relates to electrically active, optically active, solar, and semiconductor devices and, in particular, to organic photosensitive optoelectronic devices comprising at least one exciton-blocking charge carrier filter comprising a wide energy gap material that is morphologically stable at the operating temperature of the device. Also disclosed herein are methods of preparing the same.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. More recent efforts have focused on the use of organic photovoltaic cells to achieve acceptable photovoltaic conversion efficiencies with economical production costs.

PV devices may be optimized for maximum electrical power generation under standard illumination conditions (i.e., Standard Test Conditions which are 1000 W/m², AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max}V_{max}\}/\{I_{SC}V_{OC}\} \quad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. In some cases, an acceptor material may be an ETL and a donor material may be an HTL.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at the organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~10⁶V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency η associated with each of these processes. Subscripts may be used as follows: P for power efficiency, EXT for external quantum efficiency, A for photon absorption, ED for diffusion, CC for collection, and INT for internal quantum efficiency. Using this notation:

$$\eta_P \sim \eta_{EXT} = \eta_A * \eta_{ED} * \eta_{CC}$$

$$\eta_{EXT} = \eta_A * \eta_{INT}$$

The diffusion length ($L_D$) of an exciton is typically much less ($L_D \sim 50$ Å) than the optical absorption length (~500 Å), requiring a tradeoff between using a thick, and therefore resistive, cell with multiple or highly folded interfaces, or a thin cell with a low optical absorption efficiency.

Organic PV cells have many potential advantages when compared to traditional silicon-based devices. Organic PV cells are light weight, economical in materials use, and can be deposited on low cost substrates, such as flexible plastic foils. For commercialization, however, device efficiencies must further improve via new material and device design approaches.

In organic PV cells, interfacial phenomena can be seen to dominate the behavior of key processes, such as charge separation at the donor/acceptor interface and charge extraction at the organic/electrode interface. To enhance charge extraction while inhibiting exciton recombination, buffer layers are often used between the photoactive region and one or both of the electrodes.

Wide energy gap materials, such as BCP and BPhen, have been employed as buffers. These materials function by blocking the transport of excitons due to their wide HOMO-LUMO energy gap while transporting electrons through defect states induced by the deposition of the cathode. A second function of these wide gap buffers is to space the optically absorbing layers further from the reflective cathode at the optimal position in the optical field. However, these buffers are limited to extremely thin films (<10 nm) by the penetration depth of the defect states accrued during deposition and they are highly resistive.

Materials with small HOMO energies, such as Ru(acac), have been used as buffers to transport holes from the cathode to recombine with electrons at the acceptor/buffer interface.

A third type of buffer has been developed based on materials with LUMO energies aligned to that of the acceptor, such as PTCBI and NTCDA. The alignment of the LUMO levels allows efficient conduction of electrons from the acceptor to the cathode. These materials can also function to block excitons if their HOMO/LUMO gap is sufficiently large. However, these materials can hinder device performance if they absorb in the same spectral region as the active layer materials. Improvements to these device architectures must be made to increase conversion efficiencies of organic PV cells.

The present inventors have developed a new type of buffer, disclosed herein as exciton-blocking charge carrier filters. These novel buffers comprise a mixture of at least one wide energy gap material and at least one electron or hole conducting material. The filters are optimized depending on their location in the device. That is, an exciton-blocking hole conducting filter is disposed between the photoactive region and the anode in order to block excitons and conduct holes to the anode. Conversely, an exciton-blocking electron conducting filter is disposed between the photoactive region and the cathode in order to block excitons and conduct electrons to the cathode. For example, in the exciton-blocking electron filter, electrons are transported by the electron conducting material via an impurity-band like mechanism. Simultaneously, excitons are blocked by a combination of an energetic barrier caused by the wide energy gap material and a statistical barrier caused by a reduction in the number of states available for transfer to the electron conductor.

A problem with many buffers such as BCP or BPhen is that they are highly resistive and rely on damage induced transport states which limit the practical layer thickness to ~10 nm. By mixing a wide energy gap material (e.g. BCP) with a material with good transport properties (e.g. $C_{60}$), the overall conductivity can be improved by using an impurity band-like transport.

A second problem with buffers such as BCP or Bphen is that they can become morphologically unstable at operating temperatures that begin to approach or, in some cases, exceed their respective glass transition temperatures ($T_g$), which can contribute to performance degradation over time, significantly reducing the operational lifetime of the device. Under such conditions, the buffers can crystallize and degrade. The present inventors discovered that by mixing the wide energy gap material with an electron conductor (such as a fullerene) or a hole conductor, the buffer layer has increased stability, akin to "doped pinning" of the morphology. Moreover, by utilizing morphologically stable wide energy gap materials, i.e., wide energy gap materials having a sufficiently high glass transition temperature, in the exciton-blocking charge carrier filters described herein, the operational lifetime of the devices can be significantly extended.

The exciton-blocking charge carrier filters described herein also function to prevent a buildup of charges in the active layer which helps to reduce exciton-polaron quenching of excitons, increasing the short circuit current and fill factor of devices.

In a first aspect of the present disclosure, an organic photosensitive optoelectronic device comprises two electrodes in superposed relation comprising an anode and a cathode; a photoactive region comprising at least one donor material and at least one acceptor material disposed between the two electrodes to form a donor-acceptor heterojunction, wherein the at least one acceptor material has a Lowest Unoccupied Molecular Orbital energy level ($LUMO_{Acc}$) and a Highest Occupied Molecular Orbital energy level ($HOMO_{Acc}$), and the at least one donor material has a Lowest Unoccupied Molecular Orbital energy level ($LUMO_{don}$) and a Highest Occupied Molecular Orbital energy level ($HOMO_{don}$); and an exciton-blocking electron filter disposed between the cathode and the at least one acceptor material, wherein the electron filter comprises a mixture comprising at least one cathode-side wide energy gap material and at least one electron conducting material, and wherein the at least one cathode-side wide energy gap material has:

a Lowest Unoccupied Molecular Orbital energy level ($LUMO_{CS\text{-}WG}$) smaller than or equal to the $LUMO_{Acc}$;

a Highest Occupied Molecular Orbital energy level ($HOMO_{CS\text{-}WG}$) larger than, equal to, or within 0.3 eV smaller than the $HOMO_{Acc}$; and a $HOMO_{CS\text{-}WG}$-$LUMO_{CS\text{-}WG}$ energy gap wider than a $HOMO_{Acc}$-$LUMO_{Acc}$ energy gap; and wherein the at least one cathode-side wide energy gap material has a glass transition temperature equal to or greater than 85° C.

In a second aspect, an organic photosensitive optoelectronic device comprises two electrodes in superposed relation comprising an anode and a cathode; a photoactive region comprising at least one donor material and at least one acceptor material disposed between two electrodes to form a donor-acceptor heterojunction, wherein the at least one donor material has a Lowest Unoccupied Molecular Orbital energy level ($LUMO_{Don}$) and a Highest Occupied Molecular Orbital energy level ($HOMO_{Don}$); and an exciton-blocking hole filter disposed between the anode and the at least one donor material, wherein the hole filter comprises a mixture comprising at least one anode-side wide energy gap material and at least one hole conducting material, and wherein the at least one anode-side wide energy gap material has:

a Highest Occupied Molecular Orbital energy level ($HOMO_{AS\text{-}WG}$) energy level larger than or equal to the $HOMO_{Don}$;

a Lowest Unoccupied Molecular Orbital energy level ($LUMO_{AS\text{-}WG}$) smaller than, equal to, or within 0.3 eV larger (further from the vacuum) than the $LUMO_{Don}$; and a $HOMO_{AS\text{-}WG}$-$LUMO_{AS\text{-}WG}$ energy gap wider than a $HOMO_{Don}$-$LUMO_{Don}$ energy gap; and wherein the at least one anode-side wide energy gap material has a glass transition temperature equal to or greater than 85° C.

The accompanying figures are incorporated in, and constitute a part of this specification.

FIGS. 1(a) and 1(b) show schematics of exemplary organic photosensitive optoelectronic devices in accordance with the present disclosure. FIG. 1(a) shows Device A comprises an exciton-blocking electron filter or an exciton-blocking hole filter, and FIG. 1(b) shows Device B comprises an exciton-blocking electron filter and an exciton-blocking hole filter.

FIG. 3 shows J-V curves of devices under one sun AM1.5G illumination on top with top inset showing characteristics of the devices and a plot of external quantum efficiency on bottom with bottom inset showing device structure. (A:B)=1:0 (D1), 2:1 (D2), 1:1 (D3), and 1:2 (D4).

FIG. 4 shows J-V curves of devices under one sun AM1.5G illumination on top and a plot of external quantum efficiency on bottom with inset showing the device structure. x=10 nm (D7), 20 nm (D6), 30 nm (D5).

FIG. 5 shows J-V curves of devices under one sun AM1.5G illumination on top and a plot of external quantum efficiency on the bottom with inset showing the device structure. x=0 nm (D8), 20 nm (D9), and 40 nm (D10).

Figure 9:
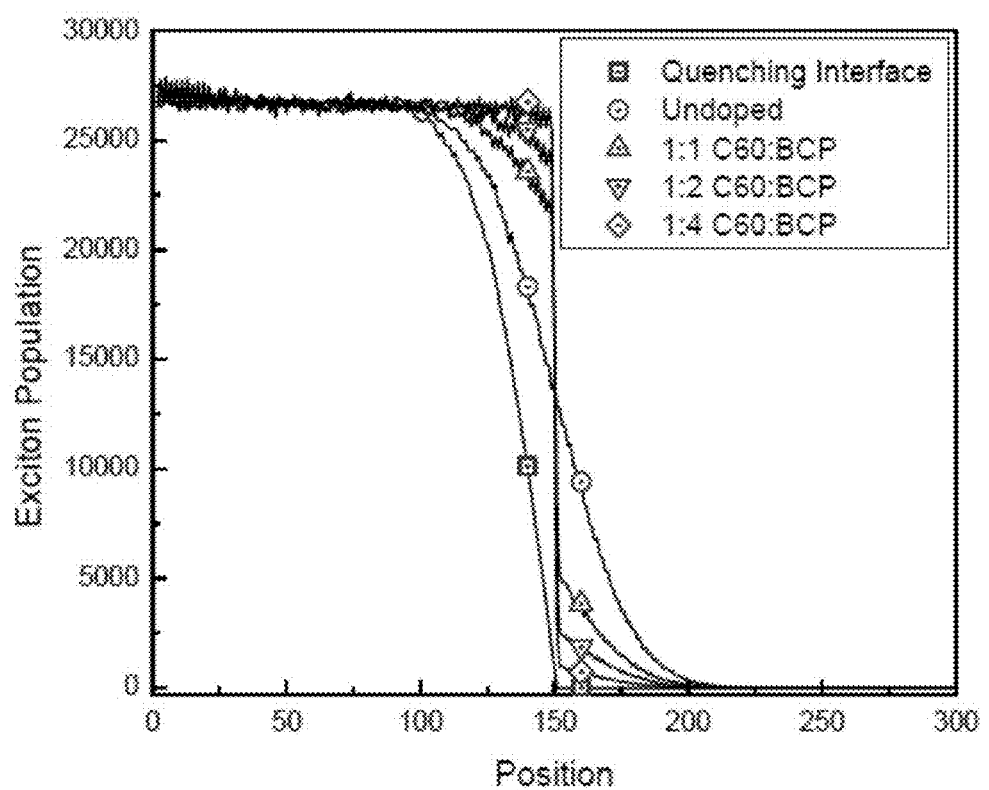

FIG. 9 shows Monte Carlo simulation of the diffusion of excitons into a mixed layer of BCP:$C_{60}$ on top of a neat $C_{60}$ active layer, based solely on the reduced number of $C_{60}$ molecules in the mixed films available for exciton transfer. Excitons are randomly generated in the active layer. They move randomly for a set number of steps, then their final position is recorded. They are assumed to diffuse solely by nearest-neighbor hopping. At the interface between the mixed and active layers, the probability for hopping between layers is scaled by the relative number of molecules of $C_{60}$ in each layer.

FIG. 10 on top shows normalized extinction spectra of $C_{70}$ capped with different buffer layers and on bottom shows emission spectra of $C_{70}$ (excited at 450 nm) capped with quenching (NPD), blocking (BCP), and mixed buffer layers on the bottom.

FIG. 11 shows EQE spectra of devices capped with various buffer layers (top) and J-V curves of devices under 0.8 sun AM1.5G illumination.

FIG. 12 shows J-V curves of devices under one sun AM1.5G illumination on top, and a plot of external quantum efficiency on the bottom, with bottom inset showing the device structure. Buffers: 10 nm BCP (D11), 10 nm $C_{60}$:BCP (D12), 10 nm PTCBI (D13), 10 nm $C_{60}$:BCP/5 nm PTCBI (D14), 10 nm BCP:$C_{60}$/5 nm BCP (D15).

FIG. 13 on top shows EQE at -1 V normalized to 0 V EQE for the devices of FIG. 12 with various buffer layers, and on bottom shows responsivity as a function of illumination intensity for the devices. Buffers: 10 nm BCP (D11), 10 nm BCP:$C_{60}$ (D12), 10 nm PTCBI (D13), 10 nm BCP:$C_{60}$/5 nm PTCBI (D14), 10 nm BCP:$C_{60}$/5 nm BCP (D15).

FIG. 14 shows J-V curves of devices under one sun AM1.5G illumination on top, and a plot of external quantum efficiency on the bottom, with bottom inset showing the device structure. x=5 nm (D16), 15 nm (D17), 25 nm (D18), and 35 nm (D19).

FIG. 15 shows J-V curves under one sun AM1.5G illumination on top and on the bottom a plot of the external quantum efficiency of devices with various buffer layers.

FIG. 16 shows J-V curves under one sun AM1.5G illumination on top and on the bottom a plot of the external quantum efficiency of devices with various buffer layers containing various ratios of $C_{60}$ to BCP.

Figure 17:
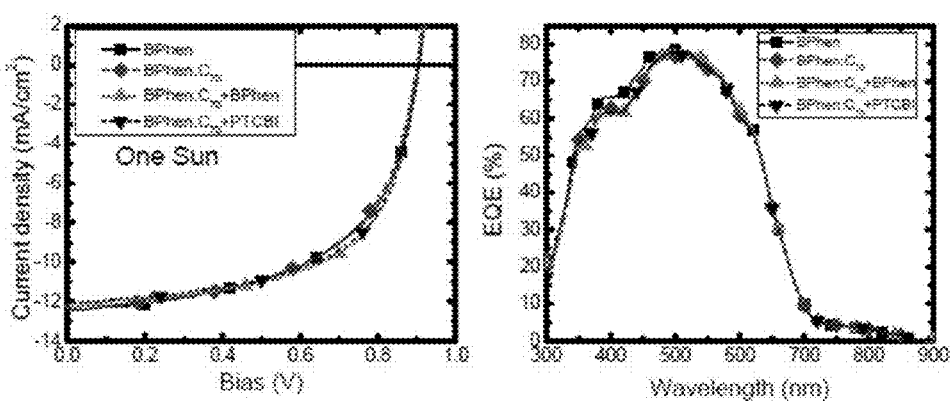

FIG. 17 shows J-V for illumination at 1-sun simulated AM1.5G illumination (upper left) and EQE (upper right) and extracted efficiency parameters (lower) for planar-mixed OPV cells with active layers comprising a relatively thick 1:8 volume ratio of DBP and a neat layer of $C_{70}$. The thickness and volume ratio of the BPhen:$C_{70}$ for each buffer is given in the table.

Figure 18:
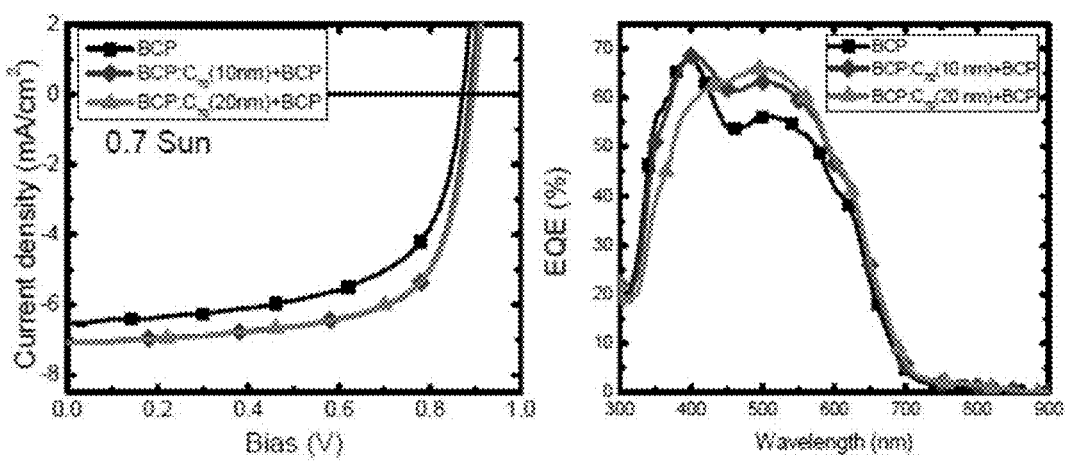

FIG. 18 shows J-V for illumination at 0.7-sun simulated AM1.5G illumination (upper left) and EQE (upper right) and extracted efficiency parameters (lower) for planar-mixed OPV cells with active layers comprising a relatively thin 1:8 volume ratio of DBP and a neat layer of $C_{70}$ and various buffers. The thickness and volume ratio of the BCP:$C_{70}$ for each buffer is given in the table.

FIGS. 19(a), 19(b), and 19(c) show the EQE and J-V curves for dilution with BPhen, CBP, and UGH2.

FIG. 20(a) shows spectrally-corrected current density v. voltage (J-V) characteristics under simulated AM 1.5G, 1 sun illumination for DBP:$C_{70}$ mixed-HJ OPV cells. The shaded region emphasizes the difference in fill factors, and hence maximum power output, of the two cells. Inset shows schematic of the device structure.

FIG. 20(b) shows external quantum efficiency (EQE) spectra for the cells in FIG. 20(a). Insert shows schematic diagrams of energy levels at the DBP:C70/buffer interface (left: neat BPhen buffer; right: BPhen:C60 compound buffer).

Figure 21:
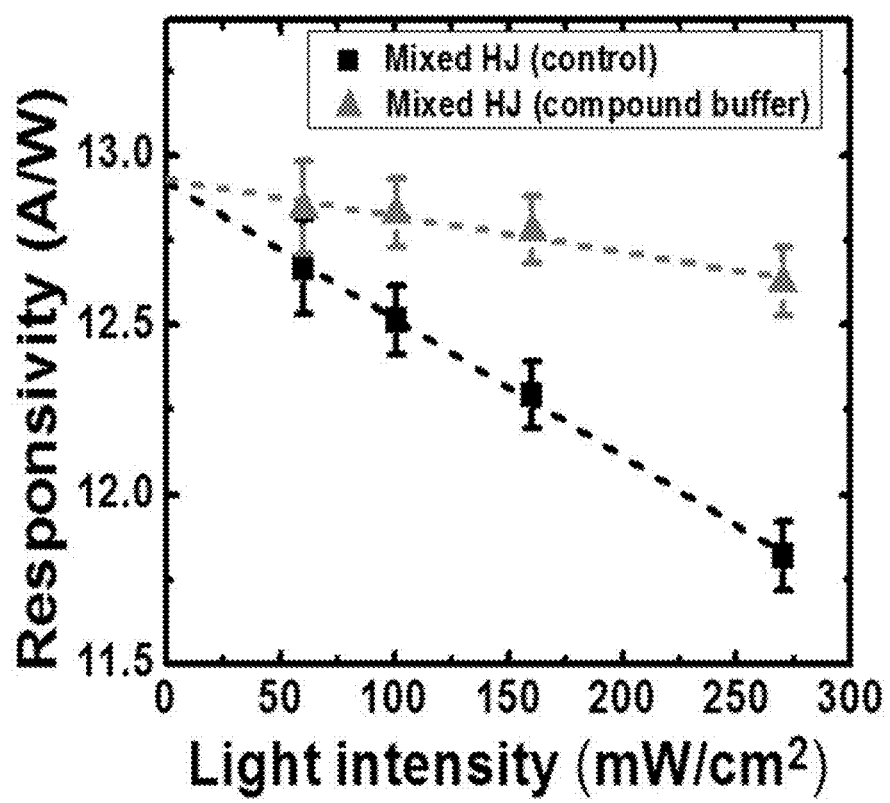

FIG. 21 shows responsivity v. light intensity for the mixed-HJ control cell and the compound buffer cell with linear fits according to bimolecular recombination theory (dashed lines).

Figure 22:
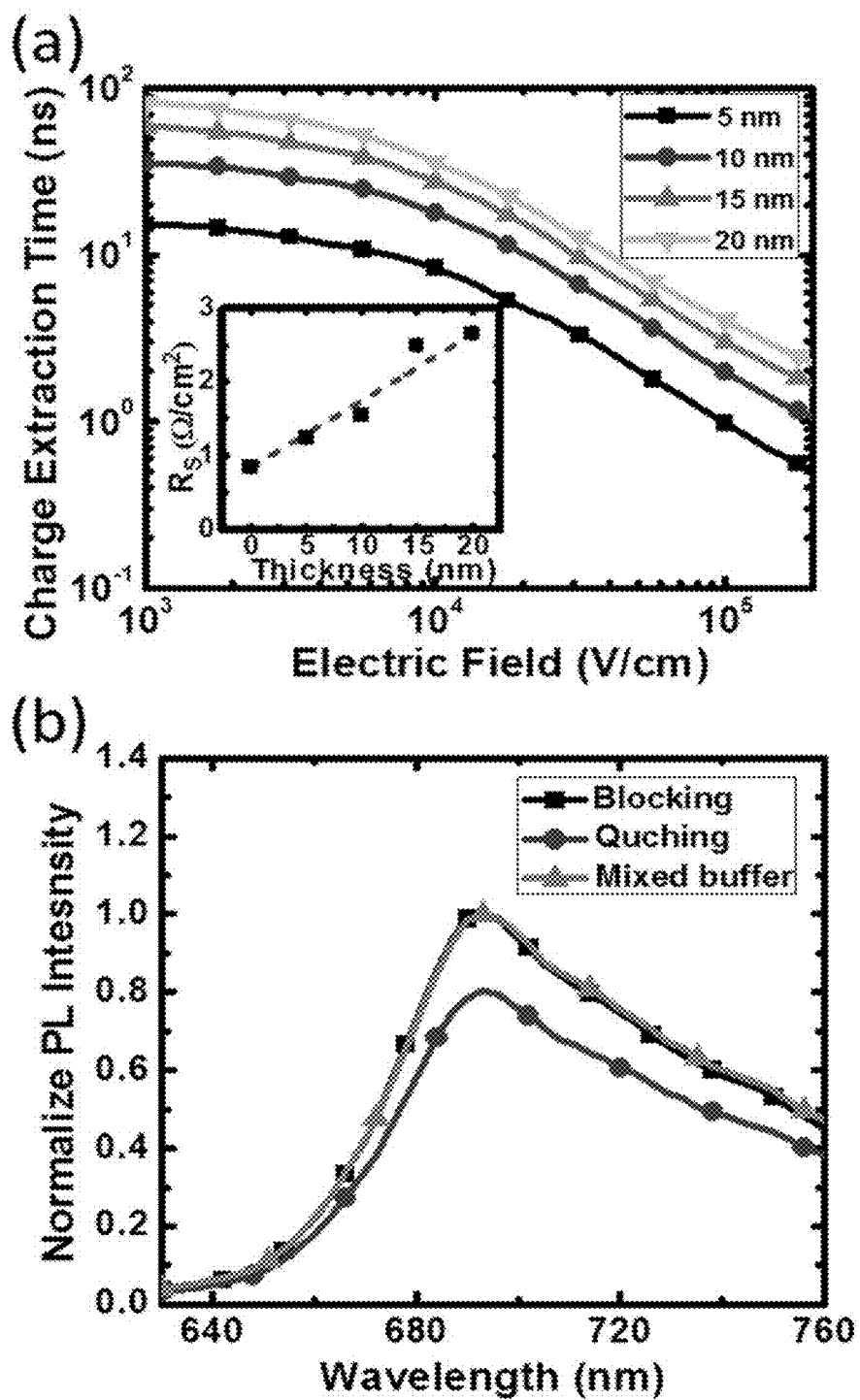

FIG. 22(a) shows charge extraction time v. electric field for various layer thicknesses calculated using 3-D Monte-Carlo simulations. The inset shows cell series resistance ($R_S$) v. layer thickness with a linear fit (dashed line) to the data obtained from the OPV cells (squares) (Error bars in the inset are smaller than data points).

FIG. 22(b) shows photoluminescence (PL) spectra for a neat $C_{70}$ layer in contact with BPhen (blocking), NPD (quenching) and BPhen:$C_{60}$ mixed layers obtained at an excitation wavelength of λ=520 nm.

FIG. 23(a) shows spectrally-corrected current density v. voltage (J-V) characteristics under simulated AM 1.5G, 1 sun illumination and FIG. 23(b) shows external quantum efficiency spectra for DBP:$C_{70}$ PM-HJ OPV cells with various buffer layers.

Figure 24:
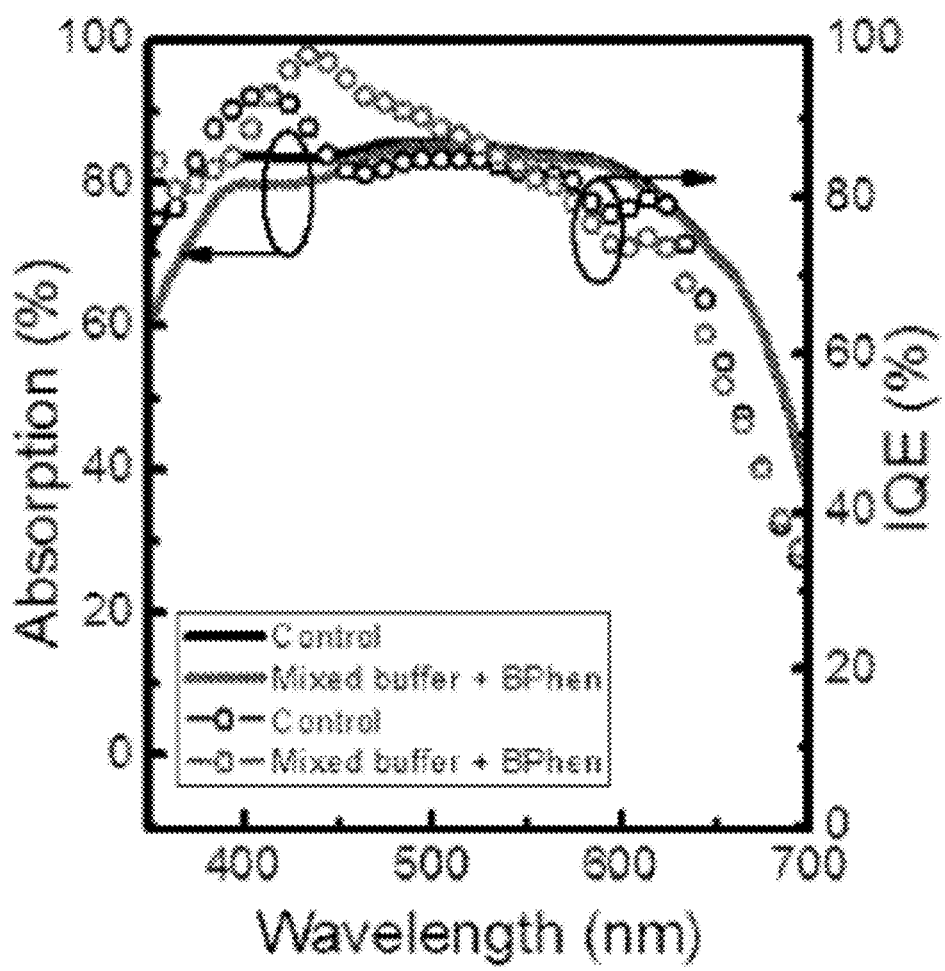

FIG. 24 shows calculated absorption spectra and internal quantum efficiency for the control cell and the cell with a BPhen:$C_{60}$/BPhen buffer.

Figure 25:
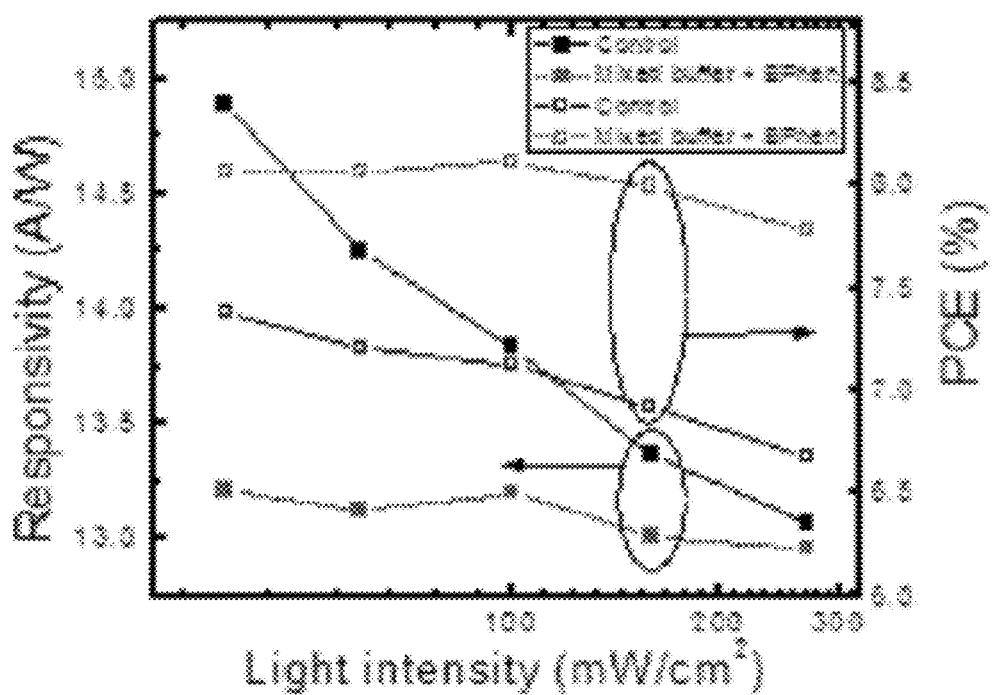

FIG. 25 shows responsivity (solid square) and power conversion efficiency (hollow square) v. light intensity for the control cell and the cell with a BPhen:$C_{60}$/BPhen buffer.

FIG. 26(a) shows spectrally-corrected J-V characteristics under simulated AM 1.5G, 1 sun illumination.

FIG. 26(b) shows external quantum efficiency spectra as a function of thickness of BPhen:$C_{60}$ mixed layer in the cells with a BPhen:$C_{60}$/BPhen buffer.

Figure 27:
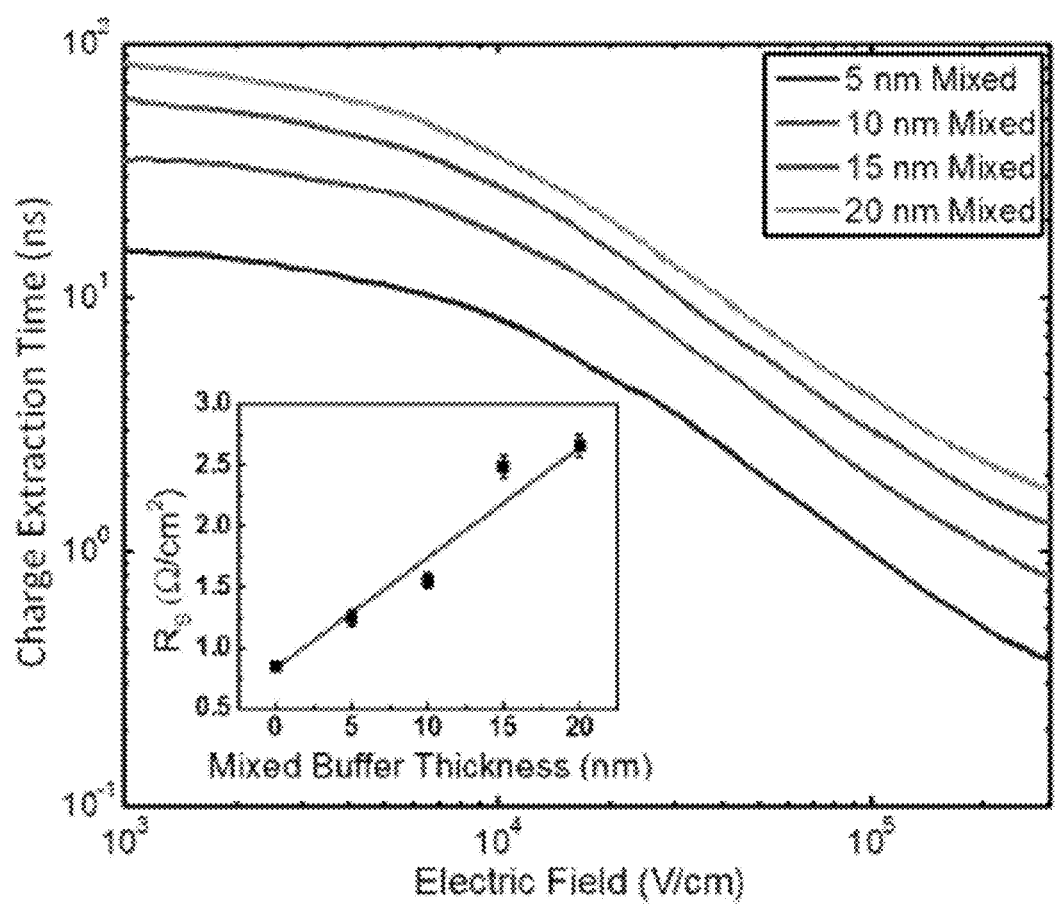

FIG. 27 shows modeled median extraction time v. electric field as a function of BPhen:$C_{60}$ mixed layer thickness, and the inset shows series resistance v. mixed layer thickness with a fitting.

FIG. 28(a) shows J-V for illumination under 1-sun simulated AM1.5G illumination with inset showing NPD.

FIG. 28(b) shows the external quantum efficiency for OPV cells with active layers comprised of DBP and $C_{60}$ and various buffers.

FIGS. 29(a) and 29(b) show schematics of exemplary tandem organic photosensitive optoelectronic devices in accordance with the present disclosure. Device A in FIG. 29(a) comprises an exciton-blocking electron filter or an exciton-blocking hole filter, and Device B in FIG. 29(b) comprises an exciton-blocking electron filter and an exciton-blocking hole filter.

Figure 30:
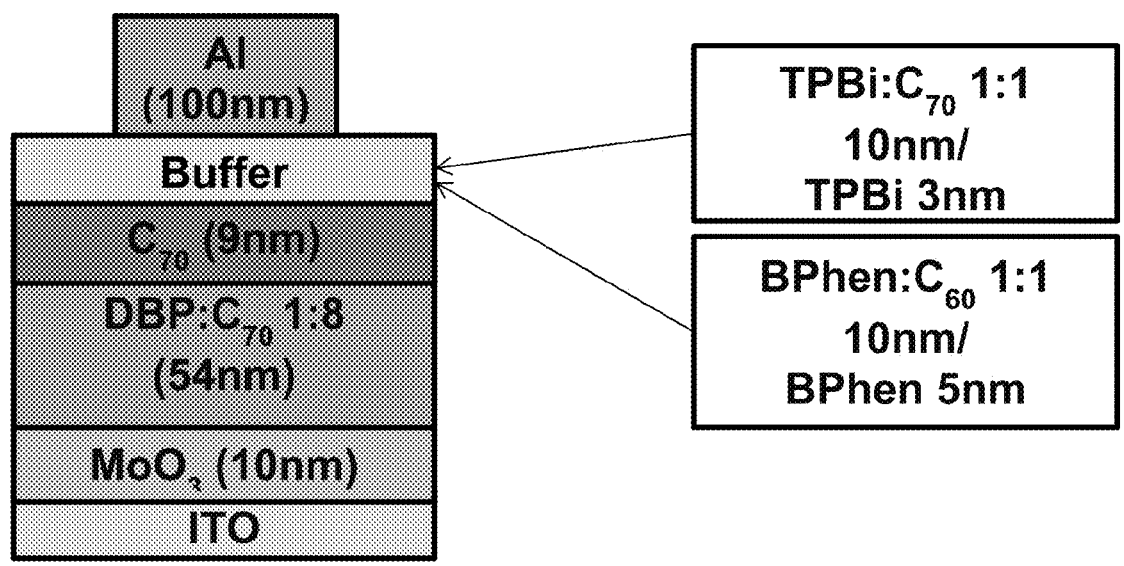

FIG. 30 shows a DBP:$C_{70}$ device having a mixed BPhen:$C_{60}$ buffer layer (10 nm) with a thin BPhen cap layer (5 nm) between the mixed buffer layer and the Al electrode, or, alternatively, a mixed TPBi:$C_{70}$ buffer layer (10 nm) with a thin TPBi cap layer (3 nm) between the mixed buffer layer and the Al electrode.

Figure 31A:
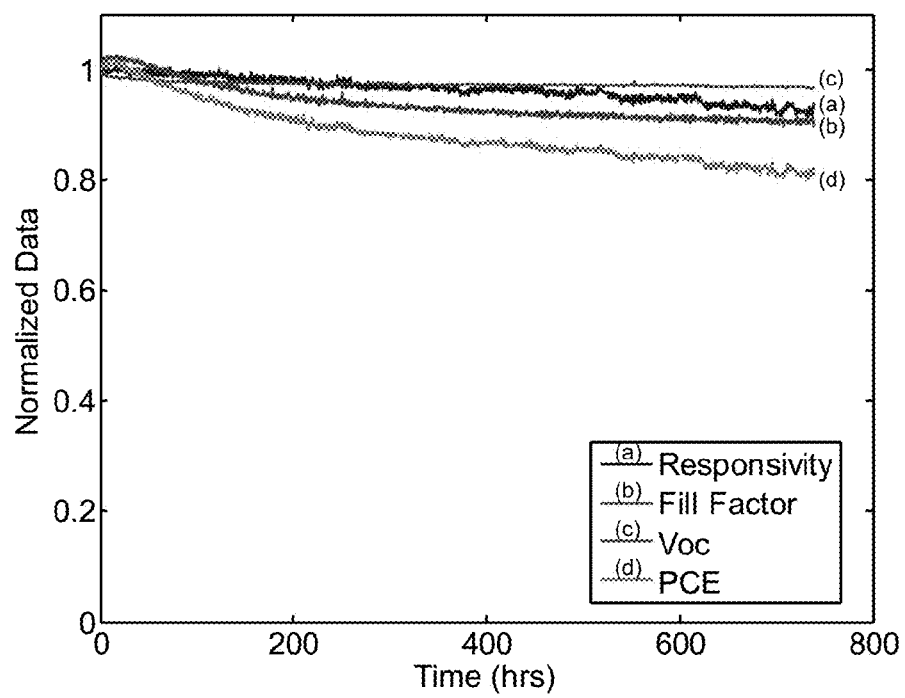
Figure 31B:
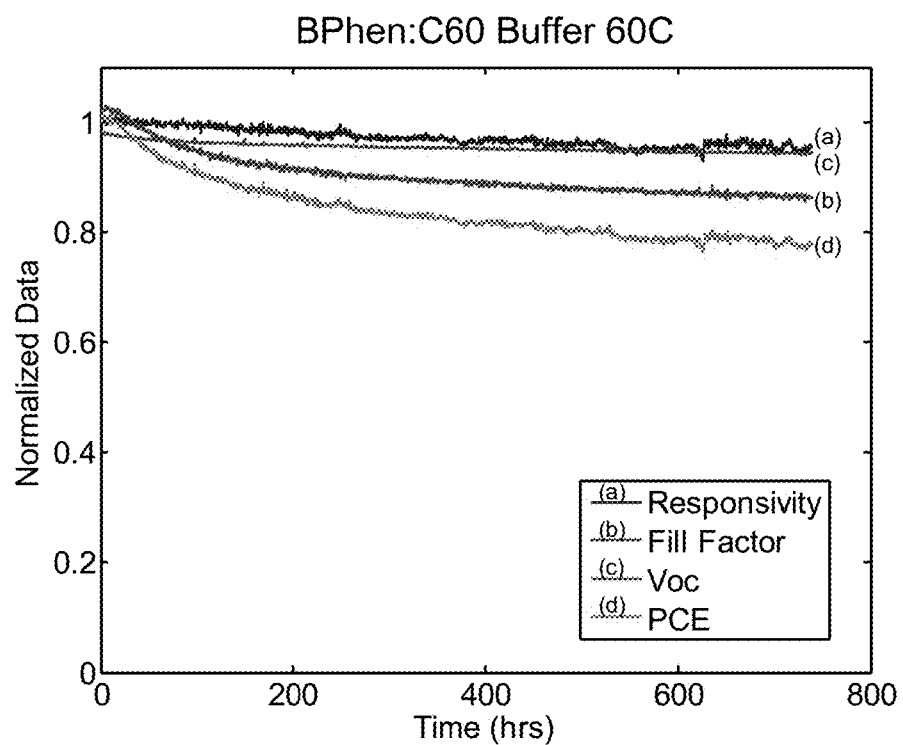
Figure 31C:
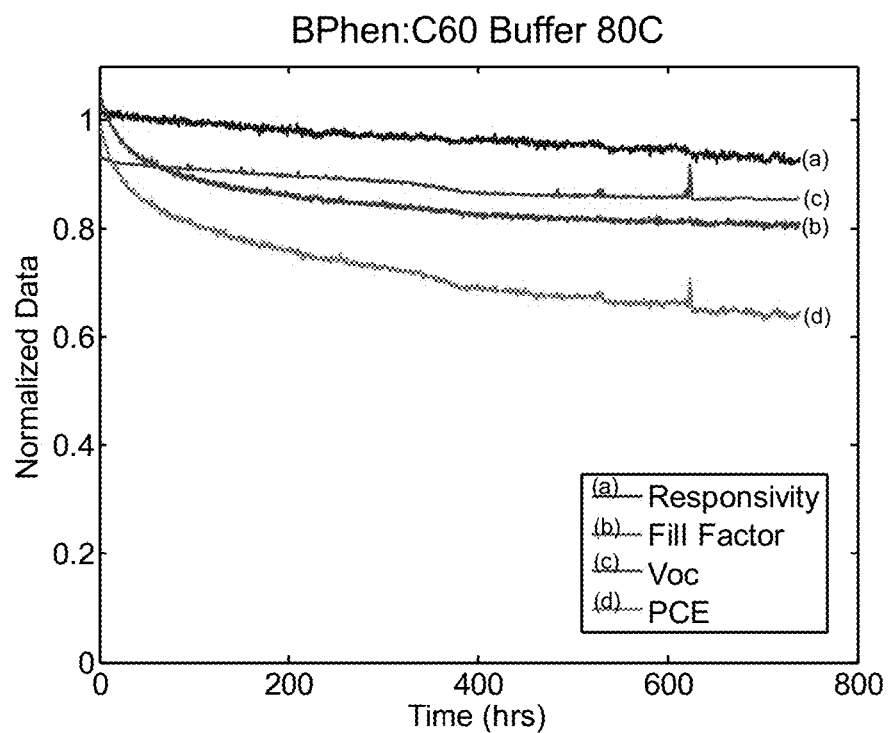
Figure 32A:
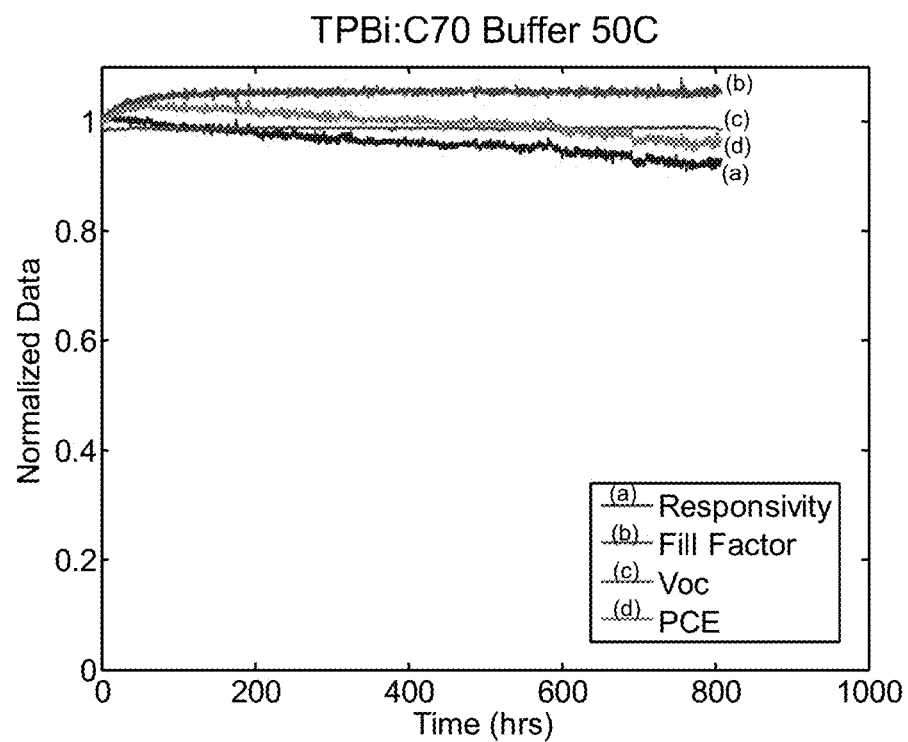
Figure 32B:
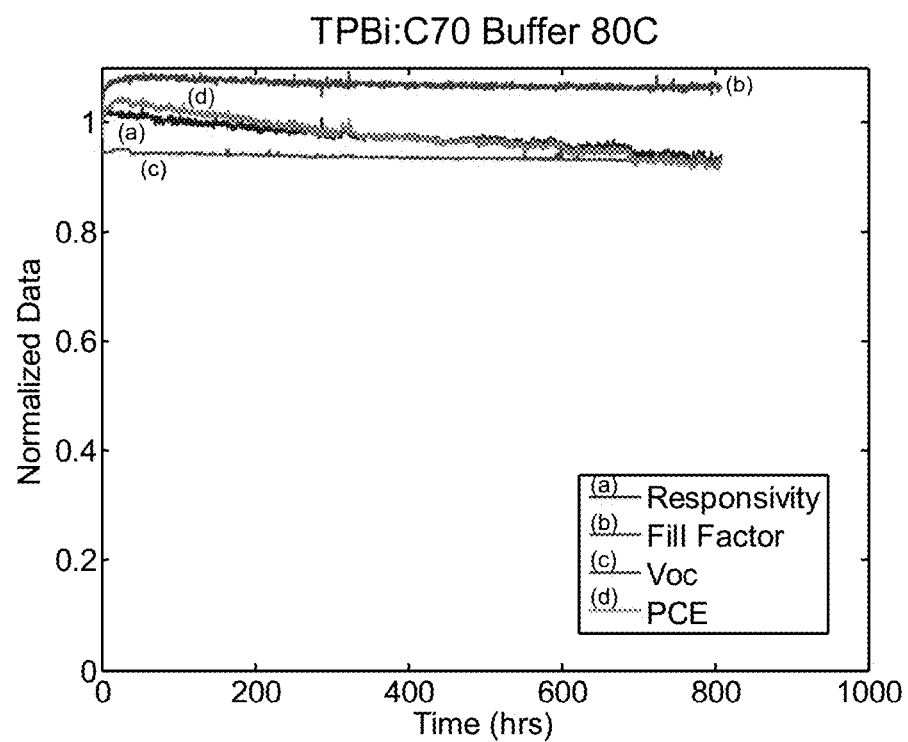
Figure 32C:
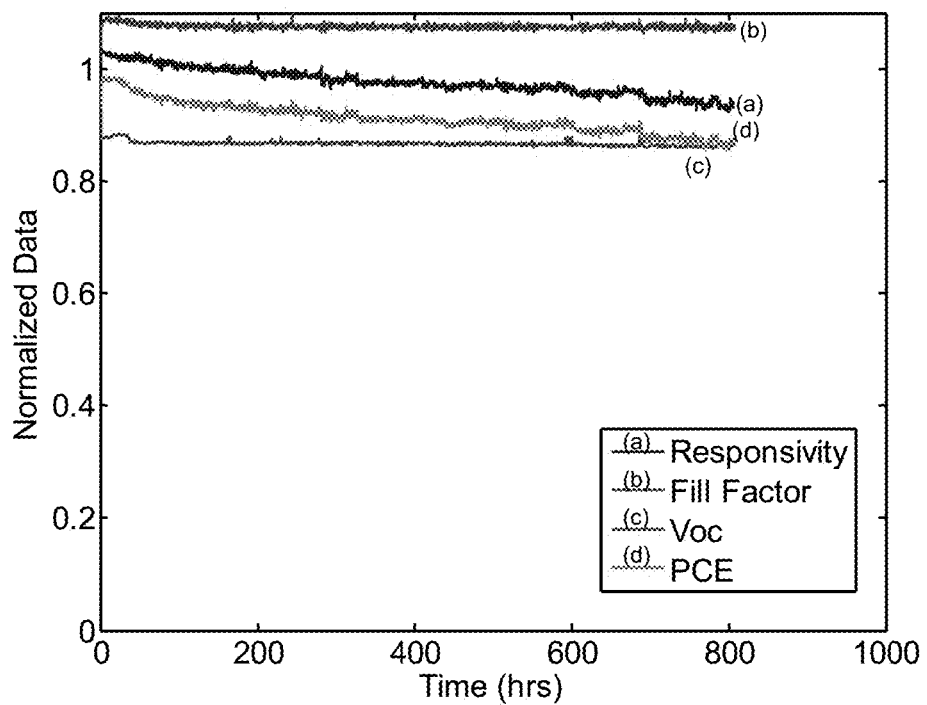
Figure 32D:
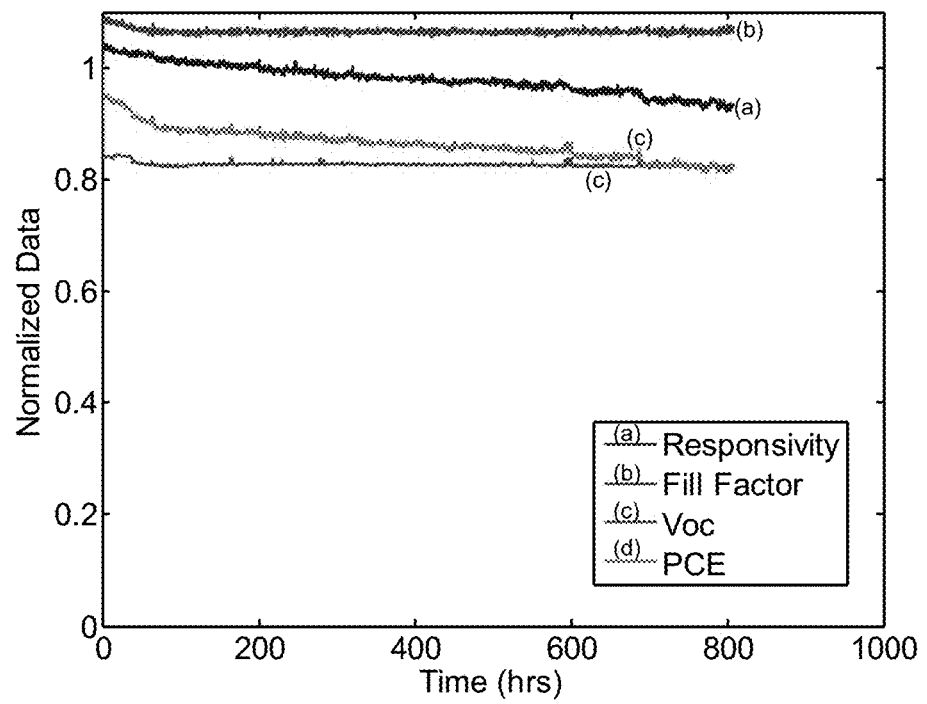

FIGS. 31A to 31C show normalized responsivity, fill factor, $V_{OC}$, and PCE over time at 50° C., 60° C., and 80° C., respectively, for the device of FIG. 30 having the mixed Bphen:$C_{60}$ buffer layer with the thin BPhen cap layer.

FIGS. 32A to 32D show normalized responsivity, fill factor, $V_{OC}$, and PCE over time at 50° C., 80° C., and 105° C., and 130° C., respectively, for the device of FIG. 30 having the mixed TPBi:$C_{60}$ buffer layer within the thin TPBi cap layer.

Figure 33:
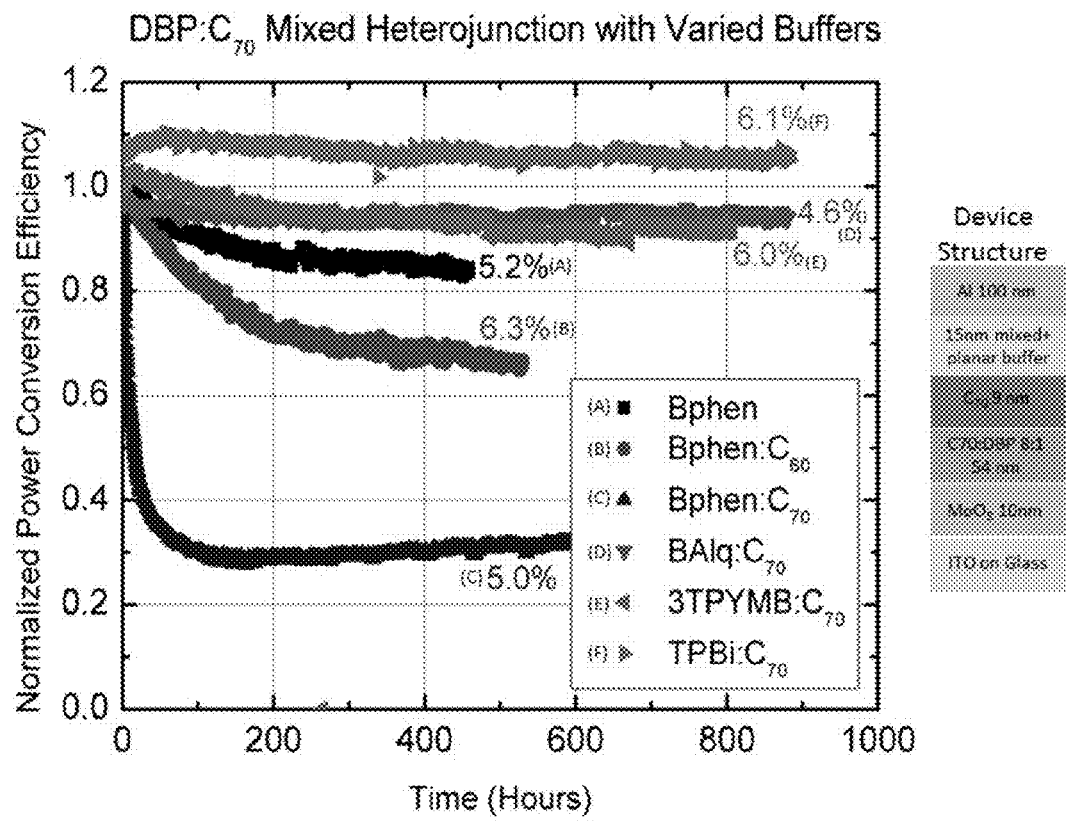
Figure 34:
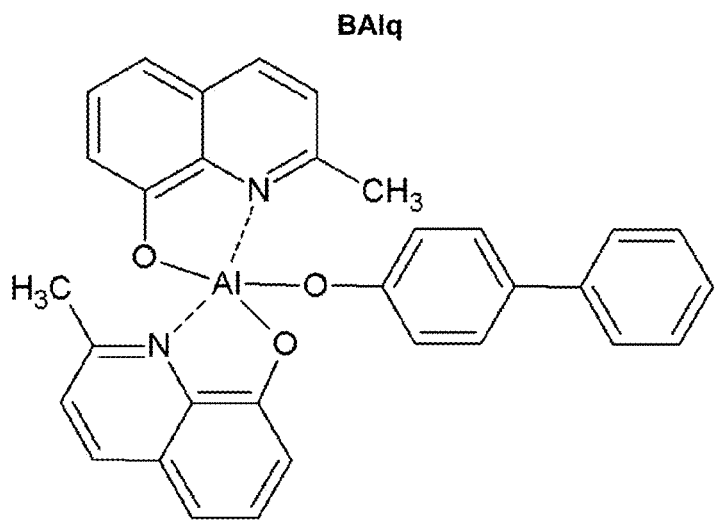
Figure 35:
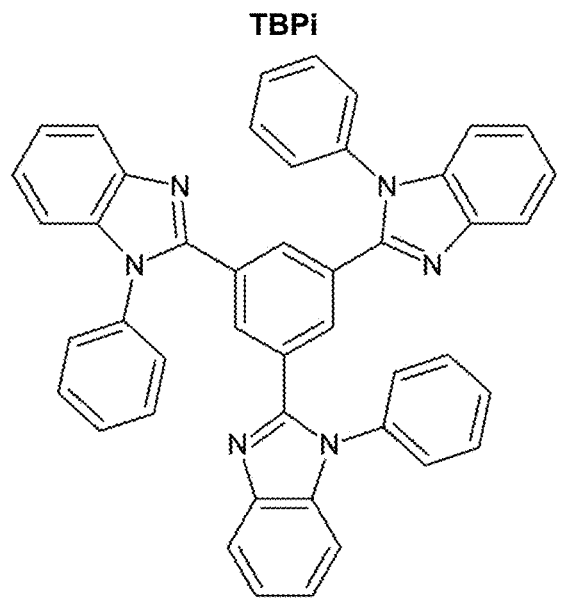
Figure 36:
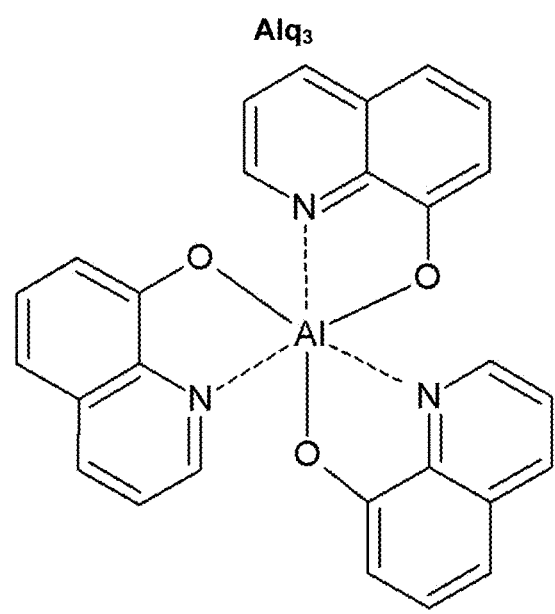
Figure 37:
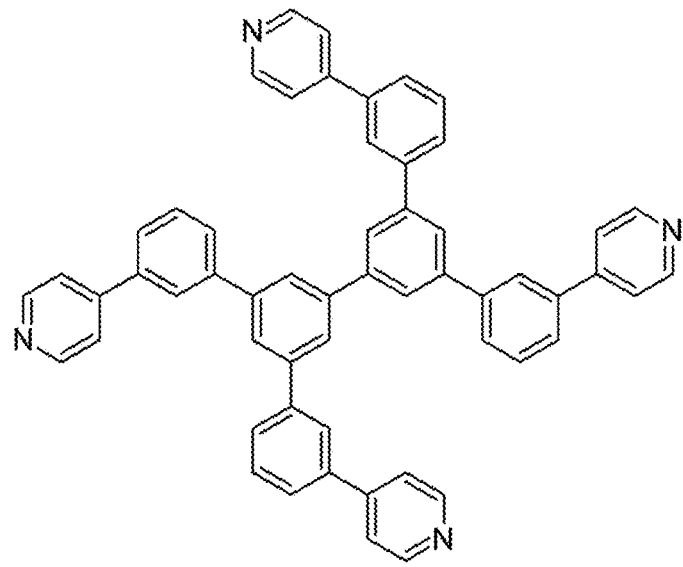
Figure 38:
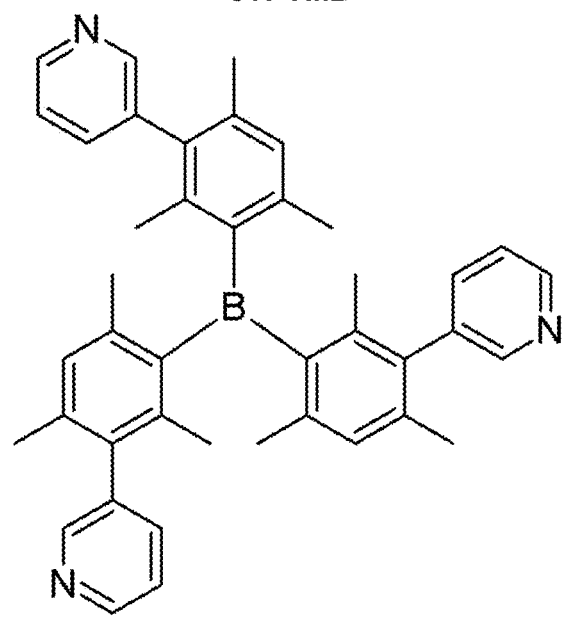

FIG. 33 shows the normalized power conversion efficiency over time of a DBP:$C_{70}$ mixed heterojunction with various buffers.

FIGS. 34 to 38 show molecular structures of exemplary wide energy gap materials BAlq, TPBi, $Alq_3$, BP4mPy, and 3TPYMB, respectively.

Figure 39:
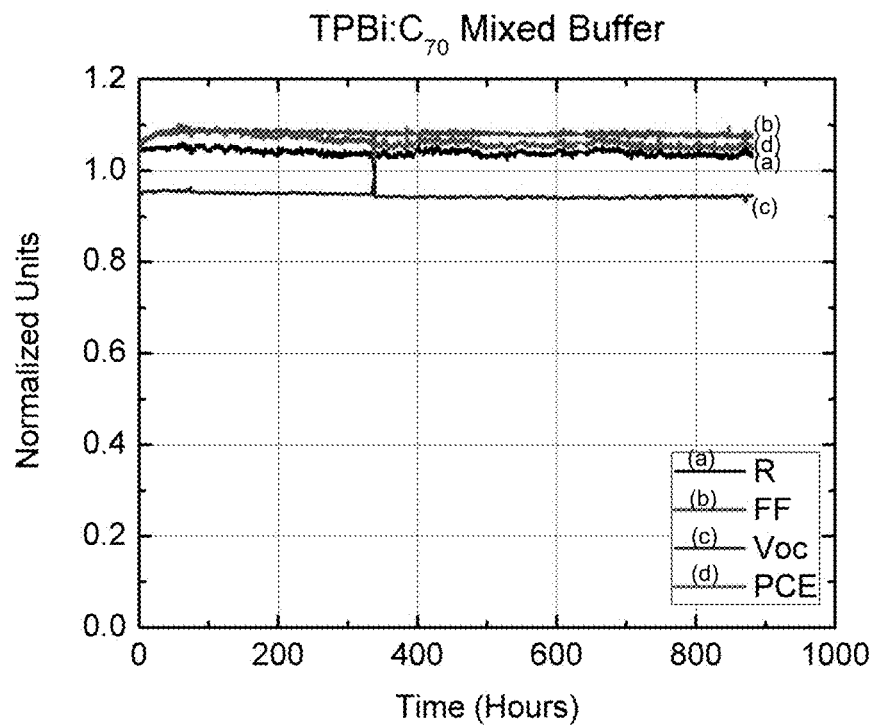
Figure 40:
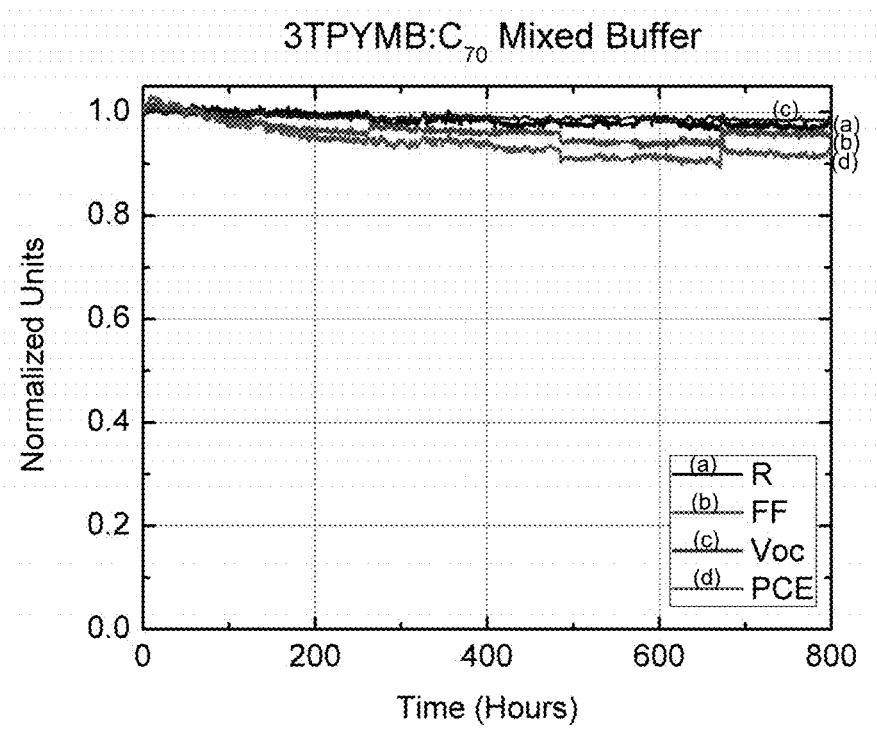
Figure 41:
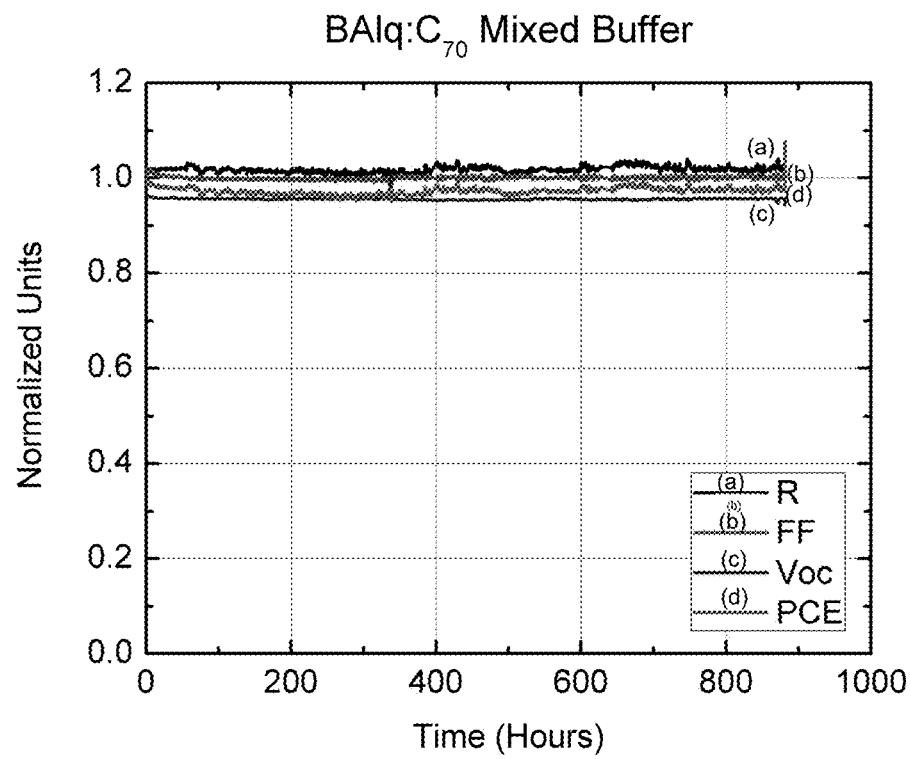

FIGS. 39-41 show normalized responsivity, fill factor, $V_{OC}$, and PCE at 55° C. over time for devices having mixed buffers containing a mixture of $C_{70}$ and one of TPBi, 3TPYMB, and BAlq, respectively.

Figure 42:
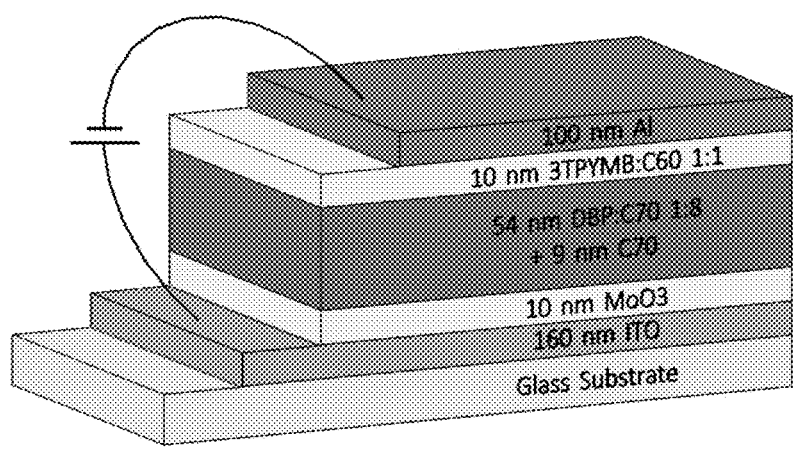
Figure 43:
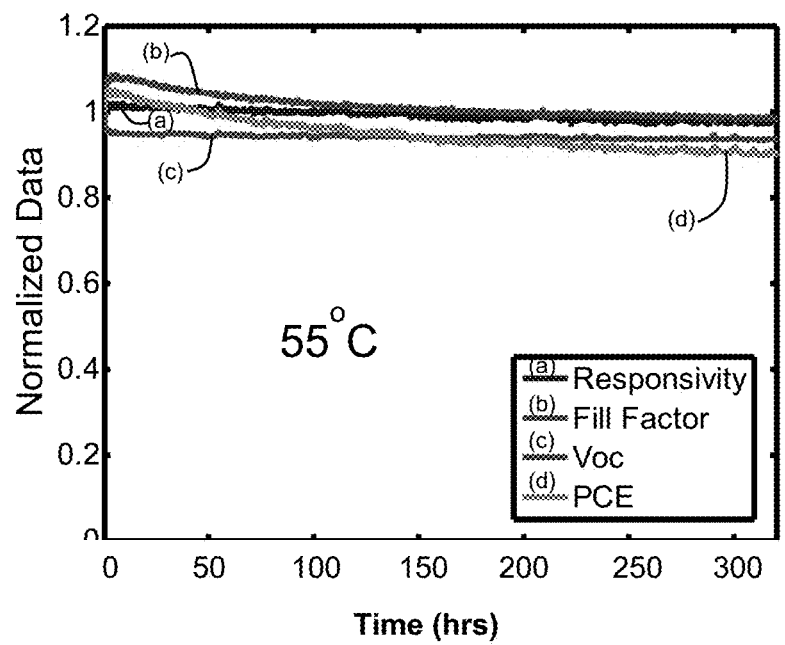
Figure 44:
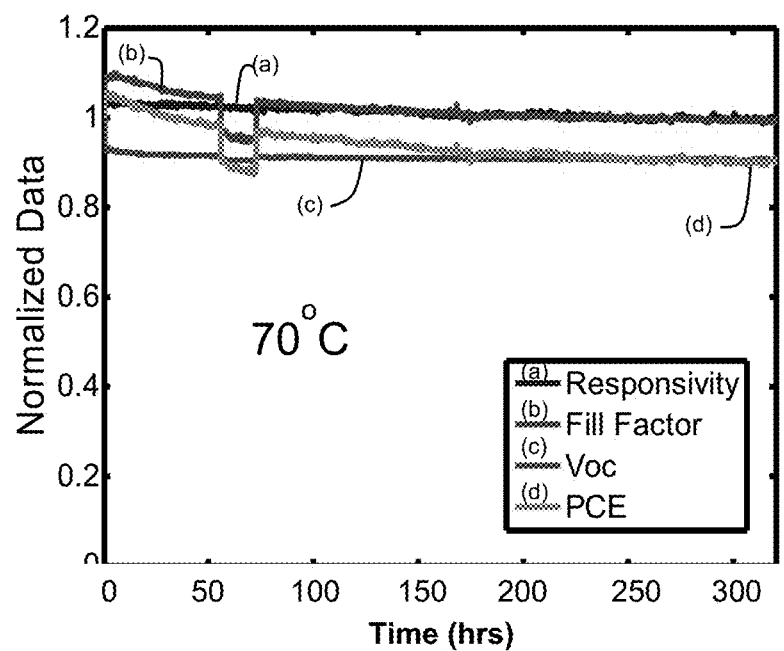
Figure 45:
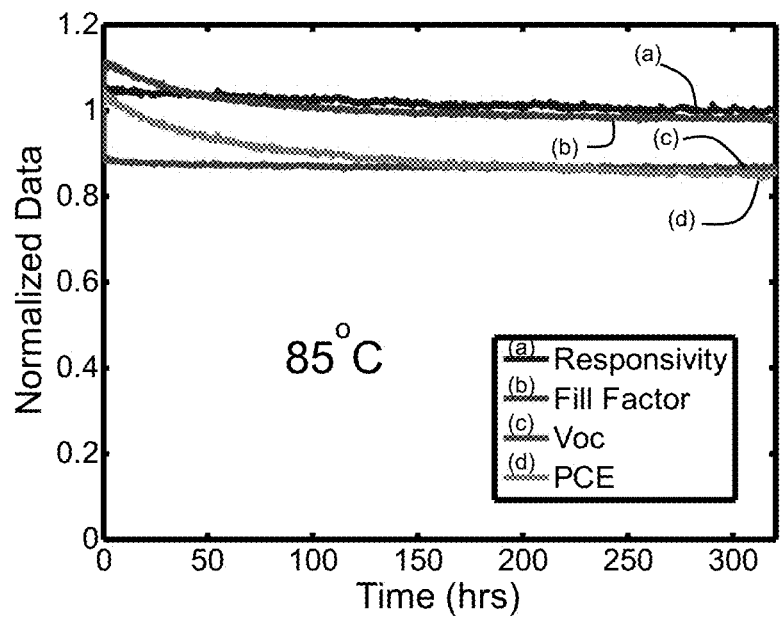
Figure 46:
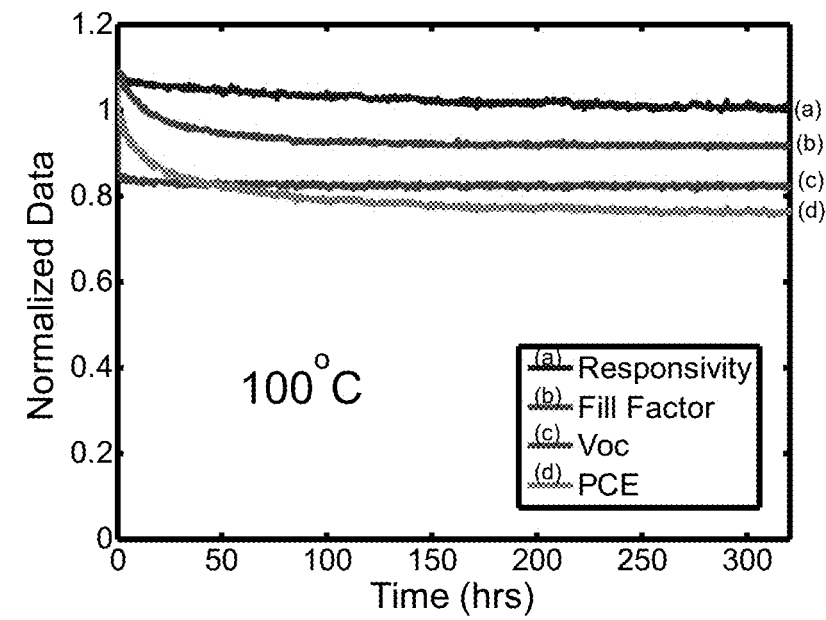

FIG. 42 shows a DBP:$C_{70}$ device having a mixed 3TPYMB:$C_{60}$ buffer layer.

FIGS. 43-46 show normalized responsivity, fill factor, $V_{OC}$, and PCE over time for the device of FIG. 42 at 55° C., 70° C., 85° C., and 100° C., respectively.

As used herein, the term "organic" includes polymeric materials as well as small molecule organic materials that may be used to fabricate organic photosensitive devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone.

In the context of the organic materials of the present disclosure, the terms "donor" and "acceptor" refer to the relative positions of the Highest Occupied Molecular Orbital (HOMO) and Lowest Unoccupied Molecular Orbital (LUMO) energy levels of two contacting but different organic materials. If the LUMO energy level of one material in contact with another is further from the vacuum level, then that material is an acceptor. Otherwise it is a donor. It is energetically favorable, in the absence of an external bias, for electrons at a donor-acceptor junction to move into the acceptor material, and for holes to move into the donor material.

Herein, the term "cathode" is used in the following manner. In a non-stacked PV device or a single unit of a stacked PV device under ambient irradiation and connected with a resistive load and with no externally applied voltage, e.g., a solar cell, electrons move to the cathode from the adjacent photoconducting material. Similarly, the term "anode" is used herein such that in a solar cell under illumination, holes move to the anode from the adjacent photoconducting material, which is equivalent to electrons moving in the opposite manner. It is noted that the "anode" and "cathode" electrodes may be charge transfer regions or recombination zones, such as those used in tandem photovoltaic devices. In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the ambient electromagnetic radiation in relevant wavelengths to be transmitted through it. An electrode is said to be "semi-transparent" when it permits some, but less than 50% transmission of ambient electromagnetic radiation in relevant wavelengths. The opposing electrode may be a reflective material so that light which has passed through the cell without being absorbed is reflected back through the cell.

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a first HOMO or LUMO energy level is "smaller than" a second HOMO or LUMO energy level if the first HOMO or LUMO energy level is closer to the vacuum level than the second HOMO or LUMO energy level. Similarly, a first HOMO or LUMO energy level is "larger than" a second HOMO or LUMO energy level if the first HOMO or LUMO energy level is further from the vacuum level than the second HOMO or LUMO energy level.

As used herein, two orbital energy levels are "equal" to one another as that term is used herein if their energies match to the tenth decimal place. For example, a LUMO energy of −3.70 eV would be considered "equal" to a LUMO energy of −3.79 eV for purposes of the present disclosure.

As used herein, $LUMO_{Acc}$ and $HOMO_{Acc}$ represent the Lowest Unoccupied Molecular Orbital energy level and the Highest Occupied Molecular Orbital energy level, respectively, of the at least one acceptor material.

As used herein, $LUMO_{Don}$ and $HOMO_{Don}$ represent the Lowest Unoccupied Molecular Orbital energy level and the Highest Occupied Molecular Orbital energy level, respectively, of the at least one donor material.

As used herein, $LUMO_{CS\text{-}WG}$ and $HOMO_{CS\text{-}WG}$ represent the Lowest Unoccupied Molecular Orbital energy level and the Highest Occupied Molecular Orbital energy level, respectively, of the at least one cathode-side wide energy gap material.

As used herein, $LUMO_{AS\text{-}WG}$ and $HOMO_{AS\text{-}WG}$ represent the Lowest Unoccupied Molecular Orbital energy level and the Highest Occupied Molecular Orbital energy level, respectively, of the at least one anode-side wide energy gap material.

As used herein, $LUMO_{EC}$ and $HOMO_{EC}$ represent the Lowest Unoccupied Molecular Orbital energy level and the Highest Occupied Molecular Orbital energy level, respectively, of the at least one electron conducting material.

As used herein, $LUMO_{HC}$ and $HOMO_{HC}$ represent the Lowest Unoccupied Molecular Orbital energy level and the Highest Occupied Molecular Orbital energy level, respectively, of the at least one hole conducting material.

As used herein, a HOMO-LUMO energy gap is the energy difference between the HOMO and LUMO of a material.

As used herein, the term "between" in the context of listed ranges of glass transition temperature ($T_g$) values for wide energy gap materials is meant to include endpoint values.

The devices of the present disclosure comprise at least one exciton-blocking charge carrier filter. For example, a schematic of an organic photosensitive optoelectronic device according to the present disclosure is shown in FIG. 1. Electrode 110 comprises an anode or cathode. Electrode 140 comprises an anode when electrode 110 comprises a cathode. Electrode 140 comprises a cathode when electrode 110 comprises an anode. A photoactive region comprises donor/acceptor organic layers 120 and 130 to form a donor-acceptor heterojunction as described herein. The photoactive region may comprise additional donor and/or acceptor layers to form, e.g., a hybrid planar-mixed heterojunction. Organic layer 120 comprises at least one donor material or at least one acceptor material. Organic layer 130 comprises at least one donor material when layer 120 comprises at least one acceptor material. Organic layer 130 comprises at least one acceptor material when layer 120 comprises at least one donor material. It is noted that the donor/acceptor layers in FIG. 1 need not be planar. That is, the present disclosure contemplates all types of donor-acceptor heterojunctions known in the art for organic photovoltaic devices, including those specifically described herein.

In device A of FIG. 1, layer 115 is an exciton-blocking electron filter when electrode 110 comprises a cathode, organic layer 120 comprises at least one acceptor material, organic layer 130 comprises at least one donor material, and electrode 140 comprises an anode. Layer 115 is an exciton-blocking hole filter when electrode 110 comprises an anode, organic layer 120 comprises at least one donor material, organic layer 130 comprises at least one acceptor material, and electrode 140 comprises a cathode.

In some embodiments, as in device B, the device includes both an exciton-blocking electron filter and an exciton-blocking hole filter. Layer 115 is an exciton-blocking electron filter when electrode 110 comprises a cathode, organic layer 120 comprises at least one acceptor material, organic layer 130 comprises at least one donor material, layer 135 is an exciton-blocking hole filter, and electrode 140 comprises an anode. Layer 115 is an exciton-blocking hole filter when electrode 110 comprises an anode, organic layer 120 comprises at least one donor material, organic layer 130 comprises at least one acceptor material, layer 135 is an exciton-blocking electron filter, and electrode 140 comprises a cathode.

While not shown in FIG. 1, devices A and B may comprise additional buffer layers or cap layers located between the exciton-blocking electron/hole filters and the nearest electrode.

The exciton-blocking electron filter is disposed between the cathode and the at least one acceptor material and comprises a mixture comprising at least one cathode-side wide energy gap material and at least one electron conducting material. The at least one cathode-side wide energy gap material has:
  a Lowest Unoccupied Molecular Orbital energy level ($LUMO_{CS\text{-}WG}$) smaller than or equal to the $LUMO_{Acc}$;
  a Highest Occupied Molecular Orbital energy level ($HOMO_{CS\text{-}WG}$) larger than, equal to, or within 0.3 eV smaller than the $HOMO_{Acc}$; and
  a $HOMO_{CS\text{-}WG}$-$LUMO_{CS\text{-}WG}$ energy gap wider than a $HOMO_{Acc}$-$LUMO_{Acc}$ energy gap.

The at least one electron conducting material has a Lowest Unoccupied Molecular Orbital energy level ($LUMO_{EC}$) larger than, equal to, or within 0.3 eV smaller than the $LUMO_{Acc}$, such as within 0.2 eV smaller.

To extend the operational lifetime of the device by utilizing morphologically stable material, some embodiments of the invention utilize a cathode-side wide energy gap material having a glass transition temperature that is sufficiently high, e.g., higher than the temperature or temperature range at which the device typically operates, higher than a highest operating temperature of the device, higher than a threshold temperature value, etc.

In some embodiments, the $HOMO_{CS\text{-}WG}$ is larger than the $HOMO_{Acc}$, such as at least 0.2 eV larger, at least 0.3 eV larger, at least 0.5 eV larger, at least 1 eV larger, at least 1.5 eV larger, or at least 2 eV larger, and the $LUMO_{CS\text{-}WG}$ is smaller than the $LUMO_{Acc}$, such as at least 0.2 eV smaller, at least 0.3 eV smaller, at least 0.5 eV smaller, at least 1 eV smaller, at least 1.5 eV smaller, or at least 2 eV smaller.

In some embodiments, the $LUMO_{EC}$ is equal to the $LUMO_{Acc}$.

In some embodiments, the $LUMO_{EC}$ is larger than the $LUMO_{Acc}$, such as within 0.5 eV larger, within 0.4 eV larger, within 0.3 eV larger, or within 0.2 eV larger.

In some embodiments, the $LUMO_{EC}$ is no more than 0.1 eV smaller or larger than the $LUMO_{Acc}$.

In some embodiments, the $LUMO_{CS\text{-}WG}$ is smaller than the $LUMO_{EC}$, such as at least 0.2 eV smaller, at least 0.3 eV smaller, at least 0.5 eV smaller, at least 1 eV smaller, at least 1.5 eV smaller, or at least 2 eV smaller.

In some embodiments, the $LUMO_{CS\text{-}WG}$ is more than 0.2 eV smaller than the $LUMO_{Acc}$, such as more than 0.3 eV smaller, more than 0.5 eV smaller, more than 1 eV smaller, more than 1.5 eV smaller, or more than 2 eV smaller.

In some embodiments, the at least one cathode-side wide energy gap material comprises a material chosen from bathocuproine (BCP), bathophenanthroline (BPhen), p-Bis(triphenylsilyl)benzene (UGH-2), (4,4'-N,N'-dicarbazole)biphenyl (CBP), N,N'-dicarbazolyl-3,5-benzene (mCP), poly(vinylcarbazole) (PVK), phenanthrene and alkyl and/or aryl substituted phenanthrenes, alkyl and/or aryl substituted derivatives of benzene, triphenylene and alkyl and/or aryl substituted triphenylenes, aza-substituted triphenylenes, oxidiazoles, triazoles, aryl-benzimidazoles, adamantane and alkyl and/or aryl substituted adamantanes, tetraarylmethane and its derivatives, 9,9-dialkyl-fluorene and its oligomers, 9,9-diaryl-fluorene and its oligomers, spiro-biphenyl and substituted derivatives, corannulene and its alkyl and/or aryl substituted derivatives, and derivatives thereof.

The operational lifetime of the devices may be increased by utilizing a cathode-side wide energy gap material that has a sufficiently high $T_g$, e.g., higher than the temperature or temperature range at which the device typically operates, higher than a highest operating temperature of the device, higher than a threshold temperature value, etc. For example, as seen in FIGS. 31A-C and 32A-D, the performance over time (i.e., normalized responsivity, fill factor, Voc, and PCE) of an exciton-blocking charge carrier filter comprising a mixture of Bphen:$C_{60}$ ($T_g$ of Bphen≈62° C.) degrades faster as the operating temperature increases from 50° C. to 80° C. than an exciton-blocking charge carrier filter comprising a mixture of TPBi:$C_{70}$ ($T_g$ of TPBi≈122° C.) as the operating temperature increases from 50° C. to 130° C. That is, the performance of the device utilizing TPBi:$C_{70}$ degrades more slowly over time even at higher operating temperatures than the device utilizing BPhen. Thus, the efficiency and operational lifetime of a device can be improved by, for example, replacing Bphen and blocking materials with similar $T_g$ values with a cathode-side wide energy gap material having a higher $T_g$, such as TPBi.

In some embodiments, the at least one cathode-side wide energy gap material comprises a material having a sufficiently high $T_g$, e.g., higher than the temperature or temperature range at which the device typically operates, higher than a highest operating temperature of the device, higher than a threshold temperature value, etc. For example, in some embodiments, the at least one cathode-side wide energy gap material comprises a material chosen from 3,3',5,5'-Tetra[(m-pyridyl)-phen-3-yl]biphenyl (BP4mPy), 2,2',2"-(1,3,5-Benzinetriyl)-tris(1-phenyl-1-H-benzimidazole) (TPBi), Bis(2-methyl-8-quinolinolate)-4-(phenylphenolato)aluminium (BAlq), Tris(8-hydroxy-quinolinato)aluminium (Alq3), Tris(2,4,6-trimethyl-3-(pyridin-3-yl)phenyl)borane (3TPYMB), 4,40-(1,3-phenylene)bis(2,6-dip-tolylpyridine-3,5-dicarbonitrile) (m-MPyCN), 4,40-(1,3-phenylene)bis(2,6-di(biphenyl-4-yl)pyridine-3,5-dicarbonitrile) (m-PhPyCN), 4,40-(1,3-phenylene)bis(2,6-diphenylpyridine-3,5-dicarbonitrile) (m-PyCN), 6,60-(1,4-phenylene)bis(2-phenyl-4-p-tolylnicotinonitrile)(p-PPtNN), 4,40-(1,4-phenylene)bis(2-phenyl-6-p-tolylnicotinonitrile) (p-PPtNT), Tris(6-fluoro-8-hydroxy-quinolinato)aluminium (6FAlq3), 2,6-bis(4-cyanophenyl)-4-phenylpyridine-3,5-dicarbonitrile (CNPyCN), 4,40-(1,4-phenylene)bis(2,6-dip-tolylpyridine-3,5-dicarbonitrile) (p-MPyCN), Bisbenzimidazo[2,1-a:1',2-b']anthra[2,1,9-def:6,5,10-d'e'f'] diisoguinoline-10,21-dione (PTCBI), 5,10,15-tribenzyl-5H-diindolo[3,2-a:3',2'-c]carbazole (TBDI), 5,10,15-triphenyl-5H-diindolo[3,2-a:3',2'-c]carbazole (TPDI), 1,3-bis[3,5-di(pyridin-3-yl)phenyl]benzene (BmPyPhB), 1,3,5-Tri(m-pyridin-3-ylphenyl)benzene, 1,3,5-Tris(3-pyridyl-3-phenyl) benzene, 3,3'45'-[3-(3-pyridinyl)phenyl][1,1':3',1"-terphenyl]-3,3"-diyl]bispyridine (TmPyPB), 9,9-dimethyl-10-(9-phenyl-9H-carbazol-3-yl)-9,10-dihydroacridine (PCZAC), 3,3-Di(9H-carbazol-9-yl)biphenyl (mCBP), 4,40-bis(triphenylsilyl)-biphenyl (BSB), and derivatives thereof.

In some embodiments the glass transition temperature of the cathode-side wide energy gap material is equal to or greater than 85° C., equal to or greater than 95° C., equal to or greater than 105° C., equal to or greater than 115° C., equal to or greater than 125° C., equal to or greater than 135° C., equal to or greater than 145° C., equal to or greater than 155° C., equal to or greater than 165° C., equal to or greater than 175° C., equal to or greater than 185° C., equal to or greater than 195° C., equal to or greater than 200° C., equal to or greater than 225° C., or equal to or greater than 250° C.

In some embodiments, the glass transition temperature of the cathode-side wide energy gap material is between 85-200° C., such as between 90-195° C., between 95-190° C., between 100-185° C., between 105-180° C., between 110-175° C., between 115-170° C., or between 120-165° C. It is noted that materials having glass transition temperatures greater than 200° C. may be used, such as between 200-300° C., 200-275° C., 200-250° C., or 200-225° C.

The operating temperature of the device may vary and depend on a number of factors, such as, for example, ambient conditions (e.g., temperature, light intensity, etc.) and whether enhancement mechanisms (e.g., solar concentrators) are used in conjunction with the device. For instance, the ambient temperature may vary depending on the geographic location of the device, time of year, time of day, etc. Similarly, light intensity may also depend on the geographic location, time of year, and time of day, as well as the amount of cloud cover, angle of incidence, and other factors. Accordingly, in some embodiments, the cathode-side wide energy gap material has a sufficiently high $T_g$, e.g., higher than the temperature or temperature range at which the device typically operates (e.g., at normal ambient conditions), higher than the highest operating temperature of the device under normal ambient conditions, etc.

In some embodiments, a solar concentrator may be integrated with or used in conjunction with the device to increase, magnify, or otherwise enhance light directed at the device. The use of concentrators and/or other enhancement mechanisms may raise the operating temperature of the device beyond that experienced by the device under normal ambient conditions. Accordingly, to increase the stability and operational lifetime of the device, the cathode-side wide energy gap material may have a $T_g$ that is higher than the highest operating temperature experienced by the device under enhanced lighting conditions.

In some embodiments, the at least one acceptor material comprises a material chosen from subphthalocyanines, sub-naphthalocyanines, dipyrrin complexes, such as zinc dipyrrin complexes, BODIPY complexes, perylenes, naphthalenes, fullerenes and fullerene derivatives (e.g., PCBMs, ICBA, ICMA, etc.), and polymers, such as carbonyl substituted polythiophenes, cyano-substituted polythiophenes, polyphenylenevinylenes, or polymers containing electron deficient monomers, such as perylene diimide, benzothiadiazole or fullerene polymers. Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60] PCBM), Phenyl-$C_{71}$-Butyric-Acid-Methyl Ester ([70] PCBM), or Thienyl-$C_{61}$-Butyric-Acid-Methyl Ester ([60] ThCBM), and other acceptors such as 3,4,9,10- perylenetetracarboxylic-bisbenzimidazole (PTCBI), hexadecafluorophthalocyanine ($F_{16}CuPc$), and derivatives thereof.

In some embodiments, the at least one electron conducting material comprises a material chosen from subphthalocyanines, subnaphthalocyanines, dipyrrin complexes, such as zinc dipyrrin complexes and BODIPY complexes, perylenes, naphthalenes, fullerenes and fullerene derivatives (e.g., PCBMs, ICBA, ICMA, etc.), and polymers, such as carbonyl substituted polythiophenes, cyano-substituted polythiophenes, polyphenylenevinylenes, or polymers containing electron deficient monomers, such as perylene diimide, benzothiadiazole or fullerene polymers. Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}CuPc$), and derivatives thereof.

In some embodiments, the at least one acceptor material comprises a material chosen from fullerenes and functionalized fullerene derivatives. In some embodiments, the at least one electron conducting material comprises a material chosen from fullerenes and functionalized fullerene derivatives.

Fullerenes are of particular interest for use as the at least one electron conducting material. $C_{60}$, for example, has an absorption spectrum in solution that is dominated by two features with peaks at wavelengths of 260 nm and 340 nm that are attributed to allowed electronic transitions resulting in Frenkel-type (i.e., monomolecular) excited states, while the absorption at longer wavelengths is due to a symmetry-forbidden transition. On transition from solution to the solid state, $C_{60}$, for example, experiences a significant increase in absorption between $\lambda=400$ and 550 nm due to the emergence of an intermolecular charge transfer (CT) state resulting from the excitation of an electron from the HOMO of one fullerene into the LUMO of its nearest neighbors. When mixing $C_{60}$ with a cathode-side wide energy gap material, such as BCP, the CT state absorption declines more rapidly than that of the Frenkel-type feature. Thus, fullerenes when mixed with a cathode-side wide energy gap material can be used as a good electron conducting material, with diminished absorptivity (even at moderate dilutions, such as 70% $C_{60}$ and 30% wide gap material), so as not to generate excitons in the fullerene electron conducting material that would otherwise fail to contribute to the device's efficiency.

In some embodiments, the at least one electron conducting material comprises a material chosen from $C_{60}$ and $C_{70}$.

In some embodiments, the at least one acceptor material and the at least one electron conducting material comprise the same material. In certain embodiments, the same material is a fullerene or functionalized fullerene derivative. In certain embodiments, the same material is $C_{60}$ or $C_{70}$. In some embodiments, the at least one acceptor material and the at least one electron conducting material comprise different materials.

In some embodiments, the at least one acceptor material and the at least one electron conducting material are chosen from different fullerenes and functionalized fullerene derivatives.

In some embodiments, the mixture comprises the at least one cathode-side wide energy gap material and the at least one electron conducting material at a ratio ranging from about 10:1 to 1:10 by volume, such as about 8:1 to 1:8 by volume, about 6:1 to 1:6 by volume, about 4:1 to 1:4 by volume, or about 2:1 to 1:2 by volume. In certain embodiments, the ratio is about 1:1. It should be understood that the identified ratios include integer and non-integer values.

In some embodiments, the donor-acceptor heterojunction is chosen from a mixed heterojunction, bulk heterojunction, planar heterojunction, and hybrid planar-mixed heterojunction. In certain embodiments, the donor-acceptor heterojunction is a hybrid planar-mixed heterojunction (PM-HJ). For example, in the PM-HJ structure, there are two principal loss mechanisms that can lead to low FF. One is bimolecular recombination of free charge carriers in the extensive donor-acceptor blended region of the PM-HJ structure whose rate is given by $k_{BM}=\gamma \cdot n \cdot p$. Here, $\gamma$ is the Langevin recombination constant, and n (p) is the free electron (hole) density. A second significant loss is due to exciton-polaron quenching in the neat acceptor layer. The electron-polaron build-up has been observed at the neat acceptor/blocking layer interface that results in quenching and, therefore, a reduction of internal quantum efficiency (IQE). Note that exciton-polaron quenching follows a similar relationship to bimolecular recombination, as both exciton and polaron concentrations are proportional to intensity. Both mechanisms can result in a loss in photocurrent under forward bias that increases the slope of current density-voltage (J-V) characteristics in the fourth quadrant, ultimately decreasing both FF and PCE.

The exciton-blocking electron filter disposed between the photoactive region and the cathode can increase the efficiency of bilayer OPV cells. The electron conducting material efficiently conducts electron-polarons and the wide energy gap material blocks excitons. Exciton-polaron quenching can be significantly reduced in bilayer cells employing the electron filter due to its ability to spatially separate excitons and polarons at the blocking interface. In turn, this can lead to a significant increase in $J_{SC}$, while $V_{OC}$ and FF remained unchanged. PM-HJ cells additionally suffer from bimolecular recombination in the mixed photoactive layer. The filters (mixed layers) of the present disclosure, however, result in a reduced interfacial field with the active layer due to its increased conductivity compared to a neat, conventional blocking buffer layer. The resulting increase in field across the photosensitive region leads to more rapid charge extraction. This, in turn, leads to reduced bimolecular recombination in the cell.

In some embodiments, the device further comprises at least one additional buffer layer or cap layer disposed between the exciton-blocking electron filter and the cathode. In some embodiments, the at least one cap layer has a LUMO energy level larger than, equal to, or within 0.3 eV smaller than the $LUMO_{EC}$, such as within 0.2 eV smaller, in order to conduct electrons to the cathode. In certain embodiments, the LUMO energy level of the cap layer is within 0.5 eV larger than the $LUMO_{EC}$, such as within 0.4 eV larger, within 0.3 eV larger, or within 0.2 eV larger. In some embodiments, the cap layer has a LUMO energy level no more than 0.1 eV smaller or larger than the $LUMO_{EC}$. In some embodiments, the at least one cap layer is chosen from fullerenes and functionalized fullerene derivatives. In some embodiments, the at least one cap layer comprises PTCBI.

In some embodiments, the cap layer comprises a material having a LUMO energy level that does not facilitate conduction of electrons to the cathode. In these embodiments, the cap layer may be sufficiently thin so as to transport electrons through damaged induced states. In some embodiments, the at least one cap layer comprises a material chosen from BCP, BPhen, UGH-2, and CBP.

In some embodiments, the at least one cap layer and the at least one electron conducting material comprise the same material. In some embodiments, the at least one cap layer, the at least one electron conducting material, and the at least one acceptor material comprise the same material.

In some embodiments, the at least one cap layer and the at least one cathode-side wide energy gap material comprise the same material.

The exciton-blocking hole filter is disposed between the anode and the at least one donor material and comprises a mixture comprising at least one anode-side wide energy gap material and at least one electron conducting material. The at least one anode-side wide energy gap material has:

- a Highest Occupied Molecular Orbital energy level (HOMO$_{AS-WG}$) larger than or equal to the HOMO$_{Don}$;
- a Lowest Unoccupied Molecular Orbital energy level (LUMO$_{AS-WG}$) smaller than, equal to, or within 0.3 eV larger than the LUMO$_{Don}$; and
- a HOMO$_{AS-WG}$-LUMO$_{AS-WG}$ energy gap wider than a HOMO$_{Don}$-LUMO$_{Don}$ energy gap.

The at least one hole conducting material has a Highest Occupied Molecular Orbital energy level (HOMO$_{HC}$) smaller (closer to the vacuum) than, equal to, or within 0.2 eV larger (further from the vacuum) than the HOMO$_{Don}$.

To extend the operational lifetime of the device by utilizing morphologically stable material, some embodiments of the invention utilize an anode-side wide energy gap material having a glass transition temperature that is sufficiently high, e.g., higher than the temperature or temperature range at which the device typically operates, higher than a highest operating temperature of the device, higher than a threshold temperature value, etc.

In some embodiments, the HOMO$_{AS-WG}$ is larger than the HOMO$_{Don}$, such as at least 0.2 eV larger, at least 0.3 eV larger, at least 0.5 eV larger, at least 1 eV larger, at least 1.5 eV larger, or at least 2 eV larger, and the LUMO$_{AS-WG}$ is smaller than the LUMO$_{Don}$, such as at least 0.2 eV smaller, at least 0.3 eV smaller, at least 0.5 eV smaller, at least 1 eV smaller, at least 1.5 eV smaller, or at least 2 eV smaller.

In some embodiments, the HOMO$_{HC}$ is equal to the HOMO$_{Don}$.

In some embodiments, the HOMO$_{HC}$ is smaller than the HOMO$_{Don}$, such as within 0.5 eV smaller, within 0.4 eV smaller, within 0.3 eV smaller, or within 0.2 eV smaller.

In some embodiments, the HOMO$_{HC}$ is no more than 0.1 eV smaller or larger than the HOMO$_{Don}$.

In some embodiments, the HOMO$_{AS-WG}$ is larger than the HOMO$_{HC}$, such as at least 0.2 eV larger, at least 0.3 eV larger, at least 0.5 eV larger, at least 1 eV larger, at least 1.5 eV larger, or at least 2 eV larger.

In some embodiments, the HOMO$_{AS-WG}$ is more than 0.2 eV larger than the HOMO$_{Don}$, such as more than 0.3 eV larger, more than 0.5 eV larger, more than 1 eV larger, more than 1.5 eV larger, or more than 2 eV larger.

In some embodiments, the at least one anode-side wide energy gap material comprises a material chosen from tetraaryl-benzindines, such as N,N'-diphenyl-N,N'-bis(1-naphthyl)-1-1'biphenyl-4,4'diamine (NPD) and N,N'-bis-(3-methylphenyl)-N,N'-bis-(phenyl)-benzidine (TPD), triaryl amines, 5,10-disubstituted anthracenes, oligothiophenes, 9,9-dialkyl-fluorene and oligomers thereof, 9,9-diaryl-fluorene and oligomers thereof, oligophenylenes, spiro-biphenyl and substituted derivatives thereof, and derivatives thereof.

The operational lifetime of the devices may be increased by utilizing an anode-side wide energy gap material that has a sufficiently high $T_g$, e.g., higher than the temperature or temperature range at which the device typically operates, higher than a highest operating temperature of the device, higher than a threshold temperature value, etc. For example, in some embodiments, the at least one anode-side wide energy gap material comprises a material chosen from 3,3',5,5'-Tetra[(m-pyridyl)-phen-3-yl]biphenyl (BP4mPy), 2,2',2''-(1,3,5-Benzinetriyl)-tris(1-phenyl-1-H-benzimidazole) (TPBi), Bis(2-methyl-8-quinolinolate)-4-(phenylphenolato)aluminium (BAlq), Tris(8-hydroxy-quinolinato)aluminium (Alq3), Tris(2,4,6-trimethyl-3-(pyridin-3-yl)phenyl)borane (3TPYMB), 4,40-(1,3-phenylene)bis(2,6-dip-tolylpyridine-3,5-dicarbonitrile) (m-MPyCN), 4,40-(1,3-phenylene)bis(2,6-di(biphenyl-4-yl)pyridine-3,5-dicarbonitrile) (m-PhPyCN), 4,40-(1,3-phenylene)bis(2,6-diphenylpyridine-3,5-dicarbonitrile) (m-PyCN), 6,60-(1,4-phenylene)bis(2-phenyl-4-p-tolylnicotinonitrile)(p-PPtNN), 4,40-(1,4-phenylene)bis(2-phenyl-6-p-tolylnicotinonitrile) (p-PPtNT), Tris(6-fluoro-8-hydroxy-quinolinato)aluminium (6FAlq3), 2,6-bis(4-cyanophenyl)-4-phenylpyridine-3,5-dicarbonitrile (CNPyCN), 4,40-(1,4-phenylene)bis(2,6-dip-tolylpyridine-3,5-dicarbonitrile) (p-MPyCN), Bisbenzimidazo[2,1-a:1',2-b']anthra[2,1,9-def:6,5,10-d'e'f'] diisoquinoline-10,21-dione (PTCBI), 5,10,15-tribenzyl-5H-diindolo[3,2-a:3',2'-c]carbazole (TBDI), 5,10,15-triphenyl-5H-diindolo[3,2-a:3',2'-c]carbazole (TPDI), 1,3-bis[3,5-di (pyridin-3-yl)phenyl]benzene (BmPyPhB), 1,3,5-Tri(m-pyridin-3-ylphenyl)benzene, 1,3,5-Tris(3-pyridyl-3-phenyl) benzene, 3,3'45'-[3-(3-pyridinyl)phenyl][1,1':3',1''-terphenyl]-3,3''-diyl]bispyridine (TmPyPB), 9,9-dimethyl-10-(9-phenyl-9H-carbazol-3-yl)-9,10-dihydroacridine (PCZAC), 3,3-Di(9H-carbazol-9-yl)biphenyl (mCBP), 4,40-bis(triphenylsilyl)-biphenyl (BSB), and derivatives thereof.

In some embodiments the glass transition temperature of the anode-side wide energy gap material is equal to or greater than 85° C., equal to or greater than 95° C., equal to or greater than 105° C., equal to or greater than 115° C., equal to or greater than 125° C., equal to or greater than 135° C., equal to or greater than 145° C., equal to or greater than 155° C., equal to or greater than 165° C., equal to or greater than 175° C., equal to or greater than 185° C., equal to or greater than 195° C., equal to or greater than 200° C., equal to or greater than 225° C., or equal to or greater than 250° C.

In some embodiments, the glass transition temperature of the anode-side wide energy gap material is between 85-200° C., between 90-195° C., between 95-190° C., between 100-185° C., between 105-180° C., between 110-175° C., between 115-170° C., between 120-165° C. It is noted that materials having glass transition temperatures greater than 200° C. may be used, such as between 200-300° C., 200-275° C., 200-250° C., or 200-225° C.

The operating temperature of the device may vary and depend on a number of factors, such as, for example, ambient conditions (e.g., temperature, light intensity, etc.) and whether enhancement mechanisms (e.g., solar concentrators) are used in conjunction with the device. For instance, the ambient temperature may vary depending on the geographic location of the device, time of year, time of day, etc. Similarly, light intensity may also depend on the geographic location, time of year, and time of day, as well as the amount of cloud cover, angle of incidence, and other factors. Accordingly, in some embodiments, the anode-side wide energy gap material has a sufficiently high $T_g$, e.g., higher than the temperature or temperature range at which the device typically operates (e.g., at normal ambient conditions), higher than the highest operating temperature of the device under normal ambient conditions, etc.

In some embodiments, a solar concentrator may be integrated with or used in conjunction with the device to increase, magnify, or otherwise enhance light directed at the device. The use of concentrators and/or other enhancement mechanisms may raise the operating temperature of the device beyond that experienced by the device under normal ambient conditions. Accordingly, to increase the stability and operational lifetime of the device, the anode-side wide energy gap material may have a $T_g$ that is higher than the highest operating temperature experienced by the device under enhanced lighting conditions.

In some embodiments, the at least one donor material comprises a material chosen from phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, tetraphenyldibenzoperiflanthene (DBP), and derivatives thereof. Examples of squaraine donor materials include but are not limited to 2,4-bis[4-(N,N-dipropylamino)-2,6-dihydroxyphenyl]squaraine, 2,4-bis[4-(N,Ndiisobutylamino)-2,6-dihydroxyphenyl]squaraine, 2,4-bis[4-(N,N-diphenylamino)-2,6-dihydroxyphenyl]squaraine (DPSQ).

In some embodiments, the at least one hole conducting material comprises a material chosen from phthalocyanines, such as copper phthalocyanine (CuPc), chloroaluminium phthalocyanine (ClAlPc), tin phthalocyanine (SnPc), zinc phthalocyanine (ZnPc), and other modified phthalocyanines, subphthalocyanines, such as boron subphthalocyanine (SubPc), naphthalocyanines, merocyanine dyes, boron-dipyrromethene (BODIPY) dyes, thiophenes, such as poly(3-hexylthiophene) (P3HT), low band-gap polymers, polyacenes, such as pentacene and tetracene, diindenoperylene (DIP), squaraine (SQ) dyes, tetraphenyldibenzoperiflanthene (DBP), and derivatives thereof. Examples of squaraine donor materials include but are not limited to 2,4-bis[4-(N,N-dipropylamino)-2,6-dihydroxyphenyl]squaraine, 2,4-bis[4-(N,Ndiisobutylamino)-2,6-dihydroxyphenyl]squaraine, 2,4-bis[4-(N,N-diphenylamino)-2,6-dihydroxyphenyl]squaraine (DPSQ).

In some embodiments, the at least one donor material and the at least one hole conducting material comprise the same material. In some embodiments, the at least one donor material and the at least one hole conducting material comprise different materials.

In some embodiments, the mixture comprises the at least one anode-side wide energy gap material and the at least one hole conducting material at a ratio ranging from about 10:1 to 1:10 by volume, such as about 8:1 to 1:8 by volume, about 6:1 to 1:6 by volume, about 4:1 to 1:4 by volume, or about 2:1 to 1:2 by volume. In certain embodiments, the ratio is about 1:1. It should be understood that the identified ratios include integer and non-integer values.

In some embodiments, the device further comprises at least one additional buffer layer or cap layer disposed between the exciton-blocking hole filter and the anode.

The organic photosensitive optoelectronic devices disclosed herein can be grown or placed on any substrate that provides desired structural properties. Thus, in some embodiments, the device further comprises a substrate. For example, the substrate may be flexible or rigid, planar or non-planar. The substrate may be transparent, translucent or opaque. The substrate may be reflective. Plastic, glass, metal, and quartz are examples of rigid substrate materials. Plastic and metal foils and thin glass are examples of flexible substrate materials. The material and thickness of the substrate may be chosen to obtain the desired structural and optical properties.

Organic photosensitive optoelectronic devices of the present disclosure may function, for example, as PV devices, such as solar cells, photodetectors, or photoconductors.

Whenever the organic photosensitive optoelectronic devices described herein function as a PV device, the materials used in the photoconductive organic layers and the thicknesses thereof may be selected, for example, to optimize the external quantum efficiency of the device. For example, appropriate thicknesses can be selected to achieve the desired optical spacing in the device and/or reduce resistance in the device. Whenever the organic photosensitive optoelectronic devices described herein function as photodetectors or photoconductors, the materials used in the photoconductive organic layers and the thicknesses thereof may be selected, for example, to maximize the sensitivity of the device to desired spectral regions.

In addition, the devices may further comprise at least one smoothing layer. A smoothing layer may be located, for example, between the photoactive layers and either or both of the electrodes. A film comprising 3,4 polyethylenedioxythiophene:polystyrenesulfonate (PEDOT:PSS) is an example of a smoothing layer.

The organic photosensitive optoelectronic devices of the present disclosure may exist as a tandem device comprising two or more subcells. A subcell, as used herein, means a component of the device which comprises at least one donor-acceptor heterojunction. When a subcell is used individually as a photosensitive optoelectronic device, it typically includes a complete set of electrodes. A tandem device may comprise charge transfer material, electrodes, or charge recombination material or a tunnel junction between the tandem donor-acceptor heterojunctions. In some tandem configurations, it is possible for adjacent subcells to utilize common, i.e., shared, electrode, charge transfer region or charge recombination zone. In other cases, adjacent subcells do not share common electrodes or charge transfer regions. The subcells may be electrically connected in parallel or in series.

In some embodiments, the charge transfer layer or charge recombination layer may be chosen from Al, Ag, Au, MoO$_3$, Li, LiF, Sn, Ti, WO3, indium tin oxide (ITO), tin oxide (TO), gallium indium tin oxide (GITO), zinc oxide (ZO), or zinc indium tin oxide (ZITO). In another embodiment, the charge transfer layer or charge recombination layer may be comprised of metal nanoclusters, nanoparticles, or nanorods.

According to another embodiment, the devices of the present disclosure may comprise an exciton-blocking charge carrier filter, as described herein, disposed between a first subcell and a second subcell of a device that comprises two or more subcells. For example, schematics of organic tandem photosensitive optoelectronic devices according to the present disclosure are shown in FIG. 29. Electrode 110 comprises an anode or cathode. Electrode 140 comprises an anode when electrode 110 comprises a cathode. Electrode 140 comprises a cathode when electrode 110 comprises an anode. The tandem devices include two photoactive regions 150 and 160. Each of these regions may comprise donor and acceptor organic materials to form donor-acceptor heterojunctions as described herein.

In device A of FIG. 29, layer 115 may be an exciton-blocking electron filter as described herein. In some embodiments, layer 115 may be an exciton-blocking hole filter as described herein. The layer 115 is disposed between the photoactive regions 150 and 160 of the subcells. In still other embodiments, as depicted by device B of FIG. 29, a tandem device may include additional exciton-blocking charge carrier filters. For example, the tandem photosensitive device may include two charge carrier filters disposed between the subcells. In this configuration, if exciton blocking charge filter 115 is an exciton blocking hole filter, then exciton blocking charge filter 135 is an exciton blocking electron filter, and vice versa. The tandem device may also further include exciton blocking charge carrier filters disposed between a photoactive region and an electrode, such as between the photoactive region 150 and the electrode 140.

Although not shown in FIG. 29, Devices A and B may further comprise an additional separating layer disposed between the subcells. The separating layer may comprise at least one electrode, at least one charge transfer layer, or at least one charge recombination layer. For example, in Device A, the separating layer may be disposed between exciton blocking charge filter 115 and either photoactive region 150 or photoactive region 160, and is optionally adjacent to the exciton blocking charge filter 115. In some embodiments, the separating layer is a charge recombination layer as known in the art or otherwise described herein.

As a further example, in Device B, the separating layer may be disposed between exciton blocking charge filter 115 and exciton blocking charge filter 135, and is optionally adjacent to either or both of layers 115 and 135. In some embodiments, the separating layer is a charge recombination layer as known in the art or otherwise described herein.

To illustrate, in device A of FIG. 29, if a charge recombination layer is disposed between layer 115 and photoactive region 150 and when the electrode 110 comprises a cathode, the layer 115 may be an exciton-blocking hole filter that blocks excitons and conducts holes from the photoactive region 160 to the charge recombination layer.

Alternatively, in the same configuration, except when the electrode 110 is an anode, the layer 115 may be an exciton-blocking electron filter that blocks excitons and conducts electrons from the photoactive region 160 to the charge recombination layer.

A tandem device could also include two or more exciton-blocking charge filters disposed between the subcells, as depicted by device B of FIG. 29. If a charge recombination layer is disposed between layers 115 and 135, when the electrode 110 comprises a cathode, the layer 135 may be an exciton-blocking hole filter that blocks excitons and conduct holes from the photoactive region 160 to the charge recombination layer. The layer 115 may be an exciton-blocking electron filter that blocks excitons and conducts electrons from the photoactive region 150 to the charge recombination layer.

Alternatively, in the same configuration, except when the electrode 110 is an anode, the layer 135 may be an exciton-blocking electron filter that blocks excitons and conducts electrons from the photoactive region 160 to the charge recombination layer. The layer 115 may be an exciton-blocking hole filter that blocks excitons and conducts holes from the photoactive region 150 to the charge recombination layer.

An advantage of the present disclosure is that the exciton-blocking charge carrier filters may be transparent because they utilize wide energy gap materials. By mixing a transparent wide energy gap material with an electron or hole conducting material, the electron or hole conducting material may be sufficiently diluted, rendering the exciton-blocking charge carrier filter transparent at relevant wavelengths. An exciton-blocking charge carrier filter is said to be "transparent" when it permits at least 50% of the incident electromagnetic radiation at relevant wavelengths to be transmitted through it. In some embodiments, the filters permit at least 60%, at least 70%, at least 80%, at least 90%, or approximately 100% of incident electromagnetic radiation at relevant wavelengths to be transmitted through it. The charge carrier filters are said to be optically lossless when they absorb very little (<1%) electromagnetic radiation in relevant wavelengths.

In various embodiments, the devices may employ one or more buffer layers that are preferably transparent throughout the visible spectrum. Charge collecting/transporting buffer layers, for example, may be between the photoactive regions and the corresponding electrodes. Charge collecting/transporting buffer layers may also be disposed, for example, between the separating layer and a photoactive region. In certain embodiments, the charge collecting/transporting layers comprise a material chosen from metal oxides. In certain embodiments, the metal oxides are chosen from $MoO_3$, $V_2O_5$, $ZnO$, and $TiO_2$.

Layers and materials may be deposited using techniques known in the art. For example, the layers and materials described herein can be deposited or co-deposited from a solution, vapor, or a combination of both. In some embodiments, organic materials or organic layers can be deposited or co-deposited via solution processing, such as by one or more techniques chosen from spin-coating, spin-casting, spray coating, dip coating, doctor-blading, inkjet printing, or transfer printing.

In other embodiments, organic materials may be deposited or co-deposited using vacuum evaporation, such as vacuum thermal evaporation, organic vapor phase deposition, or organic vapor-jet printing.

The exciton-blocking charge carrier filters of the present disclosure, which comprise a mixture of materials, may be fabricated by varying deposition conditions. For example, the concentration of each material in the mixture can be controlled by varying the deposition rate of each material.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

EXAMPLES

Example 1

$C_{60}$ and bathocuproine (BCP) were mixed at various concentrations to form an exciton-blocking electron filter. BCP is a wide-energy gap material with higher singlet (3.17 eV) and triplet (2.62 eV) energies than $C_{60}$ (1.86 eV singlet, 1.55 eV triplet) and a LUMO (−1.6 eV), making BCP an inert dopant and preventing both energy and electron transfer from $C_{60}$. The doped $C_{60}$:BCP film effectively blocks excitons, while still conducting electrons. Based on these properties, the doped films were applied as a buffer layer/filter resulting in improved device performance compared to devices with other buffers.

Figure 2:
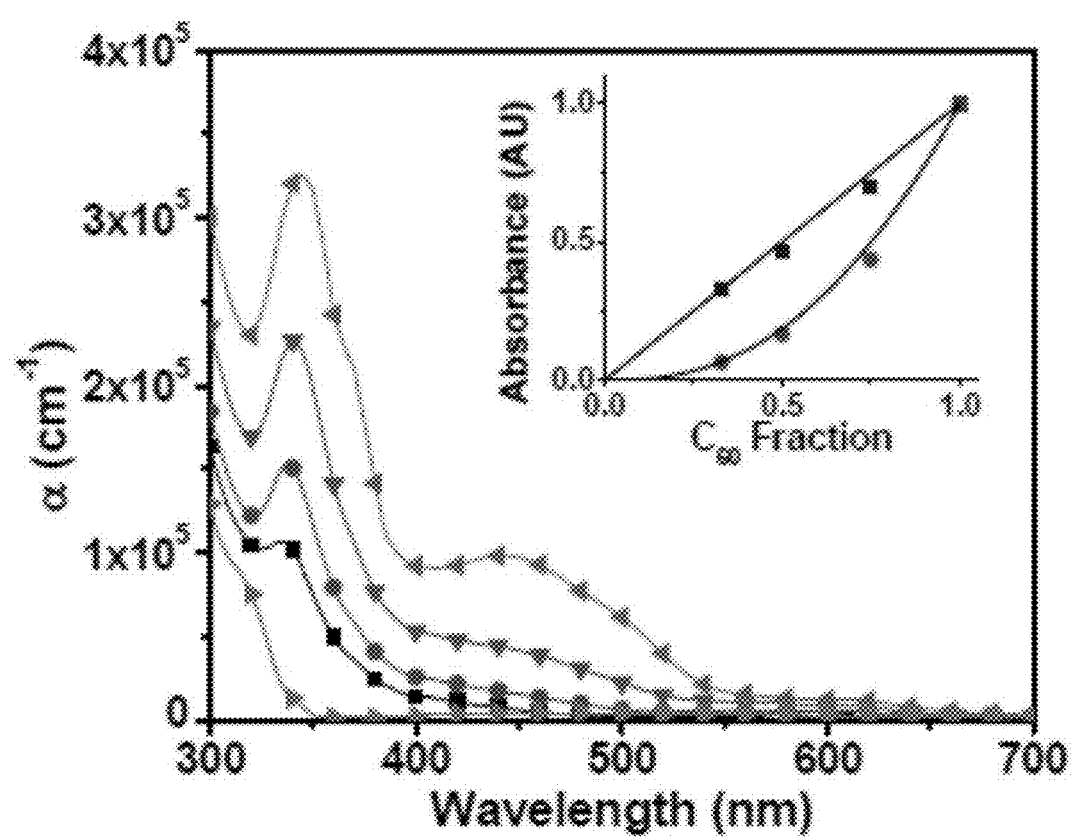
FIG. 2 shows extinction spectra of $C_{60}$:BCP films with volume doping ratios of 1:0 (◄), 3:1 (▼), 1:1 (●), 1:2 (■), and 0:1 (►) calculated from k determined by spectroscopic ellipsometry. Inset: Decay of extinction as a function of $C_{60}$ fraction. 450 nm (■), 360 nm (●).

The effect of BCP doping on fullerene absorption was investigated by fabrication of $C_{60}$:BCP films at various volume ratios. The absorption spectra of the neat and doped $C_{60}$ films are shown in FIG. 2. When the fraction of $C_{60}$ decreases, the absorption diminishes and approaches that of BCP. However, the decay of the two absorption peaks at 340 nm and 450 nm, which correspond to Frenkel and charge transfer (CT) excitons, respectively, adopted quite different rates as depicted in the inset of FIG. 2. The extinction coefficient of the allowed Frenkel transition at 340 nm has been fitted to a linear decay with $C_{60}$ fraction as predicted by Beer's law, reflecting the monomolecular nature of this transition. Interestingly, the extinction coefficient of the intermolecular CT absorption at 450 nm exhibited an exponential decay and was fitted to the equation $\alpha=x^{-14}$ where x is the $C_{60}$ volume fraction. This implied that the formation of CT excitons involves 2-3 molecules. The absorption spectra of the $C_{60}$:BCP films showed that the doping concentration displays a significant effect on the CT exciton, suppressing its formation even at modest doping levels.

Example 2

Devices were fabricated as follows: Glass substrates coated with patterned ITO (width of patterned stripes were 2 mm, thickness=150±10 nm; sheet resistance=20±5 Ωcm−2; transmission 84% at 550 nm; courtesy of Thin Film Devices, Inc.) were cleaned with soap and boiled in tetrachloroethylene, acetone and propanol (5 min. each). ITO substrates were exposed to ozone atmosphere (UVOCS T10X10/OES) for 10 min immediately before loading into the high vacuum chamber. Deposition rates for layers of neat materials were as follows: $MoO_x$ (0.02 nm/s), NPD (0.1 nm/s), $C_{60}$ (0.1 nm/s), BCP (0.1 nm/s) and Al (0.2 nm/s). Deposition rates for doped films ($C_{60}$:BCP content by volume) were as follows: $C_{60}$:BCP (2:1)—codeposition $C_{60}$ (0.08 nm/s):BCP (0.04 nm/s); $C_{60}$:BCP (1:1)—codeposition $C_{60}$ (0.06 nm/s):BCP (0.06 nm/s); $C_{60}$:BCP (1:2)—codeposition $C_{60}$ (0.04 nm/s):BCP (0.08 nm/s). After organic depositions, masks with 2 mm stripe width were placed on substrates under $N_2$, and 100 nm of Al cathode was deposited. The area of the devices was 4 $mm^2$.

In order to observe an unambiguous photoresponse from $C_{60}$, bilayer devices using the wide gap, hole transporting material N,N'-di-[(1-naphthyl)-N,N'-diphenyl]-1,1'-biphenyl)-4,4'-diamine (NPD) as the donor, with the structure illustrated in FIG. 3, were fabricated. The neat layer of $C_{60}$ at the D/A interface was meant to preserve the thermodynamics and kinetics of charge separation so that all changes observed between devices will be related to the bulk of the doped films instead of interfacial effects.

The current-voltage (J-V) characteristics under simulated AM1.5G illumination with 1 sun intensity (100 mW/$cm^2$) and external quantum efficiency (EQE) curves of the devices are shown in FIG. 3. As the doping concentration of the $C_{60}$:BCP layer increased from 1:0 to 1:2, short circuit current ($J_{sc}$) decreased by 1.7 mA/$cm^2$ from 3.0±0.1 mA/$cm^2$ to 1.3±0.1 mA/$cm^2$, as shown in Table 1. This decrease was due to the drop in $C_{60}$ photoresponse, as reflected in EQE measurements, while the open circuit ($V_{OC}$) remained largely unchanged at 0.87±0.01 and the fill factor (FF) increases from 0.45±0.01 to 0.49±0.01 as the fraction of $C_{60}$ decreased. The drop in EQE response correlated well with the absorption profile of the doped $C_{60}$ films, where the decrease in response between 400 nm and 550 nm occurred more rapidly than the response at wavelengths shorter than 400 nm. The impact of the CT exciton can be seen most clearly by comparing D1 and D2. In these devices, the EQE response at 350 nm remained unchanged while the EQE response at 450 nm decreases by roughly one third from 23% to 15.5%.

The observation of a decrease in photoresponse as the doping concentration of BCP in the mixed layer increased was in stark contrast to those of Menke et al., J. Nat. Mater. 2012, where the dilution of SubPc with the wide-energy gap material UGH2 resulted in a significant increase in photocurrent. For the case of SubPc, Menke demonstrated that the increase in photocurrent was due to the increase in exciton diffusion length caused by the fact that there was a concentration regime in which the Forster radius increased faster than the average molecular separation distance. The increase in diffusion length was due to an increase in the photoluminescence efficiency, excited state lifetime, and spectral overlap integral and a decrease in nonradiative decay rate in the doped film. The contrast between these results can be explained by examining the parentage of the excitons involved in the two systems. In SubPc, monomolecular Forster excitons were formed. On dilution, the loss in absorption was linear while the gains in exciton diffusion length were exponential. Conversely, in $C_{60}$, there were a significant number of multimolecular CT excitons formed. On dilution, this led to an exponential decay in CT exciton formation which outweighed any gains in diffusion length. Due to the fact that the CT absorption feature in $C_{60}$ resides in an area of high solar irradiance, the overall performance of the device decreased.

While the mixed devices have lower photocurrent, the $V_{OC}$ of the devices remained unchanged indicating that the preservation of the D/A interface achieved its desired effect. The fact that the FF did not decrease on $C_{60}$ dilution indicated that the mixed films were able to transport electrons efficiently. The unaltered $V_{oc}$ and increase in FF combined with the decrease in $J_{sc}$ resulted in a power conversion efficiency ($\eta$) drop of greater than 50% from 1.14% (D1) to 0.56% (D4) on dilution. However, the increase in transparency and efficient charge transport of the mixed films make $C_{60}$:BCP films an attractive candidate for a buffer layer.

TABLE 1

Device performance data.

| Device | Ratio (A:B) Thickness (nm) | | $J_{SC}$ (mA/cm$^2$) | $V_{OC}$ (V) | FF | η (%) |
|---|---|---|---|---|---|---|
| C$_{60}$:BCP | 1:0 | D1 | 3.0 | 0.87 | 0.44 | 1.14 |
| | 2:1 | D2 | 2.2 | 0.87 | 0.43 | 0.84 |
| | 1:1 | D3 | 1.7 | 0.86 | 0.45 | 0.64 |
| | 1:2 | D4 | 1.3 | 0.86 | 0.49 | 0.56 |

Example 3

A device, shown in FIG. 4, was fabricated according to the fabrication method disclosed in Example 2. FIG. 4 shows J-V curves of devices under one sun AM1.5 G illumination and a plot of the external quantum efficiency as a function of wavelength, with the device structure in the inset. (x=10 nm (D7), 20 nm (D6), and 30 nm (D5)). Table 2 provides performance data for this device.

TABLE 2

Device performance data.

| Device | Thickness (nm) | | $J_{SC}$ (mA/cm$^2$) | $V_{OC}$ (V) | FF | η (%) |
|---|---|---|---|---|---|---|
| NPD/C$_{60}$/ | 10/20/30 | D5 | 1.94 | 0.87 | 0.44 | 0.73 |
| (C$_{60}$:BCP | 20/20/20 | D6 | 3.05 | 0.88 | 0.44 | 1.18 |
| (1:1))/C$_{60}$ | 30/20/10 | D7 | 3.62 | 0.89 | 0.43 | 1.40 |

Example 4

A device, shown in FIG. 5, was fabricated according to the fabrication method disclosed in Example 2. FIG. 5 shows J-V curves of devices under one sun AM1.5G illumination and a plot of external quantum efficiency as a function of wavelength, with the device structure in the inset. (x=0 nm (D8), 20 nm (D9), and 40 nm (D10)). Table 3 provides performance data for this device.

TABLE 3

Device performance data.

| Device | Thickness (nm) | | $J_{SC}$ (mA/cm$^2$) | $V_{OC}$ (V) | FF | η (%) |
|---|---|---|---|---|---|---|
| C$_{60}$/ | 40/0 | D8 | 3.06 | 0.88 | 0.44 | 1.16 |
| (C$_{60}$:BCP | 40/20 | D9 | 4.48 | 0.89 | 0.43 | 1.72 |
| (1:1)) | 40/40 | D10 | 3.49 | 0.85 | 0.43 | 1.27 |

Example 5

Figure 6:
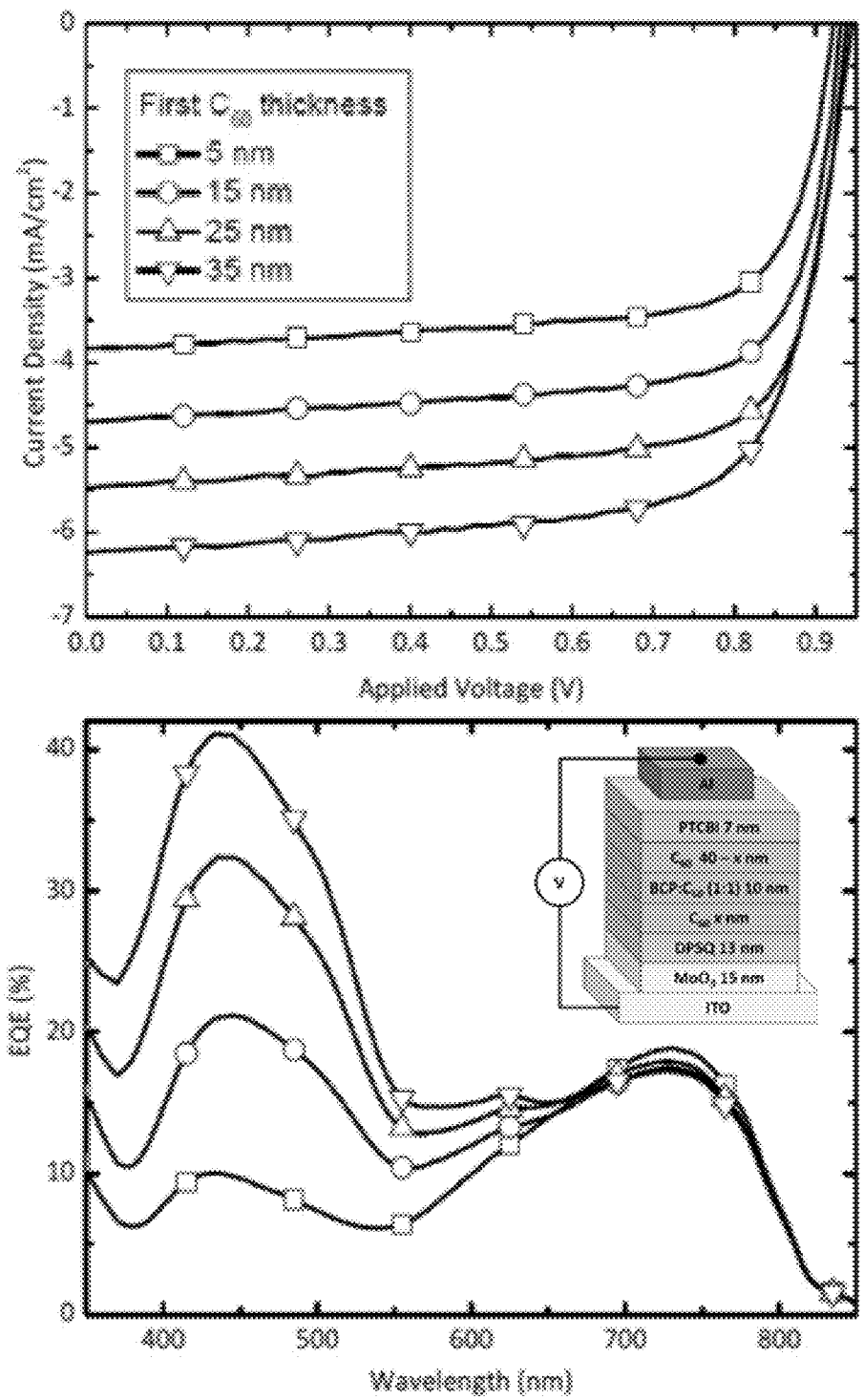
FIG. 6 shows J-V curves of devices under one sun AM1.5G illumination on top, and external quantum efficiency on the bottom, with the bottom inset showing the device structure. The "First $C_{60}$ thickness" refers to the thickness of the at least one acceptor material forming a donor-acceptor heterojunction with DPSQ (x=5 nm, 15 nm, 25 nm, 35 nm).

OPV devices, as shown in FIG. 6 (bottom inset), were fabricated. OPVs containing a 10 nm thick BCP:C$_{60}$ layer sandwiched between two C$_{60}$ layers (one is x≤35 nm thick and the other is [40 nm−x] thick) were fabricated with the red absorbing donor (2,4-bis[4-(N,N-diphenylamino)-2,6-dihydroxyphenyl]squaraine) (DPSQ). The total thicknesses of neat C$_{60}$ and BCP:C$_{60}$ films were 50 nm. FIG. 6 shows the J-V and EQE characteristics of devices D20-D23 with x=5 nm to 35 nm, with other performance parameters given in Table 4. The $J_{SC}$ decreased from 6.2±0.3 mA/cm$^2$ to 4.1±0.2 mA/cm$^2$ as the BCP:C$_{60}$ layer moved toward the D/A interface (i.e. as x is decreased). This trend was also apparent in the EQE spectra where the response from C$_{60}$ decreased as the thickness of the neat C$_{60}$ layer adjacent to the D/A interface decreased (D20 to D23 in Table 4). These data suggested that BCP:C$_{60}$ prevents excitons generated in the C$_{60}$ film adjacent to the metal electrode from diffusing to the D/A interface where dissociation into free charges can occur. In contrast, the mixed layer does not impede charge transport, as inferred from the constant and high FF=0.72±0.01 and $V_{OC}$=0.94±0.01 V. Increasing the thickness of the C$_{60}$ layer adjacent to the D/A interface from x=5 nm to 35 nm increased the power conversion efficiency under 1 sun, AM 1.5G illumination from 2.7±0.1% to 4.1±0.1%.

TABLE 4

Device performance data.

| Device | Ratio (A:B) Thickness (nm) | | $J_{SC}$ (mA/cm$^2$) | $V_{OC}$ (V) | FF | η (%) |
|---|---|---|---|---|---|---|
| C$_{60}$/(C$_{60}$BCP (1:1))/C$_{60}$ | 5/10/15 | D20 | 4.1 | 0.92 | 0.72 | 2.7 |
| | 15/10/25 | D21 | 4.2 | 0.94 | 0.73 | 3.3 |
| | 25/10/15 | D22 | 5.6 | 0.94 | 0.73 | 3.8 |
| | 15/10/15 | D23 | 6.2 | 0.94 | 0.71 | 4.2 |

Example 6

Figure 7:
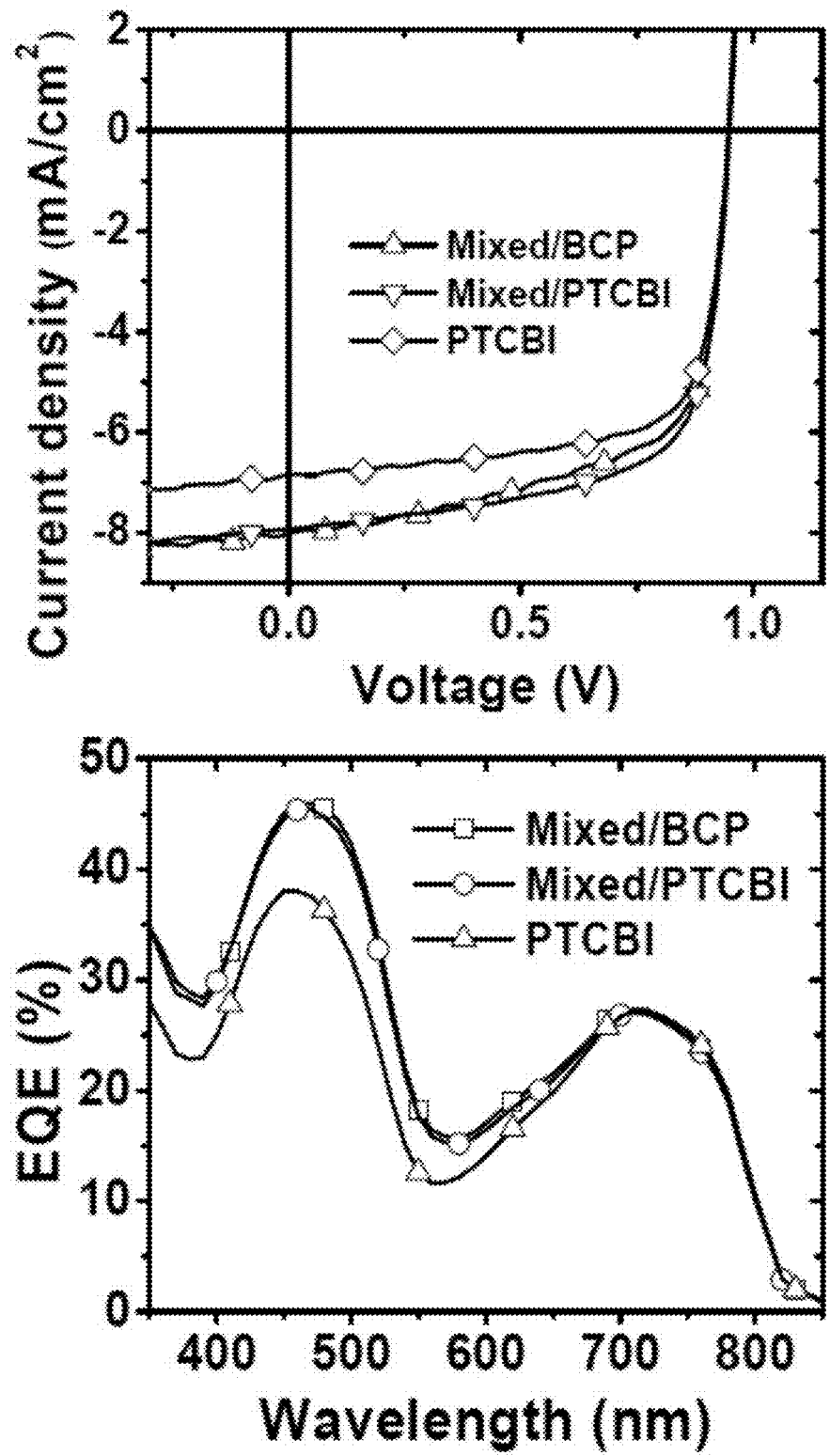
FIG. 7 shows J-V curves of devices under one sun AM1.5G illumination on top, and external quantum efficiency on the bottom, with the bottom inset showing the device structure.

A device, shown in FIG. 7, was fabricated according to the fabrication method disclosed in Example 2. FIG. 7 shows J-V curves of devices under one sun AM1.5G illumination with the inset showing characteristics of the devices, and external quantum efficiency as a function of wavelength with the inset showing the device structure. These devices compared the performance of the mixed buffer layer capped with an additional layer to enhance charge collection to a single neat PTCBI buffer layer.

Example 7

Figure 8:
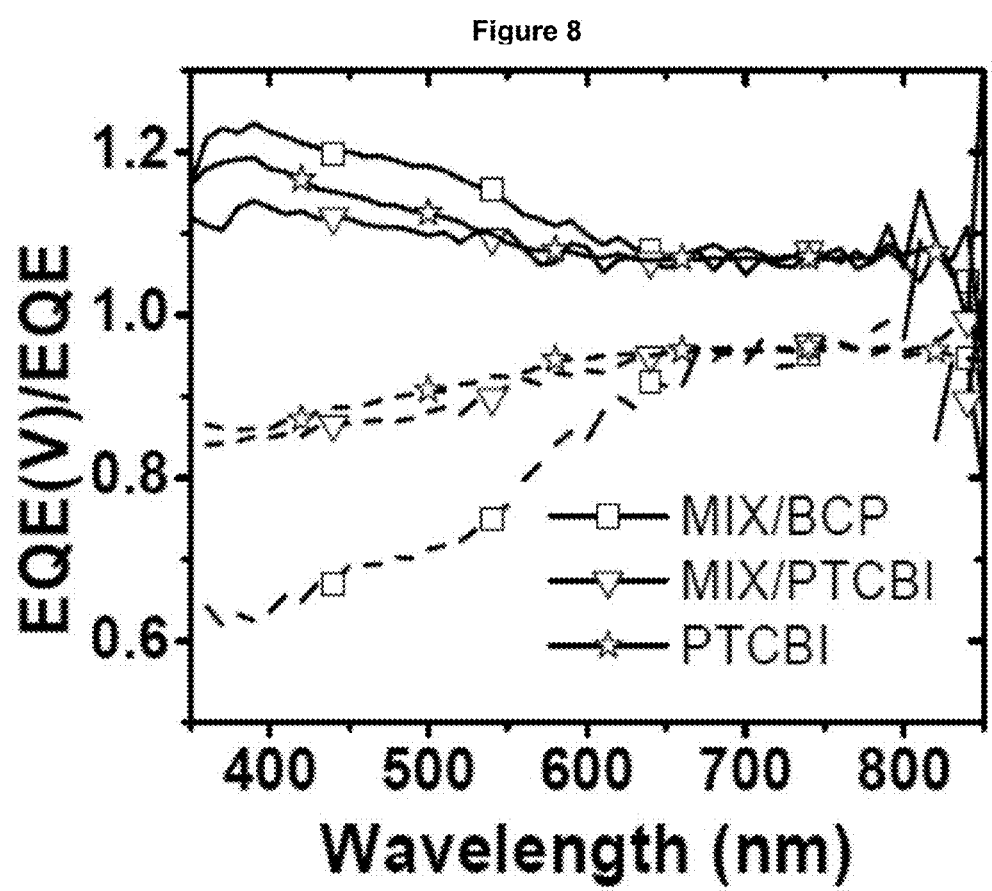
FIG. 8 shows the external quantum efficiency under applied bias (+0.5 V dashed, -1 V solid) normalized to EQE at zero bias for various buffer layers.

A device, as shown in FIG. 8, was fabricated according to the fabrication method disclosed in Example 2. FIG. 8 shows the external quantum efficiency under applied bias (+0.5 V dashed, −1 V solid) normalized to EQE at zero bias for various buffer layers. These data demonstrated that the mixed buffer layer reduced the bias dependence of the device illustrating a decrease in charge buildup at the active layer/buffer interface, consequently decreasing the amount of exciton-polaron quenching.

Example 8

The mechanism by which the mixed layer blocks excitons can be thought of in a statistical manner, where a reduction in the density of states available in the doped layer reduces the rate of exciton transfer. In the mixed layer there are a significantly reduced number of states which the energy can transfer into, effectively blocking their progress. The effect of the change in the density of states was modeled by a Monte Carlo simulation, the results of which can be seen in FIG. 9. In the model, excitons were randomly generated in a neat film adjacent to a mixed film. To simulate diffusion, the excitons then moved via a random walk for a set number of steps and their final position was recorded. The excitons were assumed to transfer solely through nearest-neighbor hopping. At the interface between the doped and neat layers, the probability for hopping between layers was scaled by the relative number of available sites in each layer. The model predicted that for a junction between two materials with equal site densities, 50% of the excitons diffused into the buffer. In the case of a 50% reduction in sites in the buffer, which corresponded to the case of a Frenkel exciton of $C_{60}$ approaching a buffer of 1:1 $C_{60}$:BCP, only 20% of excitons were transferred. At 80% site reduction, simulating the case of a CT exciton approaching a buffer of 1:1 $C_{60}$:BCP, less than 5% of excitons were transferred. These simulations demonstrated that the doped buffer blocked excitons quite well even when only considering statistical means.

Example 9

As shown in FIG. 10, normalized extinction spectra of $C_{70}$ capped with different buffer layers was plotted as a function of wavelength on the top graph. These data demonstrated that the exciton energy became larger with more mixing, which helped block excitons. The bottom chart shows emission spectra of $C_{70}$ (excited at 450 nm) capped with quenching (NPD), blocking (BCP), and mixed buffer layers.

Example 10

As shown in FIG. 11, EQE spectra of devices capped with various buffer layers (on top) and J-V curves of devices under 0.8 sun AM1.5G illumination (on bottom) illustrated the enhancement in performance due to the inclusion of the compound buffer compared to other buffer layers.

Example 11

The use of a buffer comprised of $C_{60}$:BCP was explored and its performance was compared to that of previously developed buffers, BCP and PTCBI, and in compound buffers where $C_{60}$:BCP was capped with BCP or PTCBI. In these devices the active layer was comprised of DPSQ/$C_{60}$. J-V, EQE, and device architectures are shown in FIG. 12, and associated data are shown in Table 5. The $V_{oc}$ of the devices remained constant at 0.95±0.01 V, independent of the buffer. The device capped with 10 nm PTCBI buffer (D13), exhibited the smallest $J_{sc}$ of 7.1±0.1 mA/cm² due to parasitic optical absorption from PTCBI.[20] Unlike PTCBI, the other buffers with thicknesses of 10 nm, BCP (D11) and $C_{60}$:BCP (D12), did not absorb, resulting in an increase in $J_{SC}$ to 7.5±0.1 mA/cm² and 7.6±0.1 mA/cm², respectively. The compound buffer layers with a thickness of 15 nm, $C_{60}$:BCP/PTCBI (D14) and $C_{60}$:BCP/BCP (D15), had even higher Jsc of 8.1±0.1 mA/cm² and 8.3±0.1 mA/cm², respectively. EQE measurements demonstrated that the changes in photocurrent were due to a variation in the $C_{60}$ response and optical modeling utilizing the transfer matrix formalism[9] confirmed that the increase in $J_{SC}$ on transition from 10 nm to 15 nm of buffer was due to optical effects. Significant changes also occurred in the FF between devices. The devices capped with BCP, D11 and D15, exhibited the smallest FFs of 0.64±0.01 and 0.65±0.01, respectively. The buffer comprised of only $C_{60}$:BCP (D12) had a slightly better FF of 0.66±0.01. The devices capped with PTCBI, D13 and D14, exhibited the largest FFs of 0.68±0.01 and 0.71±0.01, respectively. Due to the increase in photocurrent and FF, the power conversion efficiency of the $C_{60}$:BCP/PTCBI buffer was largest at 5.3±0.1% compared to 5.0±0.1% for $C_{60}$:BCP/BCP, 4.8±0.1% for $C_{60}$:BCP, 4.8±0.0=1% for PTCBI, and 4.8±0.1% for BCP.

The difference in FF between the buffer layers could be explained by examining the EQE under applied bias and responsivity (R) as a function of illumination intensity. FIG. 13 depicts the EQE for the devices with various buffer layers under a −1 V bias normalized to their 0 V EQE. The signal from C60, between 400 nm and 550 nm, was modulated by the application of external bias, while the DPSQ response, between 600 nm and 825 nm, remained constant. The effect of the buffer layer could be seen in the magnitude of the deviation from the zero bias EQE. For the device capped with a buffer of 10 nm BCP (D11) the voltage dependence was most significant while it was smallest for 10 nm of $C_{60}$:BCP buffer (D12).

The device capped with 10 nm $C_{60}$:BCP/5 nm BCP (D15) experienced a smaller voltage dependence than 10 nm BCP (D11). This was due to two factors. First, the BCP layer was thinner reducing the number of trapped electrons. Second, as shown above, the $C_{60}$:BCP layer blocked excitons from diffusing to the $C_{60}$:BCP/BCP interface while still transporting electrons. This prevented the excitons from interacting with the electrons trapped at the $C_{60}$:BCP/BCP interface.

The 10 nm PTCBI (D13) buffer allowed for the isoenergetic transport of electrons from $C_{60}$ due to their LUMO alignment. Concurrently, the PTCBI/Ag interface formed no dipoles or energetic barriers for charge extraction. 10 nm $C_{60}$:BCP/5 nm PTCBI (D14), functioned in a similar fashion while also preventing excitons from reaching the PTCBI.

Polaron-exciton induced exciton quenching was further evidenced by examining the responsivity as a function of illumination intensity shown in FIG. 13. Responsively is defined as the short circuit current density of the device divided by the incident areal light intensity. This parameter allowed us to compare the current generation efficiency of a device under various illumination intensities. The devices capped with BCP, D11 and D15, exhibited a distinctly nonlinear decrease in responsivity as the illumination was increased from 1 W/m² (0.0 1 sun) to 100 W/m² (1 sun). The nonlinear nature of the decay was consistent with exciton-polaron induced exciton quenching, where increased illumination intensity resulted in an increase in the population of both excitons and polarons. The other buffers employed in D12, D13, and D14 all exhibited a small change in responsivity as a function of illumination intensity demonstrating that exciton-polaron induced exciton quenching was suppressed.

TABLE 5

Device performance data.

| Device | Ratio (A:B) Thickness (nm) | | $J_{SC}$ (mA/cm$^2$) | $V_{OC}$ (V) | FF | η (%) |
|---|---|---|---|---|---|---|
| BCP | 10 | D11 | 7.5 | 0.95 | 0.65 | 4.8 |
| $C_{60}$:BCP | 10 | D12 | 7.6 | 0.95 | 0.66 | 4.8 |
| PTCBI | 10 | D13 | 7.1 | 0.85 | 0.31 | 4.8 |
| $C_{60}$/BCP/PTCBI | 10/5 | D14 | 8.1 | 0.95 | 0.61 | 5.3 |
| $C_{60}$:BCP/BCP | 10/5 | D15 | 8.3 | 0.85 | 0.64 | 5.0 |

Example 12

To probe the exciton blocking properties of $C_{60}$:BCP, devices containing a doped $C_{60}$ layer sandwiched between two neat $C_{60}$ layers were fabricated with a red absorbing donor (2,4-bis[4-(N,N-diphenylamino)-2,6-dihydroxyphenyl]squaraine) (DPSQ)[20,21] (FIG. 14). The total thickness of neat $C_{60}$ and $C_{60}$:BCP films were constant; only the position of the doped film was moved away from the D/A interface toward the Ag electrode.

The J-V and EQE characteristics of devices D16-19 are shown in FIG. 14, and associated data is shown in Table 6. The photocurrent of the devices dropped significantly from 6.2±0.1 mA/cm$^2$ to 4.1±0.1 mA/cm$^2$ as the thickness of the neat $C_{60}$ layer adjacent to the D/A interface decreased from 35 nm to 5 nm (or the $C_{60}$:BCP layer was moved toward the D/A interface). This trend could also be seen in the EQE spectra where the response from $C_{60}$ decreased as the thickness of the neat $C_{60}$ layer adjacent to the D/A interface decreased (D16 to D19). These results clearly demonstrated that $C_{60}$:BCP acted as an exciton blocking layer by effectively blocking excitons generated in the neat $C_{60}$ film adjacent to the metal electrode from diffusing to the D/A interface to charge separate. In contrast to its exciton blocking function, the doped layer exhibited good charge conductivity as the FF of the devices remained constant around 0.72±0.01. The $V_{OC}$ also remained constant at 0.94±0.01. Overall, increasing the thickness of the neat $C_{60}$ layer adjacent to the D/A interface from 5 nm to 35 nm increased η from 2.7±0.1% to 4.1±0.1%.

TABLE 6

Device performance data.

| Device | Ratio (A:B) Thickness (nm) | | $J_{SC}$ (mA/cm$^2$) | $V_{OC}$ (V) | FF | η (%) |
|---|---|---|---|---|---|---|
| $C_{60}$/($C_{60}$:BCP (1:1))/$C_{60}$ | 5/10/35 | D16 | 4.1 | 0.92 | 0.72 | 2.7 |
|  | 15/10/25 | D17 | 4.8 | 0.94 | 0.73 | 3.3 |
|  | 25/10/15 | D18 | 5.6 | 0.94 | 0.73 | 3.8 |
|  | 25/10/5 | D19 | 6.2 | 0.94 | 0.71 | 4.2 |

Example 13

FIG. 15 shows J-V curves under one sun AM1.5G illumination on top and on the bottom a plot of the external quantum efficiency of devices with various buffer layers as a function of wavelength. These devices demonstrated the performance enhancement due to inclusion of the mixed buffer layer.

Example 14

FIG. 16 shows J-V curves under one sun AM1.5G illumination on top and on the bottom a plot of the external quantum efficiency of devices with various buffer layers containing various ratios of $C_{60}$ to BCP. These devices demonstrated an optimum blending ratio of 1:1 by volume.

Example 15

Devices were fabricated with the following structure: glass substrate/100 nm ITO/10 nm MoO$_3$/54 nm 1:8 DBP:$C_{70}$/Buffer/100 nm Ag. FIG. 17 shows J-V for illumination at 1-sun simulated AM1.5G illumination (upper left) and EQE (upper right) and extracted efficiency parameters (lower) for planar-mixed OPV cells with active layers comprising a relatively thick 1:8 volume ratio of DBP and a neat layer of $C_{70}$. The thickness and volume ratio of the BPhen:$C_{70}$ for each buffer is given in the table. The best fill factor and efficiency was for devices with the mixed buffer with an additional BPhen or PTCBI layer between the mixed region and the contact demonstrating that this contact also improved mixed or bulk heterojunction devices.

Example 16

Devices were fabricated with the following structure: glass substrate/100 nm ITO/5 nm MoO$_3$/25 nm 1:8 DBP:$C_{70}$/Buffer/100 nm Ag. FIG. 18 shows J-V for illumination at 0.7-sun simulated AM1.5G illumination (upper left) and EQE (upper right) and extracted efficiency parameters (lower) for planar-mixed OPV cells with active layers comprising a relatively thin 1:8 volume ratio of DBP and a neat layer of $C_{70}$ and various buffers. The thickness and volume ratio of the BCP:$C_{70}$ for each buffer is given in the table. The best fill factor and efficiency were for devices with the mixed buffer with an additional BPhen or PTCBI layer between the mixed region and the contact demonstrating that this contact also improved mixed or bulk heterojunction devices and could yield exceptional fill factors in mixed-layer devices.

Example 17

Figure 19:
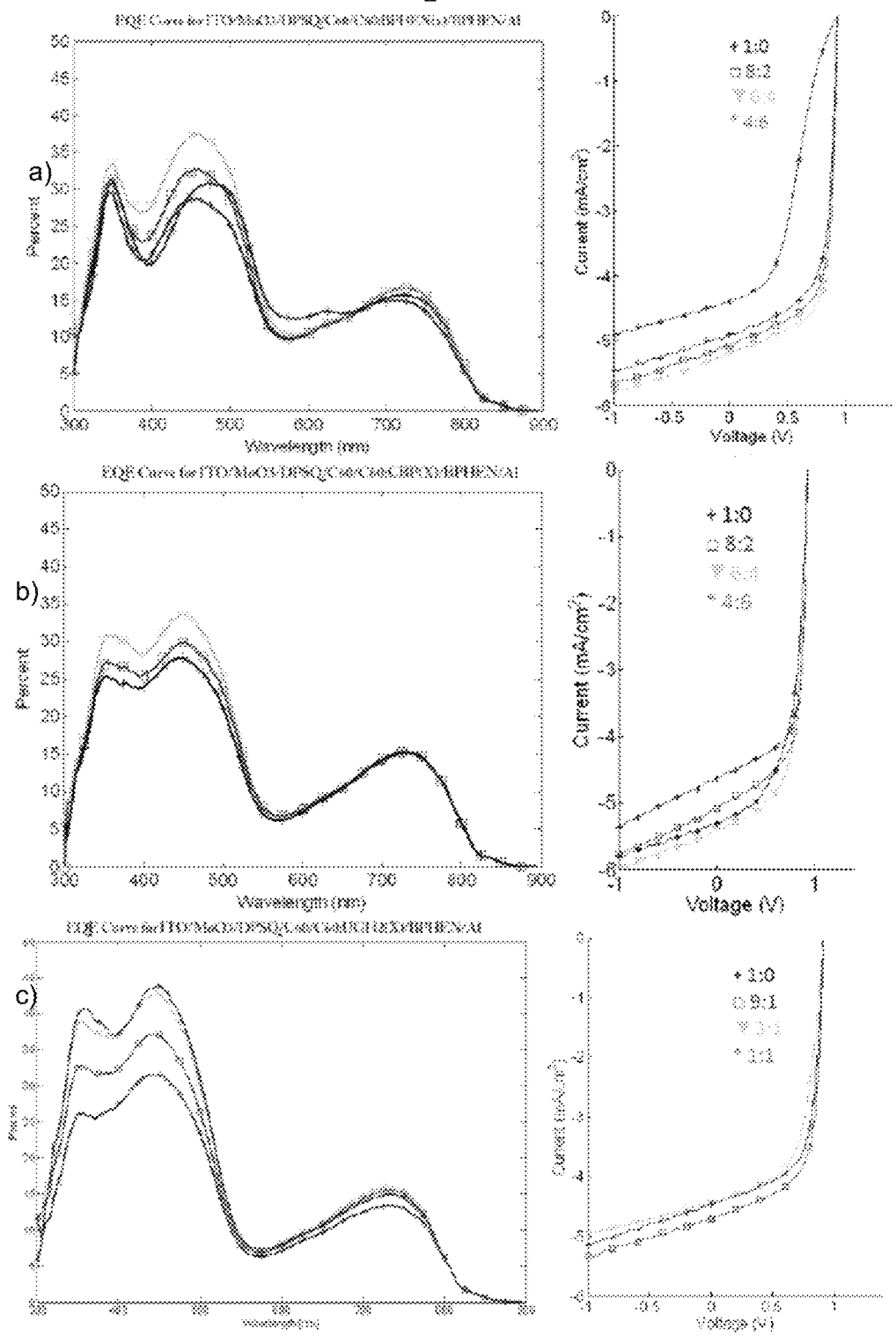

Devices were fabricated with structures identified in FIG. 19. The device in FIG. 19(a) had the structure ITO/MoO$_3$/DPSQ/C60/$C_{60}$:BPhen(x)/BPhen/Al. The device in FIG. 19(b) had the structure ITO/MoO$_3$/DPSQ/C60/$C_{60}$:BCP(x)/

BPhen/Al. The device in FIG. 19(c) had the structure ITO/MoO$_3$/DPSQ/C60/C$_{60}$:UGH2(x)/BPhen/Al. FIG. 19 shows the EQE and J-V curve for dilution with BPhen, CBP, and UGH2. An enhancement was observed in all the cases, confirming that reducing the buildup of charge at the C$_{60}$/Buffer interface resulted in enhancement.

Example 18

OPV cells were grown by vacuum thermal evaporation (VTE) at a base pressure of 2×10$^{-7}$ torr on glass substrates pre-coated with indium tin oxide (ITO, sheet resistance: 15Ω/□). Prior to deposition, the substrates were cleaned in diluted Tergitol® (Type NP-10), deionized water, acetone and isopropyl alcohol, and then exposed to ultraviolet-ozone for 10 min. MoO$_3$ was obtained from Acros Organics, C$_{60}$ from Materials and Electrochemical Research Corp., BPhen and DBP from Luminescence Technology Corp., and C$_{70}$ from SES Research. DBP, C$_{60}$ and C$_{70}$ were purified once via thermal gradient sublimation.

The MoO$_3$ and BPhen layers were grown at a rate of 0.1 nm/s, DBP and C$_{70}$ were co-deposited using a DBP deposition rate of 0.02 nm/s and a C$_{70}$ deposition rate of 0.16 nm/s to achieve a 1:8 ratio. The BPhen:C$_{60}$ mixed buffer was grown by co-depositing BPhen and C$_{60}$ each at a rate of 0.05 nm/s creating a 1:1 blend. A 100 nm-thick Ag cathode was subsequently deposited through a shadow mask defining an array of 15, 1 mm diameter devices (device area of 0.008 cm$^2$). Following fabrication, devices were transferred into a glovebox filled with ultra-high purity N$_2$ for measurement of the J-V characteristics and EQE. During measurement, only the tested device was under illumination while other devices were kept in the dark. The solar simulator intensities were calibrated using a NREL-traceable Si reference cell, and J$_{SC}$ was corrected for spectral mismatch. The EQE as a function of wavelength (I) was obtained with a lock-in amplifier and monochromated light from Xe-lamp chopped at 200 Hz. Errors in J$_{SC}$ and PCE arise primarily from uncertainties in light intensity and spectral calibration.

Figure 20:
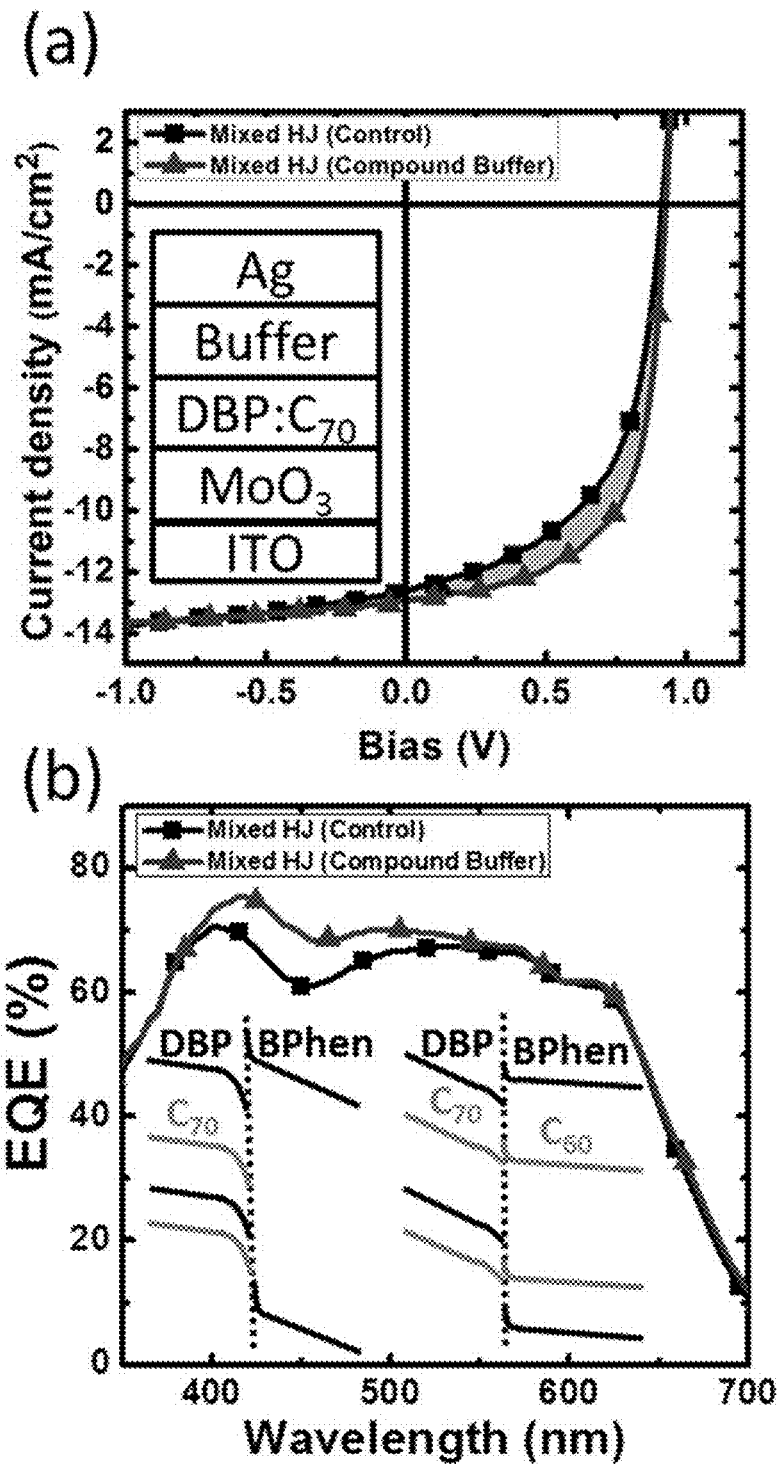

Mixed HJ cells were grown by vacuum thermal evaporation (VTE) with the structure: MoO$_3$ (10 nm)/DBP:C$_{70}$ (54 nm, 1:8 volume ratio)/Buffer/Ag (100 nm). Two different buffer layers were employed: 8 nm-thick BPhen (control), and 10 nm-thick BPhen:C$_{60}$ mixed layer at 1:1 ratio (by volume) capped with a neat, 5 nm-thick BPhen layer. FIG. 20 shows the J-V characteristics and EQE spectra of mixed HJ devices employing the control and compound buffers. The control had FF=55±1%, J$_{SC}$=12.5±0.3 mA/cm$^2$, V$_{OC}$=0.91±0.1 V and PCE=6.3±0.3% under simulated AM 1.5G, 1 sun illumination (spectral mismatch factor=1.00±0.01), as previously. The cells with the compound electron-filter buffer exhibited improvement in all three performance parameters, leading to FF=63±1%, J$_{SC}$=12.8±0.3 mA/cm$^2$, V$_{OC}$=0.93±0.1 V and PCE=7.5±0.4%, the latter corresponding to a 19% increase compared to the control.

The significant improvement in FF for the device with the compound buffer is shown in FIG. 20(a) (indicated by the shaded region between the curves) with the energy level diagram in FIG. 20(b), inset. Previous studies showed that energy level bending occurred at the fullerene/BCP interface, leading to electron accumulation and a large potential drop as shown in the left inset. Consequently, the field across the active layers was reduced as the voltage was redistributed, increasing the charge extraction time and, therefore, the residence time for electrons and holes at the donor-acceptor heterointerface where they had an opportunity to recombine. In the case of the compound buffer, the high conductivity of the 1:1 BPhen:C$_{60}$ blend resulted in less electron accumulation and, therefore, a smaller potential drop at the interface (right inset, FIG. 20(b)) and a higher electric field in the DBP:C$_{70}$ mixed region. This in turn led to reduced bimolecular quenching, and consequently an increased FF and EQE at wavelengths between I=400 nm and 550 nm, as shown in FIG. 20(b).

Both cells showed almost identical EQE at I<400 nm and λ>550 nm (see FIG. 20(b)). At λ<400 nm, the photoactive region absorption decreased in the compound buffer cell resulting from parasitic absorption in the BPhen:C$_{60}$ mixed buffer while the internal quantum efficiency (IQE) increased due to reduced bimolecular recombination. Overall, the EQE of the compound buffer cell was nearly equal to the control cell. At λ>550 nm, the absorbed optical power peak as well as charge distribution peak shifted towards the anode, since the excitons generated in the DBP:C$_{70}$ mixed region almost immediately dissociated into charges. This reduced the population of holes at the DBP:C$_{70}$/BPhen interface (close to the cathode side) where electrons piled up in the control cell, while at the same time improving hole extraction. The spatial separation of the holes and electrons at longer excitation wavelengths reduced bimolecular recombination in the control cell, leading to the almost identical EQE as well.

To understand the role of bimolecular recombination, the responsivity (R) for both cells as a function of light intensity (I) was investigated. The control cell was found to have a monotonic decrease in R with I, from R=12.7±0.4 A/W at I=0.6 sun, to 11.8±0.3 A/W at I=2.7 suns, while for the compound buffer cell, R dropped by only 0.2 A/W over the same range of intensities (see FIG. 21). In general, $J_{SC}=J_G-J_{MM}-J_{BM}$, where $J_G$ is the photogenerated current density, $J_{MM}$ is the monomolecular recombination current density and $J_{BM}$ is the bimolecular recombination current density. Both $J_G$ and $J_{MM}$ are linearly proportional to I, while $J_{BM} \propto \gamma \cdot n \cdot p \propto b \cdot I^2$, where γ is the Langevin coefficient and b is a constant. Therefore, $R=J_{SC}/I=R_0-\beta \cdot I$, where $R_0$ is the responsivity in the absence of bimolecular recombination. The linear fits to this analysis (dashed lines, FIG. 21) yielded $R_0$=12.9 A/W for both cells. The same intercept for both cells at zero light intensity suggested that both OPV cells had the same responsivities as I→0 in the absence of bimolecular recombination. However, β for the control was four times larger than that for the cell with the compound buffer. The smaller β for the compound buffer cell suggested that bimolecular recombination was only 25% of that of the control cell, indicating that the electron and hole concentrations had each decreased, on average, by 50% due to the increased electric field in the mixed region. This larger internal field across the heterojunction in the compound buffer cell compared to that of the control for a given external bias resulted in improved charge extraction and, therefore, higher FF.

The charge transport properties of the compound buffer were further investigated by 3-D Monte Carlo simulations of the layer, programmed in Matlab. The buffer was modeled as a random distribution of BPhen and C$_{60}$ molecules on a cubic lattice, with electron transport attributed to nearest-neighbor hopping between C$_{60}$ molecules. In this model, Columbic interactions between charges were neglected, and the lattice sites were assumed to be isoenergetic, aside from energy differences imposed by the applied electric field. Transfer probabilities were calculated according to Miller-Abrahams theory, from which the median extraction time for charges injected on one side of the buffer layer was obtained.

The mobility of the layer was then calculated from the relationship between extraction time and electric field, normalized by setting the zero-field mobility of electrons in neat $C_{60}$ layer to the experimental value of $5.1\times10^{-2}$ cm$^2$/V·s. For a 1:1 mixed buffer, the model predicted an effective mobility of $4.7\times10^{-3}$ cm$^2$/V·s, only one order of magnitude lower than that of neat $C_{60}$. In comparison, the neat BPhen film had a significantly lower electron mobility of $1.9\times10^{-5}$ cm$^2$/V·s, leading to charge pile-up at the buffer interface that promoted quenching.

The model was tested by examining the predictions for different thicknesses of a 1:1 mixed buffer, with results in FIG. 22(a). A linear relationship was found between extraction time (corresponding to film mobility) at a given voltage and thickness of the mixed layers, which translated to a linear increase in series resistance, assuming a constant charge density (i.e. a constant illumination intensity). Fits to experimental data for mixed buffer DBP:$C_{60}$ OPVs are shown in FIG. 22(a), inset. Now, a neat BPhen layer that conducted electrons through defect states induced during metal deposition, thereby leading to a superlinear relationship between thickness and resistance. In contrast, the mixed buffer resistance increased linearly with thickness even up to 20 nm, suggesting that electrons in the mixed buffer were predominantly conducted by the $C_{60}$ in the mixture.

Exciton blocking efficiency using the photoluminescence (PL) excitation spectra of 40 nm-thick $C_{70}$ film capped with a 1:1 BPhen:$C_{60}$ blend on quartz was experimentally investigated. By comparing the PL intensity of the layer deposited onto the surface of the blend under study to that of either a "perfectly" blocking or quenching layer, the relative importance of these processes could be determined. For this, therefore, an 8 nm-thick BPhen or N,N'-diphenyl-N,N'-bis (1-naphthyl)-1-1'biphenyl-4,4'diamine (NPD) layer were used as reference, perfectly exciton blocking or quenching layers, respectively. The PL intensity of the mixed buffer was nearly identical to the intensity found for the blocking reference (see FIG. 22(b)), demonstrating that BPhen:$C_{60}$ mixed layer could efficiently block excitons. Since BPhen:$C_{60}$ mixture had a relatively high electron mobility, the mixed buffer layer could spatially separate excitons and polarons acting as an effective filter, leading to a reduction of exciton-polaron quenching within the neat fullerene layer.

Example 19

OPV cells with a hybrid planar-mixed heterojunction (PM-HJ) were fabricated according to the experiment disclosed in Example 18. DBP and $C_{70}$ were employed as donor and acceptor, respectively in OPV cells. The OPV cells had a device structure of indium tin oxide (ITO)/MoO$_3$ (10 nm)/DBP:$C_{70}$ (54 nm, 1:8 ratio by vol.)/$C_{70}$ (9 nm)/Buffer/ Ag (100 nm). Three different buffer layers were employed in the DBP:$C_{70}$ PM-HJ OPV cells: (1) 8 nm-thick bathophenanthorline (BPhen) (control); (2) 10 nm-thick BPhen:$C_{60}$ mixed layer at 1:1 ratio; and (3) the same mixed buffer as (2) capped with a neat, 5 nm-thick BPhen layer.

Figure 23:
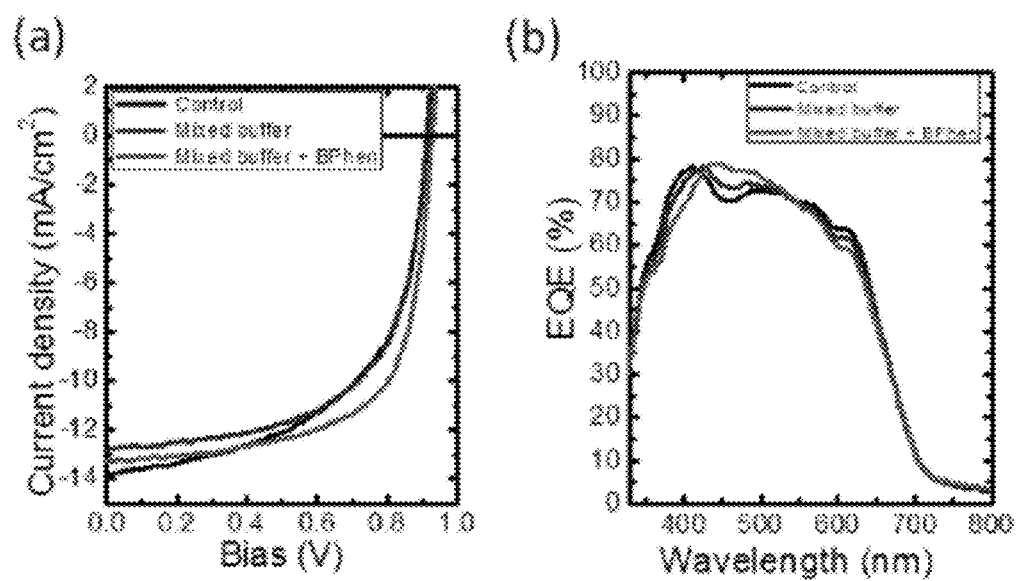

FIG. 23 shows the current density v. voltage (J-V) characteristics and the external quantum efficiency, EQE, spectra comparing performance for devices employing the buffer layer structures (1)-(3), with a summary in Table 7.

TABLE 7

Device performances of PH-HJ OPV cells with various buffer layers.

| Buffer | $V_{OC}$ (V) | $J_{SC}$ (mA/cm$^2$) | FF | PCE (%) 1 sun, AM1.5G | Spectral mismatch factor |
|---|---|---|---|---|---|
| Control | 0.91 ± 0.01 | 13.8 ± 0.4 | 0.56 ± 0.01 | 7.1 ± 0.2 | 0.99 |
| Mixed buffer only | 0.91 ± 0.01 | 12.8 ± 0.3 | 0.62 ± 0.01 | 7.2 ± 0.2 | 0.99 |
| Mixed buffer + BPhen | 0.93 ± 0.01 | 13.2 ± 0.4 | 0.66 ± 0.01 | 8.1 ± 0.4 | 1.00 |

The control cell had FF=56% and short-circuit current $J_{SC}$=13.8±0.4 mA/cm$^2$, comparable to or marginally better than previous results.[1] Thus, the control cell showed a power conversion efficiency, PCE=7.1±0.2% under simulated AM 1.5G, 1 sun illumination. Compared to the control cell, the cell with only a BPhen:$C_{60}$ (1:1) filter at ratio had a similar open-circuit voltage ($V_{OC}$)=0.91±0.01 V, but an increased FF=62±1%, which was due to the reduced polaron-exciton quenching.[2,3] However, $J_{SC}$=12.8±0.3 mA/cm$^2$, which was slightly smaller due to, resulting the reduced EQE for λ<420 nm and λ>550 nm, as shown in FIG. 23(b). Overall, the PCE increased slightly to 7.2±0.2% under 1 sun illumination.

The OPV cell with a BPhen:$C_{60}$/BPhen compound buffer had FF=66±1%, an improvement of 18% compared to the control. Also, $V_{OC}$ increased from 0.91±0.1 V for the control to 0.93±0.1 V for the cell with a BPhen:$C_{60}$/BPhen buffer. However, $J_{SC}$ decreased to 13.2±0.4 mA/cm$^2$, a 5% reduction compared to the control. Overall, the OPV cell with a BPhen:$C_{60}$/BPhen buffer exhibited a PCE=8.1±0.4% under simulated AM 1.5G, 1 sun illumination, a 14% increase compared to the control cell.

In FIG. 24, the absorption efficiency, $\eta_A$, of organic photoactive regions (i.e. DBP:$C_{70}$ mixed layer and the neat $C_{70}$ capping layer) was calculated using transfer matrix method,[4,5] and the internal quantum efficiency (IQE) for both cells. The absorption of the capped buffer cell decreased between λ=350 nm to 500 nm owing to the absorption of the BPhen:$C_{60}$ mixed buffer, as described previously.[3] At λ>500 nm, the mixed buffer was transparent and, hence, two cells had almost identical absorption spectra.

Similarly, the IQE increased for the cell with a BPhen:$C_{60}$/BPhen buffer between λ=350 nm to 550 nm compared to the control cell. For example, IQE for the cell with a BPhen:$C_{60}$/BPhen buffer had EQE~90% between λ=350 nm and λ=500 nm, reaching~100% at λ=430 nm, indicating that every photon absorbed converted to charge carriers collected by the electrodes.

The responsivity (R) and PCE for the BPhen:$C_{60}$/BPhen filtered cell and the control as functions of light intensities ranging from 0.4 sun to 2.7 sun was studied (FIG. 25). The responsivity of the control cell decreased monotonically with intensity, from R=14.9±0.4 A/W at 0.4 sun to 13.0±0.4 A/W at 2.7 sun, while the filtered cell remained unchanged over this same range of solar concentration. The control cell also showed a roll-off of PCE as the light intensity increased as shown in FIG. 25 due to a monotonous decline of the responsivity. The PCE of the cell with a BPhen:$C_{60}$/BPhen buffer slightly increased to the maximum at 1 sun, then started to roll off at higher light intensity due to a decrease of FF, probably caused by the enhanced bimolecular recombination at high light intensity.

Figure 26:
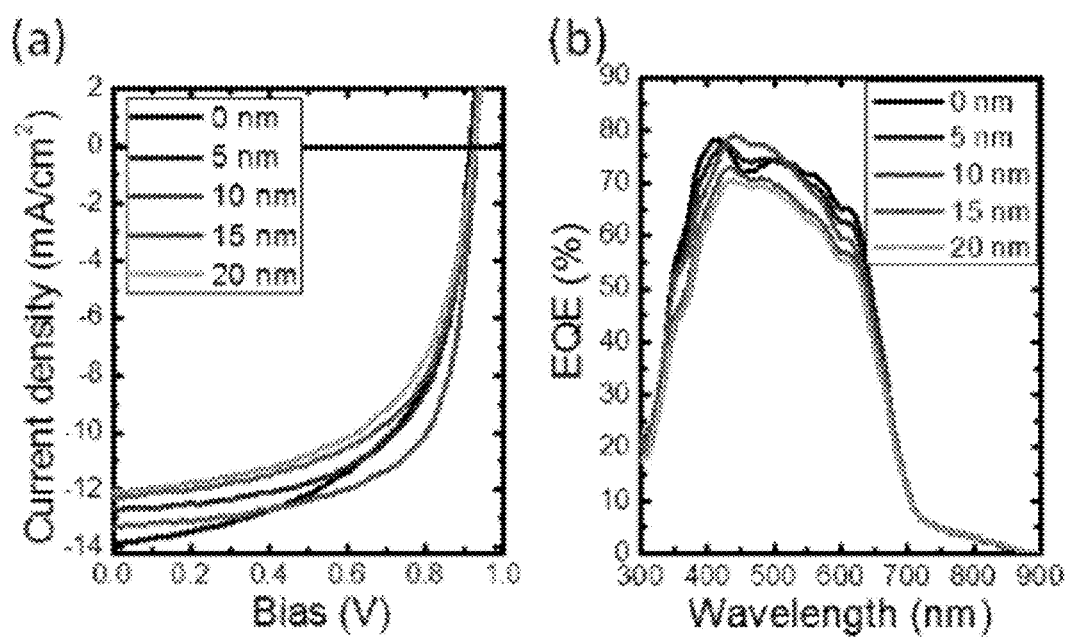

The thickness of mixed buffer layer in DBP:$C_{70}$ PM-HJ cells with a BPhen:$C_{60}$/BPhen buffer was also varied. J-V characteristics under 1 sun illumination and EQE spectra are shown in FIG. 26 and device performances are summarized in Table 8.

TABLE 8

Device performances of OPV cells with mixed buffer layer for different thicknesses.

| Buffer | $V_{OC}$ (V) | $J_{SC}$ (mA/cm$^2$) | FF | PCE (%) 1 sun, AM1.5G | Spectral mismatch factor | $R_s$ ($\Omega \cdot cm^2$) |
|---|---|---|---|---|---|---|
| 0 nm | 0.91 ± 0.01 | 13.9 ± 0.4 | 0.56 ± 0.01 | 7.1 ± 0.2 | 0.99 | 0.85 ± 0.02 |
| 5 nm | 0.92 ± 0.01 | 12.7 ± 0.3 | 0.62 ± 0.01 | 7.2 ± 0.2 | 0.99 | 1.24 ± 0.06 |
| 10 nm | 0.93 ± 0.01 | 13.2 ± 0.4 | 0.66 ± 0.01 | 8.1 ± 0.4 | 1.00 | 1.51 ± 0.06 |
| 15 nm | 0.93 ± 0.01 | 12.3 ± 0.3 | 0.60 ± 0.01 | 6.8 ± 0.3 | 1.00 | 2.49 ± 0.09 |
| 20 nm | 0.93 ± 0.01 | 12.0 ± 0.3 | 0.58 ± 0.01 | 6.4 ± 0.2 | 1.00 | 2.65 ± 0.09 |

$J_{SC}$ decreased monotonously as the thickness of mixed buffer increased. As shown in FIG. 26(b), EQE decreased across the visible spectrum as the mixed layer thickness increased. $V_{OC}$ slightly increased from 0.91±0.01 V for the cell without mixed buffer layer to 0.93±0.01 V for the cell with 10 nm-thick mixed buffer and remained stable for thicker mixed buffer layers. FF increased from 0.56±0.01 for the control cell to 0.66±0.01 V for 10 nm-thick mixed buffer and then rolled off for thicker mixed buffer, resulting from an increased series resistance as shown in Table 8.

Meanwhile, the charge transport through the mixed buffer layer using a 3-D Monte-Carlo simulation of nearest-neighbor hopping transport in a cubic lattice, with the mixed layer modeled as a random distribution of $C_{60}$ and BPhen molecules, was modeled. Columbic interaction between charges was neglected and the lattice sites were assumed to be isoenergetic, aside from energy differences due to an applied electric field. Relative hopping probabilities between sites were calculated using the Miller-Abrahams expressions. During each time-step of the model, the charge picked a random nearest neighbor to hop to, weighted by the relative hopping probability. If the chosen site contained a BPhen molecule, the charge instead remained stationary for that step. The behavior of the charges in the mixed and neat layers was otherwise identical.

The median extraction times for different thickness was calculated by injecting charges on one side of a 100×100 simulated lattice of sites and measuring the time for charges to escape from the opposite side under electric fields. FIG. 27 shows the median extraction time vs. electric field as a function of mixed layer thickness. For a given thickness of mixed layer, the electric field accelerated the charge transport in the mixed layer, therefore reducing the median extraction time as the electric field increased. As the mixed buffer thickness increased, it took longer time for charge to travel through the mixed layer. Thus, the median extraction time became longer as the mixed layer thickness increased.

To test the predictions of the model, the series resistances obtained by the fitting of J-V characteristics in dark, as shown in Table 8, were compared to the values from the modeling for PM-HJ cells with different mixed layer thicknesses. The mobilities of the mixed layer with different thicknesses were calculated from the field dependence of the extraction time and all simulated layers showed an effective mobility of 4.7×10$^{-3}$ cm$^2$/V·s, with a 1/field dependence of the extraction time. This predicted that the resistance of the layer should be linearly dependent on thickness, as shown in the inset of FIG. 27. The predicted mobility of 1:1 mixed buffer layer was only one order of magnitude less than pure $C_{60}$, relatively high for organics, which explained how these layers were able to efficiently extract charges from the neat layer. As shown in previous simulations, these layers were efficient at blocking excitons, leading to the spatial separation of excitons and polarons which suppressed quenching.

Example 20

The devices, as shown in FIG. 28, were fabricated as illustrated. The full structure was glass substrate/ITO (100 nm)/MoO$_3$ (100 nm)/Buffer 1/DBP (20 nm)/$C_{60}$ (40 nm)/Buffer 2/Ag (100 nm) where Buffer 1 and Buffer 2 and corresponding measured efficiency parameters are shown in Table 9. FIG. 28(a) shows J-V for illumination under 1-sun simulated AM1.5G illumination with inset showing NPD, and (b) shows the external quantum efficiency for OPV cells with active layers comprised of DBP and $C_{60}$ and various buffers.

TABLE 9

Measure Efficiency Parameters for OPV Cells with DBP:$C_{60}$ active layer and various buffers.

| Devices (Buffer 1/Buffer 2) | $J_{SC}$ (mA/cm$^2$) | $V_{oc}$ (V) | FF (%) | PCE (%) |
|---|---|---|---|---|
| Ref | −5.5 | 0.92 | 0.64 | 3.22 |
| NPD(10 nm)/BCP(10 nm) | −7.9 | 0.91 | 0.54 | 3.87 |
| NPD(10 nm)/BCP:$C_{60}$(10 nm, 1:1) | −7.5 | 0.91 | 0.53 | 3.64 |
| NPD:DBP(10 nm, 1:1)/BCP(10 nm) | −6.1 | 0.93 | 0.57 | 3.21 |
| NPD:DBP(10 nm, 1:1)/BCP:$C_{60}$(10 nm, 1:1) | −6.6 | 0.93 | 0.57 | 3.53 |

The thickness, composition, and measured efficiency parameters for each filter are given in Table 9. Compared to the reference, the inclusion of a neat layer of NPD as a filter resulted in a significant increase in $J_{SC}$ accompanied by a drop in FF. The use of a filter comprised of a 1:1 blend of DBP with NPD served to improve FF compared to the use of NPD alone while still improving $J_{SC}$ compared to the reference device. In conjunction with an electron filter at the cathode, the NDP:DBP hole filter resulted in a 10% increase in PCE.

Example 21

The device shown in FIG. 30 was fabricated as illustrated. The full structure was glass substrate/ITO/MoO$_3$ (10 nm)/

DBP:C$_{70}$ (1:8) (54 nm)/C$_{70}$ (9 nm)/Buffer/Al (100 nm). This device was grown on a commercially purchased pre-patterned ITO substrate. The substrate was cleaned using solvents and UV-ozone system. The organic layers, metal oxide, and cathode were deposited in a thermal evaporator at a rate of 0.1 nm/second. The device was then encapsulated by putting an epoxy layer around the device, and pressing a glass slide on top. The epoxy was UV-cured.

In one device, the buffer layer was a mixed layer of BPhen:C$_{60}$ (1:1) (10 nm) with a BPhen cap layer (5 nm). In another device, the buffer layer was a mixed layer of TPBI:C$_{70}$ (1:1) (10 nm) with a TPBi cap layer (3 nm). It is noted that other wide energy gap materials, such as those listed in Table 10 below and others discussed above, may be used.

To test the lifetime at elevated temperature, the device was placed in a carrier board made from printed circuit board. The contacts were soldered. A copper plate was affixed to the device with a resistive heater to spread heat over the whole device area. The temperature was measured using a thermal couple. The device was illuminated using a xenon arc-lamp at 1000 W/m2, and measured every 30 minutes using a current-voltage source meter controlled with a Matlab program.

FIGS. 31A-C show normalized performance values for the device utilizing BPhen at various temperatures, and FIGS. 32A-D show normalized performance values for the device utilizing TPBi at various temperatures. As shown in FIGS. 31A-C and 32A-D, due to the morphological instability of BPhen compared to TPBi as indicated by their respective Tg, the performance of the device using BPhen degraded significantly faster over time than the device using TPBi, particularly as temperature increased.

TABLE 10

| Material | HOMO | LUMO | T$_g$ |
|---|---|---|---|
| Alq3 | −5.8 | −3.2 | ≈165° C. |
| BAlq | −5.9 | −2.9 | ≈92° C. |
| TPBi | −6.3 | −2.8 | ≈122° C. |
| 3TPYMB | 6.7 | −3.3 | ≈106° C. |
| BP4mPy | 6.6 | −2.6 | ≈107° C. |

Example 22

The device shown in FIG. 33 was fabricated as illustrated and using the same techniques described in example 21. The full structure was glass substrate/ITO/MoO$_3$ (10 nm)/C$_{70}$:DBP (8:1) (54 nm)/C$_{70}$ (9 nm)/Buffer (15 nm)/Al (100 nm) with various buffer layers as shown, the buffer layers having a mixed layer of a wide energy gap material and an electron conducting material and including a cap layer of the wide energy gap material. It is noted that other wide energy gap materials, such as those discussed above, may be used. FIG. 33 shows the relative normalized power conversion efficiency at 55° C. of devices using BPhen in the buffer layer compared to three devices that each use a different wide energy gap material having a higher T$_g$ than BPhen, namely BAlq, 3TPYMB, and TPBi.

As shown in FIG. 33, device performance degraded significantly less over time for the devices containing a mixed buffer layer having a wide energy gap material with a higher Tg than BPhen. Molecular structures of these materials, along with molecular structures of other wide energy gap materials—Alq$_3$ and BP4mPy—are shown in FIGS. 34-38.

FIGS. 39-41 show normalized responsivity, fill factor, V$_{OC}$, and PCE at 55° C. over time for devices having mixed buffers containing a mixture of C$_{70}$ and one of TPBi, 3TPYMB, and BAlq, respectively. As shown, the normalized performance values (e.g., based on PCE, V$_{OC}$, FF, and R) of devices comprising one of TPBi, 3TPYMB, and BAlq remained significantly higher over time as compared to the performance of devices comprising BPhen (performance of BPhen devices shown in FIGS. 31A-C and FIG. 33).

Example 23

The device shown in FIG. 42 was fabricated as illustrated and using the same techniques described in example 21. The full structure was glass substrate/ITO (160 nm)/MoO$_3$ (10 nm)/C$_{70}$:DBP (8:1) (54 nm)/C$_{70}$ (9 nm)/3TPYMB:C$_{60}$ (1:1) (10 nm)/Al (100 nm). The 10 nm layer of 3TPYMN:C$_{60}$ was the buffer layer comprising the wide energy gap material 3TPYMB (T$_g$ of 3TPYMB≈106° C.). The lifetime of the device at elevated temperatures was tested using the same techniques as described in example 21. FIGS. 43-46 show normalized responsivity, fill factor, V$_{OC}$, and PCE over time for the device of FIG. 42 at 55° C., 70° C., 85° C., and 100° C., respectively.

What is claimed is:

1. An organic photosensitive optoelectronic device comprising:
   two electrodes in superposed relation comprising an anode and a cathode;
   a photoactive region comprising at least one donor material and at least one acceptor material disposed between the two electrodes to form a donor-acceptor heterojunction, wherein the at least one acceptor material has a Lowest Unoccupied Molecular Orbital energy level (LUMO$_{Acc}$) and a Highest Occupied Molecular Orbital energy level (HOMO$_{Acc}$); and
   an exciton-blocking electron filter disposed between the cathode and the at least one acceptor material, wherein the electron filter comprises a mixture comprising at least one cathode-side wide energy gap material and at least one electron conducting material;
   wherein the at least one cathode-side wide energy gap material has:
      a Lowest Unoccupied Molecular Orbital energy level (LUMO$_{CS-WG}$) smaller than or equal to the LUMO$_{Acc}$;
      a Highest Occupied Molecular Orbital energy level (HOMO$_{CS-WG}$) larger than, equal to, or within 0.3 eV smaller than the HOMO$_{Acc}$;
      a HOMO$_{CS-WG}$-LUMO$_{CS-WG}$ energy gap wider than a HOMO$_{Acc}$-LUMO$_{Acc}$ energy gap; and
      a glass transition temperature equal to or greater than 85° C.; and
   wherein the at least one electron conducting material has
      a Lowest Unoccupied Molecular Orbital energy level (LUMO$_{EC}$) larger than, equal to, within 0.2 eV smaller than the LUMO$_{Acc}$.

2. The device of claim 1, wherein the at least one cathode-side wide energy gap material comprises a material chosen from 3,3',5,5'-Tetra[(m-pyridyl)-phen-3-yl]biphenyl (BP4mPy), 2,2',2"-(1,3,5-Benzinetriyl)-tris(1-phenyl-1-H-benzimidazole) (TPBi), Bis(2-methyl-8-quinolinolate)-4-(phenylphenolato)aluminium (BAlq), Tris(8-hydroxy-quinolinato)aluminium (Alq3), Tris(2,4,6-trimethyl-3-(pyridin-3-yl)phenyl)borane (3TPYMB), 4,40-(1,3-phenylene)bis(2,6-dip-tolylpyridine-3,5-dicarbonitrile) (m-MPyCN), 4,40-(1,3-phenylene)bis(2,6-di(biphenyl-4-yl)pyridine-3,5- dicarbonitrile) (m-PhPyCN), 4,40-(1,3-phenylene)bis(2,6-diphenylpyridine-3,5-dicarbonitrile) (m-PyCN), 6,60-(1,4-phenylene)bis(2-phenyl-4-p-tolylnicotinonitrile)(p-PPtNN), 4,40-(1,4-phenylene)bis(2-phenyl-6-p-tolylnicotinonitrile) (p-PPtNT), and derivatives thereof.

3. The device of claim 1, wherein the wide energy gap material has a glass transition temperature between 85-200° C.

4. The device of claim 1, wherein the wide energy gap material has a glass transition temperature between 100-165° C.

5. The device of claim 1, wherein the $HOMO_{CS\text{-}WG}$ is larger than the $HOMO_{Acc}$, and the $LUMO_{CS\text{-}WG}$ is smaller than the $LUMO_{Acc}$.

6. The device of claim 1, wherein the $LUMO_{EC}$ is equal to the $LUMO_{Acc}$.

7. The device of claim 1, wherein the $LUMO_{EC}$ is larger than the $LUMO_{Acc}$.

8. The device of claim 1, wherein the $LUMO_{CS\text{-}WG}$ is smaller than the $LUMO_{EC}$.

9. The device of claim 1, wherein the at least one electron conducting material comprises a material chosen from subphthalocyanines, subnaphthalocyanines, dipyrrin complexes, BODIPY complexes, perylenes, naphthalenes, fullerenes, functionalized fullerene derivatives, and derivatives thereof.

10. The device of claim 1, wherein the at least one acceptor material and the at least one electron conducting material comprise the same material.

11. The device of claim 1, wherein the mixture comprises the at least one cathode-side wide energy gap material and the at least one electron conducting material at a ratio ranging from 10:1 to 1:10 by volume.

12. The device of claim 1, wherein the mixture comprises the at least one cathode-side wide energy gap material and the at least one electron conducting material at a ratio ranging from 2:1 to 1:2 by volume.

13. The device of claim 1, wherein the at least one cathode-side wide energy gap material comprises TPBi.

14. The device of claim 1, wherein the at least one acceptor material comprises a material chosen from subphthalocyanines, subnaphthalocyanines, dipyrrin complexes, BODIPY complexes, perylenes, naphthalenes, fullerenes, functionalized fullerene derivatives, and derivatives thereof.

15. The device of claim 10, wherein the at least one acceptor material comprises a material chosen from fullerenes and functionalized fullerene derivatives.

16. The device of claim 1, further comprising at least one cap layer disposed between the exciton-blocking electron filter and the cathode.

17. The device of claim 16, wherein the at least one cap layer and the at least one cathode-side wide energy gap material comprise the same material.

18. The device of claim 1, wherein the at least one electron conducting material comprises a material chosen from fullerenes and functionalized fullerene derivatives.

19. The device of claim 18, wherein the at least one electron conducting material comprises a material chosen from $C_{60}$ and $C_{70}$.

20. The device of claim 19, wherein the at least one cathode-side wide energy gap material comprises a material chosen from BP4mPy, TPBi, BAlq, Alq3, and 3TPYMB.

21. The device of claim 20, further comprising at least one cap layer disposed between the exciton-blocking electron filter and the cathode, wherein the at least one cap layer comprises a material chosen from BP4mPy, TPBi, BAlq, Alq3, and 3TPYMB.

22. The device of claim 19, wherein the at least one acceptor material comprises a material chosen from $C_{60}$ and $C_{70}$.

23. The device of claim 22, wherein the at least one cathode-side wide energy gap material comprises TPBi.

24. The device of claim 23, further comprising at least one cap layer disposed between the exciton-blocking electron filter and the cathode, wherein the at least one cap layer comprises TPBi.

25. The device of claim 24, wherein the at least one donor material comprises tetraphenyldibenzoperiflanthene (DBP).

26. An organic photosensitive optoelectronic device comprising:
two electrodes in superposed relation comprising an anode and a cathode;
a photoactive region comprising at least one donor material and at least one acceptor material disposed between the two electrodes to form a donor-acceptor heterojunction, wherein the at least one donor material has a Lowest Unoccupied Molecular Orbital energy level ($LUMO_{don}$) and a Highest Occupied Molecular Orbital energy level ($HOMO_{don}$); and
an exciton-blocking hole filter disposed between the anode and the at least one donor material, wherein the hole filter comprises a mixture comprising at least one anode-side wide energy gap material and at least one hole conducting material;
wherein the at least one anode-side wide energy gap material has:
a Highest Occupied Molecular Orbital energy level ($HOMO_{AS\text{-}WG}$) energy level larger than or equal to the $HOMO_{don}$;
a Lowest Unoccupied Molecular Orbital energy level ($LUMO_{AS\text{-}WG}$) smaller than, equal to, or within 0.3 eV larger than the $LUMO_{don}$;
a $HOMO_{AS\text{-}WG}$-$LUMO_{AS\text{-}WG}$ energy gap wider than a $HOMO_{don}$-$LUMO_{don}$ energy gap; and
a glass transition temperature equal to or greater than 85° C.

27. The device of claim 26, wherein the at least one anode-side wide energy gap material comprises a material chosen from 3,3',5,5'-Tetra[(m-pyridyl)-phen-3-yl]biphenyl (BP4mPy), 2,2',2''-(1,3,5-Benzinetriyl)-tris(1-phenyl-1-H-benzimidazole) (TPBi), Bis(2-methyl-8-quinolinolate)-4-(phenylphenolato)aluminium (BAlq), Tris(8-hydroxy-quinolinato)aluminium (Alq3), Tris(2,4,6-trimethyl-3-(pyridin-3-yl)phenyl)borane (3TPYMB), 4,40-(1,3-phenylene)bis(2,6-dip-tolylpyridine-3,5-dicarbonitrile) (m-MPyCN), 4,40-(1,3-phenylene)bis(2,6-di(biphenyl-4-yl)pyridine-3,5-dicarbonitrile) (m-PhPyCN), 4,40-(1,3-phenylene)bis(2,6-diphenylpyridine-3,5-dicarbonitrile) (m-PyCN), 6,60-(1,4-phenylene)bis(2-phenyl-4-p-tolylnicotinonitrile) p-PPtNN), 4,40-(1,4-phenylene)bis(2-phenyl-6-p-tolylnicotinonitrile) (p-PPtNT), and derivatives thereof.

28. The device of claim 26, wherein the wide energy gap material has a glass transition temperature between 85-200° C.

29. The device of claim 26, wherein the $HOMO_{AS\text{-}WG}$ is larger than the $HOMO_{don}$, and the $LUMO_{AS\text{-}WG}$ is smaller than the $LUMO_{don}$.

30. The device of claim 26, wherein the $HOMO_{HC}$ is equal to or smaller than the $HOMO_{don}$.

31. The device of claim 26, wherein the $HOMO_{AS\text{-}WG}$ is larger than the $HOMO_{HC}$.

32. The device of claim 26, wherein the at least one donor material comprises a material chosen from phthalocyanines, subphthalocyanines, naphthalocyanines, merocyanine dyes, boron-dipyrromethene (BODIPY) dyes, thiophenes, low band-gap polymers, polyacenes, diindenoperylene (DIP), squaraine (SQ) dyes, tetraphenyldibenzoperiflanthene (DBP), and derivatives thereof.

33. The device of claim 26, wherein the at least one hole conducting material comprises a material chosen from phthalocyanines, subphthalocyanines, naphthalocyanines, merocyanine dyes, boron-dipyrromethene (BODIPY) dyes, thiophenes, low band-gap polymers, polyacenes, diindenoperylene (DIP), squaraine (SQ) dyes, tetraphenyldibenzoperiflanthene (DBP), and derivatives thereof.

\* \* \* \* \*